(12) United States Patent (10) Patent No.: US 9,146,476 B2
Shiraishi (45) Date of Patent: Sep. 29, 2015

(54) ILLUMINATION OPTICAL APPARATUS AND PROJECTION EXPOSURE APPARATUS

(71) Applicant: NIKON CORPORATION, Tokyo (JP)

(72) Inventor: Naomasa Shiraishi, Saitama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 13/890,603

(22) Filed: May 9, 2013

(65) Prior Publication Data

US 2013/0250268 A1 Sep. 26, 2013

Related U.S. Application Data

(63) Continuation of application No. 11/410,952, filed on Apr. 26, 2006, which is a continuation-in-part of application No. PCT/JP2004/015853, filed on Oct. 26, 2004.

(30) Foreign Application Priority Data

Oct. 28, 2003 (JP) ................................ 2003-367963

(51) Int. Cl.
*G03B 27/72* (2006.01)
*G03F 7/20* (2006.01)
(Continued)

(52) U.S. Cl.
CPC ............ *G03F 7/70191* (2013.01); *G02B 27/28* (2013.01); *G03F 7/70108* (2013.01); *G03F 7/70566* (2013.01); *G03F 7/70966* (2013.01)

(58) Field of Classification Search
CPC . G03F 7/701; G03F 7/70108; G03F 7/70116; G03F 7/70191; G03F 7/70566; G03F 7/70158; G03F 7/70966; G03B 27/42; G03B 27/28
USPC .......... 355/52, 53, 55, 67–71, 77; 250/492.1, 250/492.2, 492.22, 548; 430/5, 8, 22, 30, 430/311, 312; 362/19; 359/489.01, 489.1, 359/489.15, 490.01, 492.01, 494
See application file for complete search history.

(56) References Cited

U.S. PATENT DOCUMENTS 3,146,294 A 8/1964 Koester et al.
3,180,216 A 4/1965 Osterberg
(Continued)

FOREIGN PATENT DOCUMENTS

CN 1453645 A 11/2003
CN 1501175 A 6/2004
(Continued)

OTHER PUBLICATIONS

English translation of KR 2001-0051438, published on Jun. 25, 2001.*

(Continued)

*Primary Examiner* — Christina Riddle
(74) *Attorney, Agent, or Firm* — Oliff PLC

(57) ABSTRACT

An illumination optical apparatus and projection exposure apparatus capable of reducing a light quantity loss when a mask is illuminated with a polarized illumination light. An illumination optical system for illuminating a reticle with an illumination light and a projection optical system for projecting the pattern image of the reticle onto a wafer are provided. An illumination light emitted from an exposure light source in a linearly polarized state in the illumination optical system passes through first and second birefringent members having different fast axis directions and is converted into a polarized state that is substantially linearly polarized in a circumferential direction with the optical axis as the center in an almost specific annular area, and them illuminates the reticle under an annular illuminating condition after passing through a fly-eye lens.

45 Claims, 12 Drawing Sheets

(51) Int. Cl.
*G02B 27/28* (2006.01)
*G03B 27/68* (2006.01)
*G03B 27/42* (2006.01)
*G03B 27/52* (2006.01)
*G03B 27/54* (2006.01)

(56) References Cited

U.S. PATENT DOCUMENTS

| | | |
|---|---|---|
| 3,758,201 A | 9/1973 | MacNeille |
| 3,892,469 A | 7/1975 | Lotspeich |
| 3,892,470 A | 7/1975 | Lotspeich |
| 4,103,260 A | 7/1978 | Buchman |
| 4,175,830 A | 11/1979 | Marié |
| 4,198,123 A | 4/1980 | Kremen |
| 4,211,471 A | 7/1980 | Marie |
| 4,286,843 A | 9/1981 | Reytblatt |
| 4,346,164 A | 8/1982 | Tabarelli et al. |
| 4,744,615 A | 5/1988 | Fan et al. |
| 4,755,027 A | 7/1988 | Schäfer |
| 4,952,815 A * | 8/1990 | Nishi .............................. 250/548 |
| 4,981,342 A | 1/1991 | Fiala |
| 5,072,126 A | 12/1991 | Progler |
| 5,216,541 A | 6/1993 | Takesue et al. |
| 5,251,222 A | 10/1993 | Hester et al. |
| 5,253,110 A | 10/1993 | Ichihara et al. |
| 5,272,501 A | 12/1993 | Nishi et al. |
| 5,312,513 A | 5/1994 | Florence et al. |
| 5,345,292 A | 9/1994 | Shiozawa et al. |
| 5,365,371 A | 11/1994 | Kamon |
| 5,382,999 A | 1/1995 | Kamon |
| 5,436,761 A | 7/1995 | Kamon |
| 5,448,336 A | 9/1995 | Shiraishi |
| 5,459,000 A | 10/1995 | Unno |
| 5,467,166 A | 11/1995 | Shiraishi |
| 5,473,465 A | 12/1995 | Ye |
| 5,541,026 A | 7/1996 | Matsumoto |
| 5,559,583 A * | 9/1996 | Tanabe ........................... 355/71 |
| 5,610,683 A | 3/1997 | Takahashi |
| 5,610,684 A | 3/1997 | Shiraishi |
| 5,621,498 A | 4/1997 | Inoue et al. |
| 5,627,626 A | 5/1997 | Inoue et al. |
| 5,631,721 A | 5/1997 | Stanton et al. |
| 5,663,785 A | 9/1997 | Kirk et al. |
| 5,673,103 A | 9/1997 | Inoue et al. |
| 5,675,401 A | 10/1997 | Wangler et al. |
| 5,677,755 A | 10/1997 | Oshida et al. |
| 5,677,757 A | 10/1997 | Taniguchi et al. |
| 5,684,567 A | 11/1997 | Shiozawa |
| 5,691,803 A | 11/1997 | Song et al. |
| 5,707,501 A | 1/1998 | Inoue et al. |
| 5,739,898 A | 4/1998 | Ozawa et al. |
| 5,838,408 A | 11/1998 | Inoue et al. |
| 5,841,500 A | 11/1998 | Patel |
| 5,933,219 A | 8/1999 | Unno |
| 5,969,441 A | 10/1999 | Loopstra et al. |
| 6,031,658 A | 2/2000 | Riza |
| 6,191,829 B1 | 2/2001 | Hashimoto |
| 6,191,880 B1 * | 2/2001 | Schuster ........................ 359/238 |
| 6,208,407 B1 | 3/2001 | Loopstra |
| 6,211,944 B1 | 4/2001 | Shiraishi |
| 6,229,647 B1 | 5/2001 | Takahashi et al. |
| 6,233,041 B1 | 5/2001 | Shiraishi |
| 6,238,063 B1 | 5/2001 | Tanitsu et al. |
| 6,252,647 B1 | 6/2001 | Shiraishi |
| 6,252,712 B1 | 6/2001 | Fürter et al. |
| 6,259,512 B1 | 7/2001 | Mizouchi |
| 6,304,317 B1 | 10/2001 | Taniguchi et al. |
| 6,333,776 B1 | 12/2001 | Taniguchi |
| 6,341,007 B1 | 1/2002 | Nishi et al. |
| 6,361,909 B1 | 3/2002 | Gau et al. |
| 6,366,404 B1 | 4/2002 | Hiraiwa et al. |
| 6,373,614 B1 | 4/2002 | Miller |
| 6,392,800 B2 | 5/2002 | Schuster |
| 6,400,441 B1 | 6/2002 | Nishi et al. |
| 6,404,482 B1 | 6/2002 | Shiraishi |
| 6,406,148 B1 | 6/2002 | Marshall et al. |
| 6,452,662 B2 | 9/2002 | Mulkens et al. |
| 6,466,303 B1 * | 10/2002 | Omura et al. .................... 355/67 |
| 6,483,573 B1 * | 11/2002 | Schuster ......................... 355/71 |
| 6,498,869 B1 | 12/2002 | Yao |
| 6,522,483 B2 | 2/2003 | Kreuzer |
| 6,535,273 B1 | 3/2003 | Maul |
| 6,538,247 B2 | 3/2003 | Iizuka |
| 6,549,269 B1 | 4/2003 | Nishi et al. |
| 6,577,379 B1 | 6/2003 | Boettiger et al. |
| 6,583,931 B2 | 6/2003 | Hiraiwa et al. |
| 6,590,634 B1 | 7/2003 | Nishi et al. |
| 6,597,430 B1 | 7/2003 | Nishi et al. |
| 6,606,144 B1 | 8/2003 | Omura |
| 6,636,295 B2 | 10/2003 | Shiozawa |
| 6,646,690 B2 | 11/2003 | Takezawa |
| 6,661,499 B2 | 12/2003 | Omura et al. |
| 6,665,119 B1 | 12/2003 | Kurtz et al. |
| 6,674,513 B2 | 1/2004 | Omura |
| 6,674,514 B2 | 1/2004 | Shinoda |
| 6,680,798 B2 | 1/2004 | Kreuzer |
| 6,698,891 B2 | 3/2004 | Kato |
| 6,710,855 B2 | 3/2004 | Shiraishi |
| 6,762,824 B2 | 7/2004 | Mori |
| 6,769,273 B1 | 8/2004 | Nakagawa et al. |
| 6,771,350 B2 | 8/2004 | Nishinaga |
| 6,774,984 B2 | 8/2004 | Gerhard |
| 6,831,731 B2 | 12/2004 | Omura et al. |
| 6,836,365 B2 | 12/2004 | Goto |
| 6,836,380 B2 | 12/2004 | Kreuzer |
| 6,842,223 B2 | 1/2005 | Tyminski |
| 6,844,982 B2 | 1/2005 | Omura |
| 6,856,379 B2 | 2/2005 | Schuster |
| 6,864,961 B2 | 3/2005 | Omura |
| 6,870,668 B2 | 3/2005 | Ozawa |
| 6,876,437 B2 | 4/2005 | Kawahara |
| 6,885,493 B2 | 4/2005 | Ljungblad et al. |
| 6,891,655 B2 | 5/2005 | Grebinski et al. |
| 6,900,915 B2 | 5/2005 | Nanjyo et al. |
| 6,913,373 B2 | 7/2005 | Tanaka et al. |
| 6,958,806 B2 | 10/2005 | Mulder et al. |
| 6,965,484 B2 * | 11/2005 | Shaver .......................... 359/738 |
| 6,970,233 B2 | 11/2005 | Blatchford |
| 6,977,718 B1 | 12/2005 | LaFontaine |
| 6,999,157 B2 | 2/2006 | Kohno |
| 7,009,686 B2 | 3/2006 | Kawashima et al. |
| 7,031,077 B2 | 4/2006 | Kreuzer |
| 7,038,763 B2 | 5/2006 | Mulder et al. |
| 7,061,583 B2 | 6/2006 | Mulkens et al. |
| 7,095,546 B2 | 8/2006 | Mala et al. |
| 7,098,992 B2 | 8/2006 | Ohtsuki et al. |
| 7,130,025 B2 | 10/2006 | Tsuji |
| 7,145,720 B2 | 12/2006 | Krähmer et al. |
| 7,217,503 B2 | 5/2007 | Saitoh et al. |
| 7,239,446 B2 | 7/2007 | Kreuzer |
| 7,245,353 B2 | 7/2007 | Mulkens et al. |
| 7,245,355 B2 | 7/2007 | Mulkens et al. |
| 7,295,286 B2 | 11/2007 | Matsuura |
| 7,345,740 B2 | 3/2008 | Wagner et al. |
| 7,408,616 B2 | 8/2008 | Gruner et al. |
| 7,433,046 B2 | 10/2008 | Everett et al. |
| 7,446,858 B2 | 11/2008 | Kudo et al. |
| 7,508,493 B2 | 3/2009 | Takeuchi et al. |
| 7,847,921 B2 | 12/2010 | Gruner et al. |
| 8,259,393 B2 | 9/2012 | Fiolka et al. |
| 8,270,077 B2 | 9/2012 | Fiolka et al. |
| 8,279,524 B2 | 10/2012 | Fiolka et al. |
| 8,289,623 B2 | 10/2012 | Fiolka et al. |
| 8,320,043 B2 | 11/2012 | Fiolka et al. |
| 2001/0012154 A1 | 8/2001 | Schuster |
| 2001/0019404 A1 | 9/2001 | Schuster et al. |
| 2001/0035942 A1 | 11/2001 | Hara et al. |
| 2001/0046038 A1 | 11/2001 | Mulkens et al. |
| 2001/0052968 A1 | 12/2001 | Shiozawa |
| 2002/0001134 A1 | 1/2002 | Shinoda |
| 2002/0008863 A1 | 1/2002 | Taniguchi et al. |
| 2002/0024008 A1 | 2/2002 | Iizuka |
| 2002/0027719 A1 | 3/2002 | Kreuzer |
| 2002/0080338 A1 | 6/2002 | Taniguchi |

(56) References Cited

U.S. PATENT DOCUMENTS

| | | |
|---|---|---|
| 2002/0085176 A1 | 7/2002 | Hiraiwa et al. |
| 2002/0085276 A1* | 7/2002 | Tanitsu et al. ............... 359/432 |
| 2002/0101572 A1 | 8/2002 | Shiraishi |
| 2002/0126380 A1 | 9/2002 | Schuster |
| 2002/0152452 A1 | 10/2002 | Socha |
| 2002/0167653 A1 | 11/2002 | Mulkens et al. |
| 2002/0176166 A1 | 11/2002 | Schuster |
| 2002/0177048 A1 | 11/2002 | Saitoh et al. |
| 2002/0177054 A1 | 11/2002 | Saitoh et al. |
| 2002/0186462 A1 | 12/2002 | Gerhard |
| 2002/0191288 A1 | 12/2002 | Gruner et al. |
| 2002/0196416 A1 | 12/2002 | Shiraishi |
| 2003/0007158 A1 | 1/2003 | Hill |
| 2003/0011756 A1 | 1/2003 | Omura et al. |
| 2003/0025890 A1 | 2/2003 | Nishinaga |
| 2003/0038225 A1 | 2/2003 | Mulder et al. |
| 2003/0038931 A1 | 2/2003 | Toyoda et al. |
| 2003/0043356 A1 | 3/2003 | Shiraishi |
| 2003/0053036 A1 | 3/2003 | Fujishima et al. |
| 2003/0086071 A1 | 5/2003 | McGuire, Jr. |
| 2003/0098959 A1 | 5/2003 | Hagiwara et al. |
| 2003/0103196 A1 | 6/2003 | Hirukawa |
| 2003/0128349 A1 | 7/2003 | Unno |
| 2003/0133099 A1 | 7/2003 | Shiode |
| 2003/0160949 A1 | 8/2003 | Komatsuda et al. |
| 2003/0174400 A1 | 9/2003 | Patel et al. |
| 2003/0206289 A1 | 11/2003 | Matsuyama |
| 2003/0214571 A1 | 11/2003 | Ishikawa et al. |
| 2003/0227607 A1 | 12/2003 | Kato et al. |
| 2004/0004771 A1 | 1/2004 | Omura |
| 2004/0012764 A1 | 1/2004 | Mulder et al. |
| 2004/0053148 A1 | 3/2004 | Morohoshi |
| 2004/0057034 A1 | 3/2004 | Zinn et al. |
| 2004/0057036 A1* | 3/2004 | Kawashima et al. ............ 355/77 |
| 2004/0100629 A1 | 5/2004 | Stokowski et al. |
| 2004/0104654 A1 | 6/2004 | Lee et al. |
| 2004/0119954 A1 | 6/2004 | Kawashima et al. |
| 2004/0120044 A1 | 6/2004 | Kreuzer |
| 2004/0150806 A1 | 8/2004 | Brunotte et al. |
| 2004/0160582 A1 | 8/2004 | Lof et al. |
| 2004/0169924 A1 | 9/2004 | Flagello et al. |
| 2004/0174512 A1 | 9/2004 | Toyoda et al. |
| 2004/0180278 A1 | 9/2004 | Sato et al. |
| 2004/0184019 A1 | 9/2004 | Totzeck et al. |
| 2004/0207386 A1 | 10/2004 | Durr |
| 2004/0227923 A1 | 11/2004 | Flagello et al. |
| 2004/0240073 A1 | 12/2004 | Gerhard |
| 2005/0024612 A1 | 2/2005 | Hirukawa et al. |
| 2005/0041232 A1 | 2/2005 | Yamada et al. |
| 2005/0094268 A1 | 5/2005 | Fiolka et al. |
| 2005/0095749 A1 | 5/2005 | Krellmann et al. |
| 2005/0122499 A1 | 6/2005 | Omura et al. |
| 2005/0128458 A1 | 6/2005 | Blatchford |
| 2005/0146704 A1 | 7/2005 | Gruner et al. |
| 2005/0168790 A1 | 8/2005 | Latypov et al. |
| 2005/0171138 A1 | 8/2005 | Lee et al. |
| 2005/0237509 A1 | 10/2005 | Blatchford |
| 2005/0237527 A1 | 10/2005 | Mori |
| 2005/0264885 A1 | 12/2005 | Albert |
| 2005/0270608 A1 | 12/2005 | Shiozawa et al. |
| 2006/0012769 A1 | 1/2006 | Suzuki |
| 2006/0050261 A1 | 3/2006 | Brotsack |
| 2006/0055834 A1 | 3/2006 | Tanitsu et al. |
| 2006/0055909 A1 | 3/2006 | Fiolka et al. |
| 2006/0072095 A1 | 4/2006 | Kudo et al. |
| 2006/0077370 A1 | 4/2006 | Mulkens et al. |
| 2006/0092398 A1 | 5/2006 | McCarthy |
| 2006/0132748 A1 | 6/2006 | Fukuhara |
| 2006/0139611 A1 | 6/2006 | Wagner et al. |
| 2006/0146384 A1 | 7/2006 | Schultz et al. |
| 2006/0158624 A1 | 7/2006 | Toyoda |
| 2006/0164711 A1 | 7/2006 | Govil et al. |
| 2006/0170901 A1 | 8/2006 | Tanitsu et al. |
| 2006/0203214 A1 | 9/2006 | Shiraishi |
| 2006/0232841 A1 | 10/2006 | Toishi et al. |
| 2006/0291057 A1 | 12/2006 | Fiolka et al. |
| 2007/0008511 A1 | 1/2007 | De Boeiu et al. |
| 2007/0019179 A1 | 1/2007 | Fiolka et al. |
| 2007/0058151 A1 | 3/2007 | Eurlings et al. |
| 2007/0081114 A1 | 4/2007 | Fiolka et al. |
| 2007/0146676 A1 | 6/2007 | Tanitsu et al. |
| 2007/0183017 A1 | 8/2007 | Hembd |
| 2007/0201338 A1 | 8/2007 | Yaoita et al. |
| 2007/0263199 A1 | 11/2007 | Fiolka et al. |
| 2007/0296936 A1 | 12/2007 | Kato et al. |
| 2007/0296941 A1 | 12/2007 | Omura |
| 2008/0021948 A1 | 1/2008 | Wilson et al. |
| 2008/0024747 A1 | 1/2008 | Kudo et al. |
| 2008/0030706 A1 | 2/2008 | Yamamoto |
| 2008/0030707 A1 | 2/2008 | Tanaka et al. |
| 2008/0068572 A1 | 3/2008 | Kudo et al. |
| 2008/0316459 A1 | 12/2008 | Fiolka et al. |
| 2008/0316598 A1 | 12/2008 | Fiolka et al. |
| 2009/0002675 A1 | 1/2009 | Fiolka et al. |
| 2009/0073411 A1 | 3/2009 | Tanitsu |
| 2009/0073414 A1 | 3/2009 | Tanitsu et al. |
| 2009/0073441 A1 | 3/2009 | Tanitsu et al. |
| 2009/0091730 A1 | 4/2009 | Tanaka |
| 2009/0097007 A1 | 4/2009 | Tanaka |
| 2009/0109417 A1 | 4/2009 | Tanitsu |
| 2009/0116093 A1 | 5/2009 | Tanitsu |
| 2009/0122292 A1 | 5/2009 | Shiraishi |
| 2009/0128886 A1 | 5/2009 | Hirota |
| 2009/0147233 A1 | 6/2009 | Toyoda |
| 2009/0147234 A1 | 6/2009 | Toyoda |
| 2009/0147235 A1 | 6/2009 | Toyoda |
| 2009/0185154 A1 | 7/2009 | Tanitsu |
| 2009/0185156 A1 | 7/2009 | Kudo et al. |
| 2009/0284729 A1 | 11/2009 | Shiraishi |
| 2009/0316132 A1 | 12/2009 | Tanitsu et al. |
| 2009/0323041 A1 | 12/2009 | Toyoda |
| 2010/0141921 A1 | 6/2010 | Omura |
| 2010/0141926 A1 | 6/2010 | Omura |
| 2010/0142051 A1 | 6/2010 | Omura |
| 2011/0037962 A1 | 2/2011 | Tanitsu |
| 2011/0069296 A1 | 3/2011 | Gruner et al. |
| 2011/0188019 A1 | 8/2011 | Fiolka et al. |
| 2011/0205519 A1 | 8/2011 | Kanayamaya et al. |
| 2011/0273692 A1 | 11/2011 | Toyoda |
| 2011/0273693 A1 | 11/2011 | Toyoda |
| 2011/0273697 A1 | 11/2011 | Tanitsu et al. |
| 2011/0273698 A1 | 11/2011 | Toyoda |
| 2011/0299055 A1 | 12/2011 | Toyoda |

FOREIGN PATENT DOCUMENTS

| | | |
|---|---|---|
| CN | 1573571 A | 2/2005 |
| DE | 206 607 | 2/1984 |
| DE | 221 563 A1 | 4/1985 |
| DE | 224 448 A1 | 7/1985 |
| DE | 242 880 A1 | 2/1987 |
| DE | 100 29 938 A1 | 7/2001 |
| DE | 101 23 725 A1 | 11/2002 |
| DE | 103 43 333 A1 | 4/2005 |
| DE | 102006015213 A1 | 10/2007 |
| EP | 0 023 231 A1 | 2/1981 |
| EP | 0 208 552 A2 | 1/1987 |
| EP | 0 230 931 | 8/1987 |
| EP | 0 564 264 A1 | 10/1993 |
| EP | 0 656 555 A1 | 6/1995 |
| EP | 0 764 858 | 8/1996 |
| EP | 0 744 664 A2 | 11/1996 |
| EP | 0 779 530 A1 | 6/1997 |
| EP | 0 937 999 A1 | 8/1999 |
| EP | 1 014 196 A2 | 6/2000 |
| EP | 1 071 292 A2 | 1/2001 |
| EP | 1 139 521 A1 | 10/2001 |
| EP | 1 211 561 A2 | 6/2002 |
| EP | 1 260 849 | 11/2002 |
| EP | 1 280 007 A2 | 1/2003 |
| EP | 1 489 462 A2 | 12/2004 |
| EP | 1 577 709 A2 | 9/2005 |
| EP | 1 662 553 A1 | 5/2006 |
| EP | 1 674 935 A2 | 6/2006 |

(56) References Cited

FOREIGN PATENT DOCUMENTS

| | | |
|---|---|---|
| EP | 1 681 710 A1 | 7/2006 |
| EP | 1 693 885 A1 | 8/2006 |
| EP | 1 798 758 A1 | 6/2007 |
| EP | 1 840 945 A1 | 10/2007 |
| EP | 1 953 805 A1 | 8/2008 |
| FR | 2 474 708 | 7/1981 |
| GB | 856 621 | 12/1960 |
| GB | 856621 | 12/1960 |
| JP | A-44-4993 | 2/1969 |
| JP | A-56-6666 | 1/1981 |
| JP | A-57-117238 | 7/1982 |
| JP | A-57-152129 | 9/1982 |
| JP | A-57-153433 | 9/1982 |
| JP | A-58-49932 | 3/1983 |
| JP | U-58-45502 | 3/1983 |
| JP | A-58-115945 | 7/1983 |
| JP | A-58-202448 | 11/1983 |
| JP | A-59-19912 | 2/1984 |
| JP | A-59-155843 | 9/1984 |
| JP | A-59-226317 | 12/1984 |
| JP | A-61-44429 | 3/1986 |
| JP | A-61-45923 | 3/1986 |
| JP | A 61-91662 | 5/1986 |
| JP | A-61-91662 | 5/1986 |
| JP | U-61-94342 | 6/1986 |
| JP | A-61-156736 | 7/1986 |
| JP | A-61-196532 | 8/1986 |
| JP | A-61-217434 | 9/1986 |
| JP | A-61-251025 | 11/1986 |
| JP | A-61-270049 | 11/1986 |
| JP | A-62-2539 | 1/1987 |
| JP | A-62-2540 | 1/1987 |
| JP | A-62-17705 | 1/1987 |
| JP | A-62-65326 | 3/1987 |
| JP | A-62-100161 | 5/1987 |
| JP | A-62-120026 | 6/1987 |
| JP | A-62-121417 | 6/1987 |
| JP | A-62-122215 | 6/1987 |
| JP | A-62-153710 | 7/1987 |
| JP | A-62-183522 | 8/1987 |
| JP | A-62-188316 | 8/1987 |
| JP | A-62-203526 | 9/1987 |
| JP | A-62-265722 | 11/1987 |
| JP | A-63-12134 | 1/1988 |
| JP | A-63-36526 | 2/1988 |
| JP | A-63-73628 | 4/1988 |
| JP | A-63-128713 | 6/1988 |
| JP | A-63-131008 | 6/1988 |
| JP | A-63-141313 | 6/1988 |
| JP | A-63-157419 | 6/1988 |
| JP | A-63-160192 | 7/1988 |
| JP | A-63-231217 | 9/1988 |
| JP | A-63-275912 | 11/1988 |
| JP | A-63-292005 | 11/1988 |
| JP | A-64-18002 | 1/1989 |
| JP | A-64-26704 | 2/1989 |
| JP | A-64-68926 | 3/1989 |
| JP | A-1-91419 | 4/1989 |
| JP | A-1-115033 | 5/1989 |
| JP | A-1-147516 | 6/1989 |
| JP | A-1-202833 | 8/1989 |
| JP | A-1-214042 | 8/1989 |
| JP | U-1-127379 | 8/1989 |
| JP | A-1-255404 | 10/1989 |
| JP | A-1-258550 | 10/1989 |
| JP | A-1-276043 | 11/1989 |
| JP | A-1-278240 | 11/1989 |
| JP | A-1-286478 | 11/1989 |
| JP | A-1-292343 | 11/1989 |
| JP | A-1-314247 | 12/1989 |
| JP | A-1-319964 | 12/1989 |
| JP | A-2-42382 | 2/1990 |
| JP | A-2-65149 | 3/1990 |
| JP | A-2-65222 | 3/1990 |
| JP | A-2-97239 | 4/1990 |
| JP | A-2-106917 | 4/1990 |
| JP | A-2-116115 | 4/1990 |
| JP | A-2-139146 | 5/1990 |
| JP | A-2-166717 | 6/1990 |
| JP | A-2-261073 | 10/1990 |
| JP | A-2-264901 | 10/1990 |
| JP | A-02-285320 | 11/1990 |
| JP | A-2-285320 | 11/1990 |
| JP | A-2-287308 | 11/1990 |
| JP | A-2-298431 | 12/1990 |
| JP | A-2-311237 | 12/1990 |
| JP | A-3-41399 | 2/1991 |
| JP | A-3-64811 | 3/1991 |
| JP | A-3-72298 | 3/1991 |
| JP | A-3-94445 | 4/1991 |
| JP | A-3-132663 | 6/1991 |
| JP | A-3-134341 | 6/1991 |
| JP | A-3-167419 | 7/1991 |
| JP | A-3-168640 | 7/1991 |
| JP | A-3-211812 | 9/1991 |
| JP | A-3-263810 | 11/1991 |
| JP | A-4-11613 | 1/1992 |
| JP | A-4-32154 | 2/1992 |
| JP | A-4-065603 | 3/1992 |
| JP | A-4-96315 | 3/1992 |
| JP | A 04-101148 | 4/1992 |
| JP | A-4-101148 | 4/1992 |
| JP | A-4-130710 | 5/1992 |
| JP | A-4-132909 | 5/1992 |
| JP | A-4-133414 | 5/1992 |
| JP | A-4-152512 | 5/1992 |
| JP | A-4-179115 | 6/1992 |
| JP | A-4-186244 | 7/1992 |
| JP | U-4-80052 | 7/1992 |
| JP | A-4-211110 | 8/1992 |
| JP | A 04-225357 | 8/1992 |
| JP | A-4-225357 | 8/1992 |
| JP | A-4-235558 | 8/1992 |
| JP | A-4-265805 | 9/1992 |
| JP | A-4-273245 | 9/1992 |
| JP | A-4-273427 | 9/1992 |
| JP | A-4-280619 | 10/1992 |
| JP | A-4-282539 | 10/1992 |
| JP | A-4-296092 | 10/1992 |
| JP | A-4-297030 | 10/1992 |
| JP | A-4-305915 | 10/1992 |
| JP | A-4-305917 | 10/1992 |
| JP | U-4-117212 | 10/1992 |
| JP | A-4-330961 | 11/1992 |
| JP | A-4-343307 | 11/1992 |
| JP | A-4-350925 | 12/1992 |
| JP | A-5-21314 | 1/1993 |
| JP | A-5-45886 | 2/1993 |
| JP | A-5-62877 | 3/1993 |
| JP | A-5-90128 | 4/1993 |
| JP | A-5-109601 | 4/1993 |
| JP | A 05-109601 | 4/1993 |
| JP | A-5-127086 | 5/1993 |
| JP | A-5-129184 | 5/1993 |
| JP | A-5-134230 | 5/1993 |
| JP | A-5-160002 | 6/1993 |
| JP | A-5-175098 | 7/1993 |
| JP | A-5-199680 | 8/1993 |
| JP | A-5-217837 | 8/1993 |
| JP | A-5-217840 | 8/1993 |
| JP | A-5-226225 | 9/1993 |
| JP | A-5-241324 | 9/1993 |
| JP | A-5-243364 | 9/1993 |
| JP | A-5-259069 | 10/1993 |
| JP | A 5-283317 | 10/1993 |
| JP | A-5-283317 | 10/1993 |
| JP | A-5-304072 | 11/1993 |
| JP | A-5-319774 | 12/1993 |
| JP | A-5-323583 | 12/1993 |
| JP | A-5-326370 | 12/1993 |
| JP | 06053120 A * | 2/1994 |
| JP | A-6-29204 | 2/1994 |
| JP | A-6-42918 | 2/1994 |
| JP | A-6-53120 | 2/1994 |

(56) References Cited

FOREIGN PATENT DOCUMENTS

| | | |
|---|---|---|
| JP | A 6-53120 | 2/1994 |
| JP | A-6-97269 | 4/1994 |
| JP | A-6-104167 | 4/1994 |
| JP | A-6-118623 | 4/1994 |
| JP | A-6-120110 | 4/1994 |
| JP | B2-6-29102 | 4/1994 |
| JP | A-6-36054 | 5/1994 |
| JP | A-6-124126 | 5/1994 |
| JP | A-6-124872 | 5/1994 |
| JP | A-06-124873 | 5/1994 |
| JP | A-6-124873 | 5/1994 |
| JP | A-6-140306 | 5/1994 |
| JP | A-6-148399 | 5/1994 |
| JP | A-6-163350 | 6/1994 |
| JP | A-6-168866 | 6/1994 |
| JP | A-6-177007 | 6/1994 |
| JP | A-6-181157 | 6/1994 |
| JP | A-6-186025 | 7/1994 |
| JP | A-6-188169 | 7/1994 |
| JP | A 6-188169 | 7/1994 |
| JP | A-6-196388 | 7/1994 |
| JP | A-6-204113 | 7/1994 |
| JP | A 6-204121 | 7/1994 |
| JP | A-6-204121 | 7/1994 |
| JP | A-6-229741 | 8/1994 |
| JP | A-6-241720 | 9/1994 |
| JP | A 06-244082 | 9/1994 |
| JP | A-6-244082 | 9/1994 |
| JP | A-6-267825 | 9/1994 |
| JP | A-06-281869 | 10/1994 |
| JP | A-6-283403 | 10/1994 |
| JP | A-06-291023 | 10/1994 |
| JP | A-6-310399 | 11/1994 |
| JP | A-6-325894 | 11/1994 |
| JP | A-6-326174 | 11/1994 |
| JP | A-6-349701 | 12/1994 |
| JP | A-07-057993 | 3/1995 |
| JP | A-7-69621 | 3/1995 |
| JP | H-7-057992 | 3/1995 |
| JP | A-7-92424 | 4/1995 |
| JP | A-7-122469 | 5/1995 |
| JP | A-7-132262 | 5/1995 |
| JP | A-7-134955 | 5/1995 |
| JP | A-7-135158 | 5/1995 |
| JP | A-7-135165 | 5/1995 |
| JP | A-H7-122469 | 5/1995 |
| JP | A-7-147223 | 6/1995 |
| JP | A-07-161622 | 6/1995 |
| JP | A-7-167998 | 7/1995 |
| JP | A-7-168286 | 7/1995 |
| JP | A-7-174974 | 7/1995 |
| JP | A-7-176468 | 7/1995 |
| JP | A 7-183201 | 7/1995 |
| JP | A-7-183201 | 7/1995 |
| JP | A-7-183214 | 7/1995 |
| JP | A-7-190741 | 7/1995 |
| JP | A 07-201723 | 8/1995 |
| JP | A-7-201723 | 8/1995 |
| JP | A-7-220989 | 8/1995 |
| JP | A-7-220990 | 8/1995 |
| JP | A-7-220995 | 8/1995 |
| JP | A-7-221010 | 8/1995 |
| JP | A-07-230945 | 8/1995 |
| JP | A-7-239212 | 9/1995 |
| JP | A-7-243814 | 9/1995 |
| JP | A-7-245258 | 9/1995 |
| JP | A-07-263315 | 10/1995 |
| JP | A-7-263315 | 10/1995 |
| JP | A-7-283119 | 10/1995 |
| JP | A-07-283119 | 10/1995 |
| JP | A-7-297272 | 11/1995 |
| JP | A-7-307268 | 11/1995 |
| JP | A-7-318847 | 12/1995 |
| JP | A-7-335748 | 12/1995 |
| JP | A-8-10971 | 1/1996 |
| JP | A-8-17709 | 1/1996 |
| JP | A-8-22948 | 1/1996 |
| JP | A-8-37149 | 2/1996 |
| JP | A-8-37227 | 2/1996 |
| JP | A-8-46751 | 2/1996 |
| JP | A-8-63231 | 3/1996 |
| JP | A-8-115868 | 5/1996 |
| JP | A-8-136475 | 5/1996 |
| JP | A-8-151220 | 6/1996 |
| JP | A-8-162397 | 6/1996 |
| JP | A-8-166475 | 6/1996 |
| JP | A-8-171054 | 7/1996 |
| JP | A-8-195375 | 7/1996 |
| JP | A-8-203803 | 8/1996 |
| JP | A-8-279549 | 10/1996 |
| JP | A-8-288213 | 11/1996 |
| JP | A-8-297699 | 11/1996 |
| JP | A-8-316125 | 11/1996 |
| JP | A-8-316133 | 11/1996 |
| JP | A-8-330224 | 12/1996 |
| JP | A-8-334695 | 12/1996 |
| JP | A-8-335552 | 12/1996 |
| JP | A-9-7933 | 1/1997 |
| JP | A-9-15834 | 1/1997 |
| JP | A-9-22121 | 1/1997 |
| JP | A-9-61686 | 3/1997 |
| JP | A-9-82626 | 3/1997 |
| JP | A-9-83877 | 3/1997 |
| JP | A-9-92593 | 4/1997 |
| JP | A-9-108551 | 4/1997 |
| JP | A-9-115794 | 5/1997 |
| JP | A-9-134870 | 5/1997 |
| JP | A-9-148406 | 6/1997 |
| JP | A-9-151658 | 6/1997 |
| JP | A-9-160004 | 6/1997 |
| JP | A-9-160219 | 6/1997 |
| JP | A-9-162106 | 6/1997 |
| JP | A-9-178415 | 7/1997 |
| JP | A-9-184787 | 7/1997 |
| JP | A-9-184918 | 7/1997 |
| JP | A 9-184918 | 7/1997 |
| JP | A-9-186082 | 7/1997 |
| JP | A-9-190969 | 7/1997 |
| JP | A-9-213129 | 8/1997 |
| JP | A-9-219358 | 8/1997 |
| JP | A-9-227294 | 9/1997 |
| JP | A-9-232213 | 9/1997 |
| JP | A-9-243892 | 9/1997 |
| JP | A-9-246672 | 9/1997 |
| JP | A-9-251208 | 9/1997 |
| JP | A-9-281077 | 10/1997 |
| JP | A-9-325255 | 12/1997 |
| JP | A-9-326338 | 12/1997 |
| JP | A-10-002865 | 1/1998 |
| JP | A-10-3039 | 1/1998 |
| JP | A-10-20195 | 1/1998 |
| JP | A-10-32160 | 2/1998 |
| JP | A-10-38517 | 2/1998 |
| JP | A-10-38812 | 2/1998 |
| JP | A-10-55713 | 2/1998 |
| JP | A-10-62305 | 3/1998 |
| JP | A-10-64790 | 3/1998 |
| JP | A-10-79337 | 3/1998 |
| JP | A-10-82611 | 3/1998 |
| JP | A-10-503300 | 3/1998 |
| JP | A-10-92735 | 4/1998 |
| JP | A-10-97969 | 4/1998 |
| JP | A 10-104427 | 4/1998 |
| JP | A-10-104427 | 4/1998 |
| JP | A-10-116760 | 5/1998 |
| JP | A-10-116778 | 5/1998 |
| JP | A-10-135099 | 5/1998 |
| JP | A-H10-116779 | 5/1998 |
| JP | A-H10-125572 | 5/1998 |
| JP | A-H10-134028 | 5/1998 |
| JP | A-10-163099 | 6/1998 |
| JP | A-10-163302 | 6/1998 |
| JP | A-10-169249 | 6/1998 |
| JP | A-10-189427 | 7/1998 |

(56) References Cited

FOREIGN PATENT DOCUMENTS

| | | |
|---|---|---|
| JP | A-10-189700 | 7/1998 |
| JP | A-10-206714 | 8/1998 |
| JP | A-10-208993 | 8/1998 |
| JP | A-10-209018 | 8/1998 |
| JP | A-10-214783 | 8/1998 |
| JP | A-10-228661 | 8/1998 |
| JP | A-10-255319 | 9/1998 |
| JP | A-10-294268 | 11/1998 |
| JP | A-10-303114 | 11/1998 |
| JP | A-10-340846 | 12/1998 |
| JP | A-11-3849 | 1/1999 |
| JP | A-11-3856 | 1/1999 |
| JP | A-11-8194 | 1/1999 |
| JP | A-11-14876 | 1/1999 |
| JP | A-11-16816 | 1/1999 |
| JP | A-11-40657 | 2/1999 |
| JP | A-11-54426 | 2/1999 |
| JP | A-11-74185 | 3/1999 |
| JP | A-11-87237 | 3/1999 |
| JP | A-11-111601 | 4/1999 |
| JP | A-11-111818 | 4/1999 |
| JP | A-11-111819 | 4/1999 |
| JP | A-11-121328 | 4/1999 |
| JP | A-11-135400 | 5/1999 |
| JP | A-11-142556 | 5/1999 |
| JP | A-11-150062 | 6/1999 |
| JP | A-11-159571 | 6/1999 |
| JP | A-11-162831 | 6/1999 |
| JP | A-11-163103 | 6/1999 |
| JP | A-11-164543 | 6/1999 |
| JP | A-11-166990 | 6/1999 |
| JP | A-11-98 | 7/1999 |
| JP | A-11-176727 | 7/1999 |
| JP | A-11-176744 | 7/1999 |
| JP | A-11-195602 | 7/1999 |
| JP | A-11-204390 | 7/1999 |
| JP | A-11-204432 | 7/1999 |
| JP | A-11-218466 | 8/1999 |
| JP | A-11-219882 | 8/1999 |
| JP | A-11-233434 | 8/1999 |
| JP | A-11-238680 | 8/1999 |
| JP | A-11-239758 | 9/1999 |
| JP | A-11-260686 | 9/1999 |
| JP | A-11-260791 | 9/1999 |
| JP | A-11-264756 | 9/1999 |
| JP | A-11-283903 | 10/1999 |
| JP | A-11-288879 | 10/1999 |
| JP | A-11-307610 | 11/1999 |
| JP | A-11-312631 | 11/1999 |
| JP | A-11-354624 | 12/1999 |
| JP | A-2000-3874 | 1/2000 |
| JP | A-2000-12453 | 1/2000 |
| JP | A-2000-21742 | 1/2000 |
| JP | A-2000-21748 | 1/2000 |
| JP | A-2000-29202 | 1/2000 |
| JP | A-2000-32403 | 1/2000 |
| JP | A-2000-36449 | 2/2000 |
| JP | A-2000-58436 | 2/2000 |
| JP | A-2000-58441 | 2/2000 |
| JP | A-2000-81320 | 3/2000 |
| JP | A-2000-92815 | 3/2000 |
| JP | 2000114157 A * | 4/2000 |
| JP | A-2000-97616 | 4/2000 |
| JP | A-2000-106340 | 4/2000 |
| JP | A-2000-114157 | 4/2000 |
| JP | A 2000-114157 | 4/2000 |
| JP | A-2000-121491 | 4/2000 |
| JP | A-2000-147346 | 5/2000 |
| JP | A-2000-154251 | 6/2000 |
| JP | A-2000-180371 | 6/2000 |
| JP | A-2000-206279 | 7/2000 |
| JP | A-2000-208407 | 7/2000 |
| JP | A-2000-240717 | 9/2000 |
| JP | A-2000-243684 | 9/2000 |
| JP | A-2000-252201 | 9/2000 |
| JP | A-2000-283889 | 10/2000 |
| JP | A-2000-286176 | 10/2000 |
| JP | A-2000-311853 | 11/2000 |
| JP | A-2000-323403 | 11/2000 |
| JP | A-2001-7015 | 1/2001 |
| JP | A-2001-20951 | 1/2001 |
| JP | A-2001-23996 | 1/2001 |
| JP | A-2001-37201 | 2/2001 |
| JP | A-2001-44097 | 2/2001 |
| JP | A-2001-74240 | 3/2001 |
| JP | A-2001-83472 | 3/2001 |
| JP | A-2001-85307 | 3/2001 |
| JP | A-2001-97734 | 4/2001 |
| JP | A-2001-100311 | 4/2001 |
| JP | A-2001-110707 | 4/2001 |
| JP | A-2001-118773 | 4/2001 |
| JP | A-2001-135560 | 5/2001 |
| JP | A-2001-144004 | 5/2001 |
| JP | A-2001-167996 | 6/2001 |
| JP | A-2001-176766 | 6/2001 |
| JP | A-2001-203140 | 7/2001 |
| JP | A-2001-218497 | 8/2001 |
| JP | A-2001-228401 | 8/2001 |
| JP | A-2001-228404 | 8/2001 |
| JP | A-2001-230323 | 8/2001 |
| JP | A-2001-242269 | 9/2001 |
| JP | A-2001-265581 | 9/2001 |
| JP | A-2001-267227 | 9/2001 |
| JP | A-2001-272764 | 10/2001 |
| JP | A-2001-274083 | 10/2001 |
| JP | A 2001-274083 | 10/2001 |
| JP | A-2001-282526 | 10/2001 |
| JP | A-2001-296105 | 10/2001 |
| JP | A-2001-297976 | 10/2001 |
| JP | A-2001-304332 | 10/2001 |
| JP | A-2001-307982 | 11/2001 |
| JP | A-2001-307983 | 11/2001 |
| JP | A-2001-313250 | 11/2001 |
| JP | B2-3246615 | 11/2001 |
| JP | A-2001-338868 | 12/2001 |
| JP | A-2001-345262 | 12/2001 |
| JP | A-2002-14005 | 1/2002 |
| JP | A-2002-15978 | 1/2002 |
| JP | A-2002-16124 | 1/2002 |
| JP | B2-3246615 | 1/2002 |
| JP | A-2002-43213 | 2/2002 |
| JP | A-2002-57097 | 2/2002 |
| JP | A-2002-66428 | 3/2002 |
| JP | A-2002-71513 | 3/2002 |
| JP | A-2002-75816 | 3/2002 |
| JP | A 2002-075816 | 3/2002 |
| JP | A-2002-75835 | 3/2002 |
| JP | A-2002-91922 | 3/2002 |
| JP | A-2002-93686 | 3/2002 |
| JP | A-2002-93690 | 3/2002 |
| JP | A-2002-100561 | 4/2002 |
| JP | A-2002-118058 | 4/2002 |
| JP | A-2002-141270 | 5/2002 |
| JP | A-2002-158157 | 5/2002 |
| JP | A-2002-162655 | 6/2002 |
| JP | A-2002-170495 | 6/2002 |
| JP | A-2002-190438 | 7/2002 |
| JP | A-2002-195912 | 7/2002 |
| JP | A-2002-198284 | 7/2002 |
| JP | A-2002-202221 | 7/2002 |
| JP | A-2002-203763 | 7/2002 |
| JP | A-2002-208562 | 7/2002 |
| JP | A-2002-520810 | 7/2002 |
| JP | A-2002-222754 | 8/2002 |
| JP | A-2002-227924 | 8/2002 |
| JP | A-2002-231619 | 8/2002 |
| JP | A-2002-258487 | 9/2002 |
| JP | A-2002-261004 | 9/2002 |
| JP | A-2002-263553 | 9/2002 |
| JP | A-2002-277742 | 9/2002 |
| JP | A-2002-289505 | 10/2002 |
| JP | A-2002-305140 | 10/2002 |
| JP | A-2002-323658 | 11/2002 |
| JP | A-2002-324743 | 11/2002 |

(56) References Cited

FOREIGN PATENT DOCUMENTS

| | | |
|---|---|---|
| JP | A-2002-329651 | 11/2002 |
| JP | A-2002-334836 | 11/2002 |
| JP | A-2002-353105 | 12/2002 |
| JP | A-2002-357715 | 12/2002 |
| JP | A-2002-359174 | 12/2002 |
| JP | A-2002-362737 | 12/2002 |
| JP | A-2002-365783 | 12/2002 |
| JP | A-2002-367523 | 12/2002 |
| JP | A-2002-367886 | 12/2002 |
| JP | A-2002-373849 | 12/2002 |
| JP | A-2003-15040 | 1/2003 |
| JP | A-2003-015314 | 1/2003 |
| JP | A-2003-17003 | 1/2003 |
| JP | A-2003-17404 | 1/2003 |
| JP | A-2003-28673 | 1/2003 |
| JP | A 2003-35822 | 2/2003 |
| JP | A-2003-35822 | 2/2003 |
| JP | A-2003-43223 | 2/2003 |
| JP | A-2003-45219 | 2/2003 |
| JP | A-2003-45712 | 2/2003 |
| JP | A-2003-59799 | 2/2003 |
| JP | A-2003-59803 | 2/2003 |
| JP | A-2003-59821 | 2/2003 |
| JP | A 2003-059821 | 2/2003 |
| JP | A-2003-59826 | 2/2003 |
| JP | 2003-068607 A | 3/2003 |
| JP | A-2003-68600 | 3/2003 |
| JP | A 2003-068600 | 3/2003 |
| JP | A-2003-068604 | 3/2003 |
| JP | A-2003-75703 | 3/2003 |
| JP | A-2003-81654 | 3/2003 |
| JP | A-2003-84445 | 3/2003 |
| JP | A-2003-090978 | 3/2003 |
| JP | A-2003-98651 | 4/2003 |
| JP | A-2003-100597 | 4/2003 |
| JP | A-2003-114387 | 4/2003 |
| JP | A-2003-124095 | 4/2003 |
| JP | A-2003-130132 | 5/2003 |
| JP | A-2003-149363 | 5/2003 |
| JP | A-2003-151880 | 5/2003 |
| JP | A-2003-161882 | 6/2003 |
| JP | A-2003-163158 | 6/2003 |
| JP | A-2003-166856 | 6/2003 |
| JP | A2003-173957 | 6/2003 |
| JP | A-2003-188087 | 7/2003 |
| JP | A-2003-224961 | 8/2003 |
| JP | A-2003-229347 | 8/2003 |
| JP | A-2003-233001 | 8/2003 |
| JP | A-2003-234285 | 8/2003 |
| JP | A-2003-238577 | 8/2003 |
| JP | A-2003-240906 | 8/2003 |
| JP | A-2003-249443 | 9/2003 |
| JP | A-2003-258071 | 9/2003 |
| JP | A-2003-262501 | 9/2003 |
| JP | A-2003-263119 | 9/2003 |
| JP | A-2003-272837 | 9/2003 |
| JP | A-2003-273338 | 9/2003 |
| JP | A-2003-282423 | 10/2003 |
| JP | A 2003-297727 | 10/2003 |
| JP | A-2003-297727 | 10/2003 |
| JP | A-2003-532281 | 10/2003 |
| JP | A 2003-532281 | 10/2003 |
| JP | A-2003-532282 | 10/2003 |
| JP | A-2003-311923 | 11/2003 |
| JP | A-2004-7417 | 1/2004 |
| JP | A-2004-14642 | 1/2004 |
| JP | A-2004-14876 | 1/2004 |
| JP | A-2004-15187 | 1/2004 |
| JP | A-2004-22708 | 1/2004 |
| JP | A-2004-38247 | 2/2004 |
| JP | A-2004-39952 | 2/2004 |
| JP | A-2004-40039 | 2/2004 |
| JP | A-2004-45063 | 2/2004 |
| JP | A-2004-051717 | 2/2004 |
| JP | A-2004-63847 | 2/2004 |
| JP | A-2004-71851 | 3/2004 |
| JP | A-2004-078136 | 3/2004 |
| JP | A-2004-85612 | 3/2004 |
| JP | A 2004-087987 | 3/2004 |
| JP | A-2004-87987 | 3/2004 |
| JP | A-2004-95653 | 3/2004 |
| JP | U-3102327 | 3/2004 |
| JP | A-2004-98012 | 4/2004 |
| JP | A-2004-101362 | 4/2004 |
| JP | A-2004-103674 | 4/2004 |
| JP | A-2004-104654 | 4/2004 |
| JP | A-2004-111569 | 4/2004 |
| JP | A-2004-119497 | 4/2004 |
| JP | A-2004-119717 | 4/2004 |
| JP | A-2004-128307 | 4/2004 |
| JP | A-2004-134682 | 4/2004 |
| JP | A-2004-140145 | 5/2004 |
| JP | A-2004-145269 | 5/2004 |
| JP | A-2004-146702 | 5/2004 |
| JP | A-2004-152705 | 5/2004 |
| JP | A-2004-153064 | 5/2004 |
| JP | A-2004-153096 | 5/2004 |
| JP | A-2004-163555 | 6/2004 |
| JP | A-2004-165249 | 6/2004 |
| JP | A-2004-165416 | 6/2004 |
| JP | A-2004-172471 | 6/2004 |
| JP | A-2004-177468 | 6/2004 |
| JP | A-2004-179172 | 6/2004 |
| JP | A-2004-187401 | 7/2004 |
| JP | A-2004-193252 | 7/2004 |
| JP | A-2004-193425 | 7/2004 |
| JP | A-2004-198748 | 7/2004 |
| JP | A-2004-205698 | 7/2004 |
| JP | A-2004-207696 | 7/2004 |
| JP | A-2004-207711 | 7/2004 |
| JP | A-2004-260115 | 7/2004 |
| JP | A-2004-520618 | 7/2004 |
| JP | A-2004-221253 | 8/2004 |
| JP | A-2004-224421 | 8/2004 |
| JP | A-2004-228497 | 8/2004 |
| JP | A-2004-241666 | 8/2004 |
| JP | A-2004-247527 | 9/2004 |
| JP | A-2004-258670 | 9/2004 |
| JP | A-2004-259828 | 9/2004 |
| JP | A-2004-259966 | 9/2004 |
| JP | A-2004-259985 | 9/2004 |
| JP | A-2004-260043 | 9/2004 |
| JP | A-2004-260081 | 9/2004 |
| JP | A-2004-294202 | 10/2004 |
| JP | A-2004-301825 | 10/2004 |
| JP | A-2004-302043 | 10/2004 |
| JP | A-2004-303808 | 10/2004 |
| JP | A-2004-304135 | 10/2004 |
| JP | A-2004-307264 | 11/2004 |
| JP | A-2004-307265 | 11/2004 |
| JP | A-2004-307266 | 11/2004 |
| JP | A-2004-307267 | 11/2004 |
| JP | A-2004-319724 | 11/2004 |
| JP | A-2004-320017 | 11/2004 |
| JP | A-2004-327660 | 11/2004 |
| JP | A-2004-335808 | 11/2004 |
| JP | A-2004-335864 | 11/2004 |
| JP | A-2004-336922 | 11/2004 |
| JP | A-2004-342987 | 12/2004 |
| JP | A-2004-349645 | 12/2004 |
| JP | A-2004-356410 | 12/2004 |
| JP | A-2005-5295 | 1/2005 |
| JP | A-2005-5395 | 1/2005 |
| JP | A-2005-5521 | 1/2005 |
| JP | A-2005-11990 | 1/2005 |
| JP | A-2005-012190 | 1/2005 |
| JP | A-2005-12228 | 1/2005 |
| JP | A-2005-19628 | 1/2005 |
| JP | A-2005-19864 | 1/2005 |
| JP | A-2005-26634 | 1/2005 |
| JP | A-2005-51147 | 2/2005 |
| JP | A-2005-55811 | 3/2005 |
| JP | A-2005-64210 | 3/2005 |
| JP | A-2005-64391 | 3/2005 |

(56) References Cited

FOREIGN PATENT DOCUMENTS

| | | |
|---|---|---|
| JP | A-2005-79222 | 3/2005 |
| JP | A-2005-79584 | 3/2005 |
| JP | A-2005-79587 | 3/2005 |
| JP | A-2005-86148 | 3/2005 |
| JP | A-2005-91023 | 4/2005 |
| JP | A-2005-93324 | 4/2005 |
| JP | A-2005-093522 | 4/2005 |
| JP | A-2005-93948 | 4/2005 |
| JP | A-2005-97057 | 4/2005 |
| JP | A-2005-108925 | 4/2005 |
| JP | A-2005-108934 | 4/2005 |
| JP | A-2005-114882 | 4/2005 |
| JP | A-2005-116570 | 4/2005 |
| JP | A-2005-116571 | 4/2005 |
| JP | A-2005-116831 | 4/2005 |
| JP | A-2005-123586 | 5/2005 |
| JP | A-2005-127460 | 5/2005 |
| JP | A-2005-136404 | 5/2005 |
| JP | A-2005-140999 | 6/2005 |
| JP | A-2005-150759 | 6/2005 |
| JP | A-2005-156592 | 6/2005 |
| JP | A-2005-166871 | 6/2005 |
| JP | A-2005-167254 | 6/2005 |
| JP | A-2005-175176 | 6/2005 |
| JP | A-2005-175177 | 6/2005 |
| JP | A-2005-191344 | 7/2005 |
| JP | A-2005-203483 | 7/2005 |
| JP | A-2005-209705 | 8/2005 |
| JP | A-2005-209706 | 8/2005 |
| JP | A-2005-524112 | 8/2005 |
| JP | A-2005-233979 | 9/2005 |
| JP | A-2005-234359 | 9/2005 |
| JP | A-2005-236088 | 9/2005 |
| JP | A-2005-243770 | 9/2005 |
| JP | A-2005-243904 | 9/2005 |
| JP | A-2005-251549 | 9/2005 |
| JP | A-2005-257740 | 9/2005 |
| JP | A-2005-259789 | 9/2005 |
| JP | A-2005-259830 | 9/2005 |
| JP | A-2005-268700 | 9/2005 |
| JP | A-2005-268741 | 9/2005 |
| JP | A-2005-268742 | 9/2005 |
| JP | A-2005-276932 | 10/2005 |
| JP | A-2005-302826 | 10/2005 |
| JP | A-2005-303167 | 10/2005 |
| JP | A-2005-311020 | 11/2005 |
| JP | A-2005-315918 | 11/2005 |
| JP | A-2005-340605 | 12/2005 |
| JP | A-2005-366813 | 12/2005 |
| JP | A-2006-1821 | 1/2006 |
| JP | A-2006-5197 | 1/2006 |
| JP | A-2006-17895 | 1/2006 |
| JP | A-2006-19702 | 1/2006 |
| JP | A 2006-019702 | 1/2006 |
| JP | A-2006-24706 | 1/2006 |
| JP | A-2006-24819 | 1/2006 |
| JP | A-2006-32750 | 2/2006 |
| JP | A-2006-41302 | 2/2006 |
| JP | A-2006-54364 | 2/2006 |
| JP | A-2006-73584 | 3/2006 |
| JP | A-2006-73951 | 3/2006 |
| JP | A-2006-80281 | 3/2006 |
| JP | A-2006-86141 | 3/2006 |
| JP | A-2006-86442 | 3/2006 |
| JP | A-2006-100363 | 4/2006 |
| JP | A-2006-100686 | 4/2006 |
| JP | A-2006-113437 | 4/2006 |
| JP | A-2006-513442 | 4/2006 |
| JP | A-2006-120985 | 5/2006 |
| JP | A-2006-128192 | 5/2006 |
| JP | A-2006-135165 | 5/2006 |
| JP | A-2006-140366 | 6/2006 |
| JP | A-2006-170811 | 6/2006 |
| JP | A-2006-170899 | 6/2006 |
| JP | A-2006-177865 | 7/2006 |
| JP | A-2006-184414 | 7/2006 |
| JP | A-2006-194665 | 7/2006 |
| JP | A-2006-250587 | 9/2006 |
| JP | A-2006-253572 | 9/2006 |
| JP | A-2006-269762 | 10/2006 |
| JP | A-2006-278820 | 10/2006 |
| JP | A-2006-289684 | 10/2006 |
| JP | A-2006-524349 | 10/2006 |
| JP | A-2006-332355 | 12/2006 |
| JP | A-2006-349946 | 12/2006 |
| JP | A-2006-351586 | 12/2006 |
| JP | A-2007-5830 | 1/2007 |
| JP | A-2007-43980 | 2/2007 |
| JP | A-2007-48819 | 2/2007 |
| JP | A-2007-51300 | 3/2007 |
| JP | A-2007-87306 | 4/2007 |
| JP | A-2007-93546 | 4/2007 |
| JP | A-2007-103153 | 4/2007 |
| JP | A-2007-113939 | 5/2007 |
| JP | A-2007-119851 | 5/2007 |
| JP | A-2007-120333 | 5/2007 |
| JP | A-2007-120334 | 5/2007 |
| JP | A-2007-142313 | 6/2007 |
| JP | A-2007-144864 | 6/2007 |
| JP | A-2007-515768 | 6/2007 |
| JP | A-2007-170938 | 7/2007 |
| JP | A-2007-187649 | 7/2007 |
| JP | A-2007-207821 | 8/2007 |
| JP | 2007-527549 | 9/2007 |
| JP | A-2007-227637 | 9/2007 |
| JP | A-2007-235041 | 9/2007 |
| JP | A-2007-274881 | 10/2007 |
| JP | A-2007-280623 | 10/2007 |
| JP | A-2007-295702 | 11/2007 |
| JP | A-2008-3740 | 1/2008 |
| JP | A-2008-58580 | 3/2008 |
| JP | A-2008-64924 | 3/2008 |
| JP | A-2008-103737 | 5/2008 |
| JP | A-2008-180492 | 8/2008 |
| JP | A-2009-17540 | 1/2009 |
| JP | A-2009-60339 | 3/2009 |
| JP | A-2010-514716 | 5/2010 |
| JP | A-2010-226117 | 10/2010 |
| JP | B-4582096 | 11/2010 |
| JP | 4747844 | 5/2011 |
| JP | A-2011-233911 | 11/2011 |
| JP | B2-4976015 | 7/2012 |
| JP | B2-4976094 | 7/2012 |
| KR | 1995-0009365 | 4/1995 |
| KR | 10-2011-0036050 | 4/1997 |
| KR | 1997-0016641 A | 4/1997 |
| KR | 2000-0048227 | 7/2000 |
| KR | A-2001-53240 | 6/2001 |
| KR | 10-2002-0042462 | 6/2002 |
| KR | 10-2003-0036105 | 5/2003 |
| KR | 10-0474578 | 6/2005 |
| KR | 10-2006-0132598 | 12/2006 |
| KR | 10-2010-0061551 | 6/2010 |
| TW | 516097 | 1/2003 |
| TW | 518662 | 1/2003 |
| TW | 200301848 A | 7/2003 |
| TW | 094100817 | 8/2005 |
| WO | WO 97/11411 | 3/1997 |
| WO | WO 98/15952 A1 | 4/1998 |
| WO | WO98/15952 A1 | 4/1998 |
| WO | WO 98/24115 A1 | 6/1998 |
| WO | WO 98/59364 A1 | 12/1998 |
| WO | WO 99/23692 A1 | 5/1999 |
| WO | WO 99/27568 A1 | 6/1999 |
| WO | WO 99/31716 A1 | 6/1999 |
| WO | WO 99/34255 A1 | 7/1999 |
| WO | WO 99/49366 A1 | 9/1999 |
| WO | WO 99/49504 A1 | 9/1999 |
| WO | WO 9949504 A1 * | 9/1999 |
| WO | WO 99/50712 A1 | 10/1999 |
| WO | WO 99/66370 A1 | 12/1999 |
| WO | WO 00/02092 | 1/2000 |
| WO | WO 00/11706 | 3/2000 |
| WO | WO 00/67303 | 11/2000 |

(56) References Cited

FOREIGN PATENT DOCUMENTS

| | | |
|---|---|---|
| WO | WO 01/03170 A1 | 1/2001 |
| WO | WO 01/10137 A1 | 2/2001 |
| WO | WO 01/20733 A1 | 3/2001 |
| WO | WO 01/22480 A1 | 3/2001 |
| WO | WO 01/23935 A1 | 4/2001 |
| WO | WO 01/27978 A1 | 4/2001 |
| WO | WO 01/35451 A1 | 5/2001 |
| WO | WO 01/59502 A1 | 8/2001 |
| WO | WO 01/65296 A1 | 9/2001 |
| WO | WO 01/81977 A2 | 11/2001 |
| WO | WO 02/16993 A1 | 2/2002 |
| WO | WO 02/063664 A1 | 8/2002 |
| WO | WO 02/069049 A2 | 9/2002 |
| WO | WO 02/080185 A1 | 10/2002 |
| WO | WO 02/084720 A2 | 10/2002 |
| WO | WO 02/084850 A1 | 10/2002 |
| WO | WO 02/093209 A2 | 11/2002 |
| WO | WO 02/101804 A1 | 12/2002 |
| WO | WO 03/003429 A1 | 1/2003 |
| WO | WO 03/023832 A1 | 3/2003 |
| WO | WO 03/063212 A1 | 7/2003 |
| WO | WO 03/077036 A1 | 9/2003 |
| WO | WO 03/085708 A1 | 10/2003 |
| WO | WO 2004/051717 | 6/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/071070 A2 | 8/2004 |
| WO | WO 2004/086468 A1 | 10/2004 |
| WO | WO 2004/086470 A1 | 10/2004 |
| WO | WO 2004/090956 A1 | 10/2004 |
| WO | WO 2004/091079 A1 | 10/2004 |
| WO | WO 2004/094940 A1 | 11/2004 |
| WO | WO 2004/104654 A1 | 12/2004 |
| WO | WO 2004/105106 A1 | 12/2004 |
| WO | WO 2004/105107 A1 | 12/2004 |
| WO | WO 2004/107048 A2 | 12/2004 |
| WO | WO 2004/107417 A1 | 12/2004 |
| WO | WO 2004/109780 A1 | 12/2004 |
| WO | WO 2004/114380 A1 | 12/2004 |
| WO | WO 2005/006415 A1 | 1/2005 |
| WO | WO 2005/006418 A1 | 1/2005 |
| WO | WO 2005/008754 A1 | 1/2005 |
| WO | WO 2005/022615 A1 | 3/2005 |
| WO | WO 2005/026843 A2 | 3/2005 |
| WO | WO 2005/027207 A1 | 3/2005 |
| WO | WO 2005/029559 A1 | 3/2005 |
| WO | WO 2005/031467 A2 | 4/2005 |
| WO | WO 2005/036619 A1 | 4/2005 |
| WO | WO 2005/036620 A1 | 4/2005 |
| WO | WO 2005/036622 A1 | 4/2005 |
| WO | WO 2005/036623 A1 | 4/2005 |
| WO | WO 2005/041276 A1 | 5/2005 |
| WO | WO 2005/041277 A1 | 5/2005 |
| WO | WO 2005/048325 A1 | 5/2005 |
| WO | WO 2005/048326 A1 | 5/2005 |
| WO | WO 2005/050718 A1 | 6/2005 |
| WO | WO 2005/057636 A1 | 6/2005 |
| WO | WO 2005/067013 A1 | 7/2005 |
| WO | WO 2005/069081 A2 | 7/2005 |
| WO | WO 2005/071671 A2 | 8/2005 |
| WO | WO 2005/071717 A1 | 8/2005 |
| WO | WO 2005/076045 A1 | 8/2005 |
| WO | WO 2005/076321 A1 | 8/2005 |
| WO | WO 2005/076323 A1 | 8/2005 |
| WO | WO 2005/081291 A1 | 9/2005 |
| WO | WO 2005/081292 A1 | 9/2005 |
| WO | WO 2005/104195 A1 | 11/2005 |
| WO | WO 2006/006730 A1 | 1/2006 |
| WO | WO 2006/016551 A1 | 2/2006 |
| WO | WO 2006/019124 A1 | 2/2006 |
| WO | WO 2006/025341 A1 | 3/2006 |
| WO | WO 2006/028188 A1 | 3/2006 |
| WO | WO 2006/030727 A1 | 3/2006 |
| WO | WO 2006/030910 A1 | 3/2006 |
| WO | WO 2006-035775 A1 | 4/2006 |
| WO | WO 2006/049134 A1 | 5/2006 |
| WO | WO 2006/051909 A1 | 5/2006 |
| WO | WO 2006/064851 A1 | 6/2006 |
| WO | WO 2006/068233 A1 | 6/2006 |
| WO | WO 2006/077958 A1 | 7/2006 |
| WO | WO 2006/080285 A1 | 8/2006 |
| WO | WO 2006/085524 A1 | 8/2006 |
| WO | WO 2006/100889 A1 | 9/2006 |
| WO | WO 2006/118108 A1 | 11/2006 |
| WO | WO 2007/003563 A1 | 1/2007 |
| WO | WO 2007/018127 A1 | 2/2007 |
| WO | WO 2007/055120 A1 | 5/2007 |
| WO | WO 2007/055237 A1 | 5/2007 |
| WO | WO 2007/055373 A1 | 5/2007 |
| WO | WO 2007/066692 A1 | 6/2007 |
| WO | WO 2007/066758 A1 | 6/2007 |
| WO | WO 2007/097198 A1 | 8/2007 |
| WO | WO 2007/132862 A1 | 11/2007 |
| WO | WO 2007/141997 A1 | 12/2007 |
| WO | WO 2008/041575 A1 | 4/2008 |
| WO | WO 2008/059748 A1 | 5/2008 |
| WO | WO 2008/061681 A2 | 5/2008 |
| WO | WO 2008/065977 A1 | 6/2008 |
| WO | WO 2008/074673 A2 | 6/2008 |
| WO | WO 2008/075613 A1 | 6/2008 |
| WO | WO 2008/078688 A1 | 7/2008 |
| WO | WO 2008/090975 A1 | 7/2008 |
| WO | WO 2008/139848 A1 | 11/2008 |
| WO | WO 2009/153925 A1 | 12/2009 |
| WO | WO 2009/157154 A1 | 12/2009 |
| WO | WO 2010/001537 A1 | 1/2010 |

OTHER PUBLICATIONS

English translation of JP06-053120, published on Feb. 25, 1994.*
English translation of JP 2000-114157, published on Apr. 21, 2000.*
May 28, 2013 Office Action issued in Japanese Patent Application No. 2011-144669 (with English translation).
May 28, 2013 Office Action issued in Japanese Patent Application No. 2010-094216 (with English translation).
Jun. 18, 2013 Search Report issued in European Patent Application No. 13156322.3.
Jun. 21, 2013 Search Report issued in European Patent Application No. 13156324.9.
Jun. 23, 2011 Office Action issued in Chinese Patent Application No. 200910173714.1 (with English Translation).
Jul. 5, 2011 Office Action issued in Chinese Patent Application No. 201010128136.2 (with English Translation).
Jul. 8, 2011 Office Action issued in U.S. Appl. No. 12/318,216.
Jul. 20, 2011 Office Action issued in Taiwanese Patent Application No. 094100817 (with English Translation).
Jul. 26, 2011 Office Action issued in Korean Patent Application No. 10-2006-7018069 (with English Translation).
Aug. 4, 2011 Office Action issued in Taiwanese Patent Application No. 093131767 (with English Translation).
Aug. 11, 2011 Office Action issued in Korean Patent Application No. 10-2010-7000893 (with English Translation).
Aug. 11, 2011 Office Action issued in Korean Patent Application No. 10-2010-7000897 (with English Translation).
Sep. 1, 2011 Office Action issued in U.S. Appl. No. 11/902,277.
Sep. 13, 2011 Office Action issued in European Patent Application No. 04 799 453.8.
Sep. 6, 2011 Notice of Allowance issued in U.S. Appl. No. 11/644,966.
Sep. 30, 2011 Office Action issued in Korean Patent Application No. 10-2005-7018973 (with English Translation).

(56) References Cited

OTHER PUBLICATIONS

Feb. 8, 2011 Trial for Invalidation Requested by a Third Party to Korean Patent Application No. 10-869390 (with English Translation).
Exhibit No. 1: Patent Register of Korean Patent Application No. 10-869390.
Exhibit No. 2: Published specification of Korean Patent Application No. 10-869390 (with English Translation).
Exhibit No. 3: Carl Zeiss SMT GmbH, "Lithographic Systems", http://www.zeiss.com.
Exhibit No. 4: Japanese Patent Publication No. 6-053120 (with English Translation).
Exhibit No. 5: Japanese Patent Publication No. 7-183201 (with English Abstract).
Exhibit No. 6: Wave Plate, Wikipedia, The Free Encyclopedia, http://en.wikipedia.org/wiki/Wave_plate, Feb. 7, 2011; Polarization Waves, Wikipedia, The Free Encyclopedia, http://en.wikipedia.org/wiki/Polarization_(waves), Feb. 7, 2011.
Exhibit No. 7: Korean Patent Publication No. 2001-51438 (with English Translation).
Exhibit No. 8: Marc D. Himel et al., "Design and Fabrication of Customized Illumination Patterns for Low k1 Lithography: A Diffractive Approach", Proceedings of SPIE, vol. 4346, pp. 1436-1442.
Exhibit No. 9: Japanese Patent Publication No. 2001-284228 (with English Abstract).
Exhibit No. 10: Korean Patent Publication No. 2000-76783 (with English Translation).
Feb. 8, 2011 Trial for Invalidation Requested by a Third Party to Korean Patent Application No. 10-839686 (with English Translation).
Exhibit No. 1: Patent Register of Korean Patent Application No. 10-0839686.
Exhibit No. 2: published specification of Korean Patent Application No. 10-839686 (with English Translation).
Oct. 10, 2011 Office Action issued in Chinese Patent Application No. 200710110952.9 (with English Translation).
Mar. 9, 2011 Trial for Invalidation Requested by a Third Party to Korean Patent Application No. 10-1020455 (with English Translation).
Exhibit No. 1: Patent Register of Korean Patent Application No. 10-1020455.
Exhibit No. 2: published specification of Korean Patent Application No. 10-1020455 (with English Translation).
Mar. 9, 2011 Trial for Invalidation Requested by a Third Party to Korean Patent Application No. 10-1020378 (with English Translation).
Exhibit No. 1: Patent Register of Korean Patent Application No. 10-1020378.
Exhibit No. 2: published specification of Korean Patent Application No. 10-1020378 (with English Translation).
Oct. 18, 2011 Office Action issued in Japanese Patent Application No. 2005-515570 (with English Translation).
Oct. 18, 2011 Office Action issued in Japanese Patent Application No. 2006-262589 (with English Translation).
Nov. 15, 2011 Office Action issued in European Patent Application No. 09 167 707.0.
Nov. 10, 2011 Office Action issued in European Patent Application No. 07 017 146.7.
Nov. 15, 2011 Office Action issued in Korean Patent Application No. 2009-7010159 (with English Translation).
Nov. 15, 2011 Office Action issued in Korean Patent Application No. 2009-7010158 (with English Translation).
Nov. 25, 2011 Office Action in European Application No. 06711853.9.
Nov. 30, 2011 Office Action in related U.S. Appl. No. 11/902,282.
Dec. 12, 2011 Office Action in European Application No. 10174843.2.
Dec. 14, 2011 Office Action in related U.S. Appl. No. 11/902,277.
Dec. 15, 2011 Office Action in related U.S. Appl. No. 12/382,277.
Dec. 16, 2011 Office Action in related U.S. Appl. No. 13/067,958.
Nov. 17, 2011 Office Action issued in Taiwanese Patent Application No. 096119463 (with English Translation).
Nov. 22, 2011 Office Action issued in Chinese Patent Application No. 200910173718.X (with English Translation).
Written Rebuttal against the Written Answer filed by the Respondent on Jul. 6, 2011 in JP Patent Appln. No. 10-2006-7008368 w/English Translation.
Exhibit: Printout of Wikipedia "Polarizer."
Exhibit: DE10206061 A1.
Exhibit: U.S. Patent No. 4,370,026.
Written Rebuttal against the Written Answer filed by the Respondent on Jul. 6, 2011 in JP Appln. No. 10-2007-7022489 w/English Translation.
Written Rebuttal against the Written Answer filed by the Respondent on Aug. 22, 2011 in JP Patent Appln. No. 10-2008-7019081 w/English Translation.
Written Rebuttal against the Written Answer filed by the Respondent on Aug. 22, 2011 in JP Patent Appln. No. 10-2008-7019082 w/English Translation.
Exhibit: Korean Language Dictionary published by Minjungseorim w/English Translation.
Exhibit: JP05-109601 w/English Translation.
Jan. 19, 2012 Office Action issued in U.S. Appl. No. 12/458,635.
Feb. 10, 2012 European Office Action issued in Application No. 10 012 876.8.
Jan. 18, 2012 European Office Action issued in Application No. 10 174 843.2.
Feb. 13, 2012 Taiwanese Office Action issued in Application No. 094100817 w/English translation.
Mar. 6, 2012 Notice of Allowance issued in U.S. Appl. No. 12/289,515.
Feb. 22, 2012 Office Action issued in Chinese Patent Application No. 200910173715.6 (with translation).
Mar. 30, 2012 Office Action issued in U.S. Appl. No. 12/318,216.
Mar. 8, 2012 Office Action issued in Taiwanese Patent Application No. 093131767 (with translation).
Jan. 25, 2012 Office Action issued in U.S. Appl. No. 12/801,043.
Jan. 17, 2012 Japanese Office Action issued in Application No. 2006-262589 w/English translation.
Jan. 17, 2012 Japanese Office Action issued in Application No. 2005-515570 w/English translation.
Jun. 1, 2012 Office Action issued in European Patent Application No. 09 015 058.2-1234.
Apr. 5, 2012 Notice of Allowance issued in U.S. Appl. No. 11/644,966.
May 4, 2012 Preliminary Notice of the First Office Action issued in Taiwanese Application No. 096138500 (with translation).
Apr. 26, 2012 Office Action issued in Chinese Application No. 200910126047.1 (with translation).
May 9, 2012 Office Action issued in Chinese Application No. 200810211496.1 (with translation).
Apr. 30, 2012 Office Action issued in Korean Application No. 10-2006-7012265 (with translation).
Apr. 30, 2012 Office Action issued in Korean Patent Application No. 10-2010-7001898 (with translation).
Apr. 30, 2012 Office Action issued in Korean Patent Application No. 10-2010-7001907 (with translation).
May 21, 2012 Office Action issued in Chinese Patent Application No. 201010128876.6 (with translation).
Jun. 8, 2012 Office Action issued in Korean Patent Application No. 10-2007-7005320 (with translation).
Jun. 11, 2012 Office Action issued in Korean Patent Application No. 10-2012-7003793 (with translation).
Jun. 28, 2012 Office Action issued in Korean Patent Application No. 2012-7008342 (with translation).
Jul. 17, 2012 Office Action issued in U.S. Appl. No. 11/902,277.
Jul. 19, 2012 Office Action issued in U.S. Appl. No. 11/902,282.
Jun. 27, 2012 Office Action issued in Korean Patent Application No. 2009-7010158 (with translation).
Jun. 4, 2012 Office Action issued in Chinese Patent Application No. 200710110950.X (with translation).
Jun. 29, 2012 Office Action issued in Chinese Patent Application No. 200910173714.1 (with translation).

(56) References Cited

OTHER PUBLICATIONS

Jul. 17, 2012 Office Action issued in U.S. Appl. No. 12/382,277.
Jul. 30, 2012 Office Action issued Korean Patent Application No. 10-2006-7018069 (with translation).
Aug. 3, 2012 Office Action issued in U.S. Appl. No. 13/137,342.
Aug. 6, 2012 Office Action issued in U.S. Appl. No. 13/137,004.
Aug. 7, 2012 Office Action issued in U.S. Appl. No. 13/137,003.
Aug. 10, 2012 Office Action issued in U.S. Appl. No. 13/137,002.
Oct. 18, 2007 European Search Report issued in European Patent Application No. 07017146.7.
Apr. 2, 2007 European Search Report issued in European Patent Application No. 04724369.6.
Oct. 1, 2008 Supplemental European Search Report issued in European Patent Application No. 04817303.3.
Apr. 24, 2008 Supplemental European Search Report issued in European Patent Application No. 08002882.2.
Jun. 25, 2010 European Search Report issued in European Patent Application No. 09167707.0.
Oct. 13, 2009 European Search Report issued in European Patent Application No. 09167707.0.
Feb. 23, 2009 Office Action issued in European Patent Application No. 08002882.2.
Mar. 31, 2009 Office Action issued in European Patent Application No. 04 799 453.8.
May 26, 2010 Office Action issued in European Patent Application No. 07 017 146.7.
May 12, 2009 Office Action issued in European Patent Application No. 04 724 369.6.
Jul. 12, 2010 Office Action issued in European Patent Application No. 06 711 853.9.
Oct. 8, 2010 Office Action issued in European Patent Application No. 06822564.8.
Oct. 7, 2009 Office Action issued in European Patent Application No. 04 799 453.8.
Sep. 25, 2007 Office Action issued in European Patent Application No. 04 799 453.8.
Jan. 18, 2010 Office Action issued in Korean Patent Application No. 10-2008-701908.1 (with translation).
Nov. 15, 2007 Office Action issued in Korean Patent Application No. 10-2007-7022489 (with translation).
Apr. 3, 2008 Office Action issued in Korean Patent Application No. 10-2006-7008368 (with translation).
Jan. 4, 2008 Office Action issued in Korean Patent Application No. 10-2006-7008368 (with translation).
Feb. 2, 2007 Office Action issued in Korean Patent Application No. 10-2006-7008368 (with translation).
Apr. 25, 2011 Office Action issued in Korean Patent Application No. 10-2011-7001502 (with translation).
Jan. 18, 2010 Office Action issued in Korean Patent Application No. 10-2008-7019082 (with translation).
Dec. 3, 2010 Office Action issued in Korean Patent Application No. 10-2008-7029536 (with translation).
Nov. 19, 2010 Office Action issued in Korean Patent Application No. 10-2008-7029535 (with translation).
Oct. 27, 2010 Office Action issued in Korean Patent Application No. 10-2005-7009937 (with translation).
Mar. 27, 2009 Office Action issued in Chinese Patent Application No. 2007101956440 (with translation).
Dec. 14, 2010 Office Action issued in Chinese Patent Application No. 200380104450.5 (with translation).
Jun. 13, 2008 Office Action issued in Chinese Patent Application No. 2003801044505 (with translation).
Jan. 18, 2008 Office Action issued in Chinese Patent Application No. 2003801044505 (with translation).
Jun. 29, 2007 Office Action issued in Chinese Patent Application No. 2003801044505 (with translation).
Oct. 24, 2008 Office Action issued in Chinese Patent Application No. 2007101109529 (with translation).
Nov. 13, 2009 Office Action issued in Chinese Patent Application No. 200810211496.1 (with translation).
Jul. 25, 2008 Office Action issued in Chinese Patent Application No. 200710110949.7 (with translation).
Aug. 21, 2009 Office Action issued in Chinese Patent Application No. 200810126659.6 (with translation).
May 5, 2010 Office Action issued in Chinese Patent Application No. 200810126659.6 (with translation).
Dec. 4, 2009 Office Action issued in Chinese Patent Application No. 2007101109529 (with translation).
Apr. 13, 2010 Office Action issued in Chinese Patent Application No. 2007101109529 (with translation).
Jun. 5, 2009 Office Action issued in Chinese Patent Application No. 2007101109497 (with translation).
Jun. 5, 2009 Office Action issued in Chinese Patent Application No. 2007101109482 (with translation).
Jul. 25, 2008 Office Action issued in Chinese Patent Application No. 2007101109482 (with translation).
Jun. 5, 2009 Office Action issued in Chinese Patent Application No. 2007101109529 (with translation).
Jun. 5, 2009 Office Action issued in Chinese Patent Application No. 2007101109514 (with translation).
Jul. 25, 2008 Office Action issued in Chinese Patent Application No. 2007101109514 (with translation).
Jun. 5, 2009 Office Action issued in Chinese Patent Application No. 200710110950X (with translation).
Jul. 25, 2008 Office Action issued in Chinese Patent Application No. 200710110950X (with translation).
Jun. 5, 2009 Office Action issued in Chinese Patent Application No. 2007101956421 (with translation).
Apr. 28, 2010 Office Action issued in Chinese Patent Application No. 200710195642.1 (with translation).
Dec. 18, 2009 Office Action issued in Chinese Patent Application No. 2007101956421 (with translation).
Dec. 18, 2009 Office Action issued in Chinese Patent Application No. 2007101956417 (with translation).
Jun. 5, 2009 Office Action issued in Chinese Patent Application No. 2007101956417 (with translation).
Dec. 18, 2009 Office Action issued in Chinese Patent Application No. 2007101956440 (with translation).
Aug. 7, 2009 Office Action issued in Chinese Patent Application No. 2007101956440 (with translation).
Jan. 8, 2010 Office Action issued in Chinese Patent Application No. 2003801044505 (with translation).
Oct. 26, 2004 Office Action issued in Chinese Patent Application No. 200480031414.5 (with translation).
Jun. 10, 2010 Office Action issued in Chinese Patent Application No. 200810211497.6 (with translation).
Feb. 6, 1996 Office Action issued in Taiwanese Patent Application No. 093109836 (with translation).
Jul. 27, 2009 Office Action issued in Taiwanese Patent Application No. 092133642 (with translation).
Mar. 17, 2008 Office Action issued in Taiwanese Patent Application No. 092133642 (with translation).
Jul. 13, 2006 Office Action issued in Taiwanese Patent Application No. 092133642 (with translation).
May 4, 2005 Office Action issued in Taiwanese Patent Application No. 092133642 (with translation).
Dec. 3, 2004 Office Action issued in Taiwanese Patent Application No. 092133642 (with translation).
Jan. 28, 2010 Office Action issued in Japanese Patent Application No. 2008-077129 (with translation).
Jun. 14, 2010 Office Action issued in Japanese Patent Application No. 2010-006125 (with translation).
Apr. 15, 2010 Office Action issued in Japanese Patent Application No. 2007-251263 (with translation).
Mar. 24, 2011 Office Action issued in Japanese Patent Application No. 2007-251263 (with translation).
Jan. 28, 2010 Office Action issued in Japanese Patent Application No. 2005-515005 (with translation).
Feb. 20, 2009 Office Action issued in Japanese Patent Application No. 2005-505207 (with translation).
Mar. 8, 2010 Office Action issued in Japanese Patent Application No. 2005-505207 (with translation).

(56) References Cited

OTHER PUBLICATIONS

Aug. 5, 2009 Office Action issued in Japanese Patent Application No. 2004-570728 (with translation).
Nov. 9, 2009 Office Action issued in Japanese Patent Application No. 2003-402584 (with translation).
Nov. 10, 2009 Office Action issued in Japanese Patent Application No. 2003-390672 (with translation).
Apr. 24, 2012 Office Action issued in Japanese Patent Application No. 2009-149426 (with translation).
Sep. 27, 2011 Office Action issued in Japanese Patent Application No. 2010-003941 (with translation).
Feb. 14, 2012 Office Action issued in Japanese Patent Application No. 2010-003941 (with translation).
Sep. 27, 2011 Office Action issued in Japanese Patent Application No. 2010-003938 (with translation).
Feb. 14, 2012 Office Action issued in Japanese Patent Application No. 2010-003938 (with translation).
Mar. 6, 2012 Office Action issued in Japanese Patent Application No. 2007-544009 (with translation).
Sep. 20, 2011 Office Action issued in Japanese Patent Application No. 2009-225810 (with translation).
May 31, 2011 Office Action issued in Japanese Patent Application No. 2009-225810 (with translation).
Jul. 14, 2008 Notice of Allowance issued in U.S. Appl. No. 11/246,642.
Feb. 20, 2007 Office Action issued in U.S. Appl. No. 11/246,642.
May 17, 2007 Office Action issued in U.S. Appl. No. 11/246,642.
Dec. 4, 2007 Office Action issued in U.S. Appl. No. 11/246,642.
Jun. 20, 2008 Corrected Notice of Allowance issued in U.S. Appl. No. 11/140,103.
Apr. 25, 2007 Office Action issued in U.S. Appl. No. 11/140,103.
Jul. 12, 2007 Office Action issued in U.S. Appl. No. 11/140,103.
Feb. 14, 2008 Office Action issued in U.S. Appl. No. 11/140,103.
Nov. 6, 2008 Office Action issued in U.S. Appl. No. 12/155,301.
Apr. 16, 2009 Office Action issued in U.S. Appl. No. 12/155,301.
Sep. 14, 2009 Office Action issued in U.S. Appl. No. 12/155,301.
Apr. 22, 2010 Office Action issued in U.S. Appl. No. 12/155,301.
Aug. 31, 2011 Office Action issued in U.S. Appl. No. 12/093,303.
Jan. 4, 2010 Notice of Allowance issued in U.S. Appl. No. 11/644,966.
Apr. 14, 2010 Notice of Allowance issued in U.S. Appl. No. 11/644,966.
Aug. 2, 2010 Notice of Allowance issued in U.S. Appl. No. 11/644,966.
Feb. 8, 2011 Notice of Allowance issued in U.S. Appl. No. 11/644,966.
Apr. 22, 2008 Office Action issued in U.S. Appl. No. 11/644,966.
Sep. 20, 2010 Notice of Allowance issued in U.S. Appl. No. 11/410,952.
Mar. 31, 2011 Notice of Allowance issued in U.S. Appl. No. 11/410,952.
Jul. 13, 2011 Notice of Allowance issued in U.S. Appl. No. 11/410,952.
Nov. 12, 2008 Office Action issued in U.S. Appl. No. 11/410,952.
Jan. 8, 2009 Office Action issued in U.S. Appl. No. 11/410,952.
Nov. 25, 2009 Office Action issued in U.S. Appl. No. 11/410,952.
Jun. 16, 2010 Office Action issued in U.S. Appl. No. 11/410,952.
Nov. 30, 2010 Notice of Allowance issued in U.S. Appl. No. 12/289,518.
Nov. 18, 2010 Notice of Allowance issued in U.S. Appl. No. 12/289,515.
Mar. 23, 2011 Notice of Allowance issued in U.S. Appl. No. 12/289,515.
Nov. 28, 2011 Office Action issued in U.S. Appl. No. 12/801,043.
Sep. 11, 2012 Office Action issued in Taiwanese Patent Application No. 097117896 (with translation).
Sep. 18, 2012 Office Action issued in Chinese Patent Application No. 200910173718.X (with translation).
Sep. 4, 2012 Notice of Reasons for Rejection issued in Japanese Patent Application No. 2010-087010 (with translation).
Sep. 20, 2012 Office Action issued in European Patent Application No. 04817303.3.
Aug. 20, 2012 Notice of Allowance issued in Taiwanese Patent Application No. 097117881 (with translation).
Aug. 20, 2012 Written Opinion submitted in Korean Patent Application No. 10-0869390 (with translation).
Aug. 20, 2012 Written Opinion submitted in Korean Patent Application No. 10-0839686 (with translation).
Aug. 20, 2012 Written Opinion submitted in Korean Patent Application No. 10-1020455 (with translation).
Aug. 20, 2012 Written Opinion submitted in Korean Patent Application No. 10-1020378 (with translation).
Oct. 12, 2012 Office Action issued in U.S. Appl. No. 12/458,635.
Oct. 8, 2012 Office Action issued in Chinese Application No. 200910173716.0 (with translation).
Sep. 18, 2012 Office Action issued in Japanese Application No. 2010-094216 (with translation).
Sep. 18, 2012 Office Action issued in Japanese Application No. 2011-144669 (with translation).
Oct. 10, 2012 Office Action issued in Chinese Application No. 200910173717.5 (with translation).
Oct. 17, 2012 Office Action issued in Korean Application No. 10-2010-7001907 (with translation).
Oct. 26, 2012 Office Action issued in Taiwanese Application No. 097117893 (with translation).
Nov. 9, 2012 Office Action issued in U.S. Appl. No. 11/644,966.
Jul. 30, 2012 Office Action issued in Korean Application No. 10-2006-7018069 (with translation).
Jun. 29, 2012 Office Action issued in Chinese Application No. 200910173714.1 (with translation).
Jun. 4, 2012 Office Action issued in Chinese Application No. 200710110950.X (with translation).
Oct. 30, 2012 Office Action issued in Korean Application No. 10-2012-7023534 (with translation).
Nov. 21, 2012 Office Action issued in European Application No. 05 703 646.9.
Nov. 6, 2012 Written Opinion issued in Korean Application No. 10-2006-7008368 (with translation).
Nov. 9, 2012 Written Opinion issued in Korean Application No. 10-2007-7022489 (with translation).
Nov. 26, 2012 Written Opinion issued in Korean Application No. 10-2008-7019081 (with translation).
Nov. 26, 2012 Written Opinion issued in Korean Application No. 10-2008-7019082 (with translation).
Dec. 5, 2012 Office Action issued in Taiwanese Application No. 096138500 (with translation).
Dec. 18, 2012 Office Action issued in Japanese Application No. P2009-149426 (with translation).
Dec. 12, 2012 Notice of Allowance issued in U.S. Appl. No. 12/289,515.
Dec. 27, 2012 Office Action issued in Taiwanese Application No. 095100035 (with translation).
Dec. 26, 2012 Office Action issued in Taiwanese Application No. 097151814 (with translation).
Dec. 26, 2012 Office Action issued in Taiwanese Application No. 097151805 (with translation).
Dec. 27, 2012 Office Action issued in Taiwanese Application No. 097151801 (with translation).
Jan. 2, 2013 Office Action issued in Korean Application No. 10-2007-7005320 (with translation).
Jan. 15, 2013 Notice of Allowance issued in U.S. Appl. No. 13/067,958.
Jan. 7, 2013 Office Action issued in Chinese Patent Application No. 200910173715.6 (with translation).
Jan. 14, 2013 Office Action issued in Chinese Patent Application No. 201010128876.6 (with translation).
Jan. 9, Technical Presentation Document in Invalidation Trial against Korean Patent Application No. 839686, Appeal No. 2011Dang301 (with translation).
Jan. 9, Technical Presentation Document in Invalidation Trial against Korean Patent Application No. 869390, Appeal No. 2011Dang302 (with translation).

(56) References Cited

OTHER PUBLICATIONS

Jan. 16, 2013 Office Action issued in Chinese Patent Application No. 200910173714.1 (with translation).
Jan. 14, 2013 Office Action issued in Chinese Patent Application No. 200910126047.1 (with translation).
Jan. 18, 2013 Office Action issued in Chinese Patent Application No. 200810211496.1 (with translation).
Halliday et al., Fundamentals of Physics: Extended, with Modern Physics, Fourth Edition, John Wiley & Sons, Inc., Jul. 25, 1995 (with partial translation).
Feb. 6, 2013 Written Opinion submitted in Korean Patent Application No. 10-2006-7008368 (with translation).
Feb. 6, 2013 Written Opinion submitted in Korean Patent Application No. 10-2007-7022489 (with translation).
Feb. 6, 2013 Written Opinion submitted in Korean Patent Application No. 10-2008-7019081 (with translation).
Feb. 6, 2013 Written Opinion submitted in Korean Patent Application No. 10-2008-7019082 (with translation).
Feb. 25, 2013 Office Action issued in U.S. Appl. No. 12/382,277.
Feb. 22, 2013 Reference Document submitted in Korean Patent Application No. 10-2006-7008368 (with translation).
Feb. 22, 2013 Reference Document submitted in Korean Patent Application No. 10-2007-7022489 (with translation).
Feb. 22, 2013 Reference Document submitted in Korean Patent Application No. 10-2008-7019081 (with translation).
Feb. 22, 2013 Reference Document submitted in Korean Patent Application No. 10-2008-7019082 (with translation).
Feb. 4, 2013 Written Opinion submitted in Korean Patent Application No. 10-0869390, Appeal No. 2011Dang302 (with translation).
Feb. 4, 2013 Written Opinion submitted in Korean Patent Application No. 10-0869390, Appeal No. 2011Dang301 (with translation).
Hecht, Optics Fourth Edition, Addison Wesley, 2002, Preface, "Polarization," pp. 325-358, and "Diffraction," pp. 443-485.
Heung, Optics Second Edition, Hecht, Daewoong, 1998 "Polarizers," pp. 395-630 (with translation).
Bass, Handbook of Optics, McGraw-Hill, 1995, pp. 5.22-5.25.
Herzig, Micro-Optics, Taylor & Francis, 1997, pp. vii-29.
Feb. 4, 2013 Technical Presentation Document in Invalidation Trial against Korean Patent Application No. 10-1020455, Appeal No. 2011Dang510 (with translation).
Feb. 4, 2013 Technical Presentation Document in Invalidation Trial against Korean Patent Application No. 10-1020378, Appeal No. 2011Dang511 (with translation).
Feb. 24, 2013 Office Action issued in Korean Patent Application No. 2012-7034127 (with translation).
Feb. 19, 2013 Office Action issued in Japanese Patent Application No. P2010-087010 (with translation).
Feb. 19, 2013 Office Action issued in Japanese Patent Application No. P2011-138703 (with translation).
Feb. 27, 2013 Office Action issued in Korean Patent Application No. 10-2012-7034128 (with translation).
Mar. 19, 2013 Office Action issued in Japanese Patent Application No. P2010-145155 (with translation).
Feb. 28, 2013 Reference Document submitted in Korean Patent Application No. 10-2006-7008368, Appeal No. 2011Dang302 (with translation).
Feb. 28, 2013 Reference Document submitted in Korean Patent Application No. 10-2007-7022489, Appeal No. 2011Dang301 (with translation).
Feb. 28, 2013 Reference Document submitted in Korean Patent Application No. 10-2008-7019081, Appeal No. 2011Dang510 (with translation).
Feb. 28, 2013 Reference Document submitted in Korean Patent Application No. 10-2008-7019082, Appeal No. 2011Dang511 (with translation).
Mar. 5, 2013 Office Action issued in Chinese Patent Application No. 200710110949.7 (with translation).
Mar. 5 2013 Office Action issued in Chinese Patent Application No. 200710110951.4 (with translation).
Mar. 20, 2013 Office Action issued in U.S. Appl. No. 11/902,282.
Apr. 2, 2013 Office Action issued in Japanese Patent Application No. P2010-290979 (with translation).
Mar. 26, 2013 Office Action issued in U.S. Appl. No. 11/902277.
Translation of Apr. 2, 2013 Office Action issued in Japanese Patent Application No. P2010286303.
Brunner, Timothy A., et al. "High NA Lithographic Imaging at Brewster's Angle." SPIE (U.S.A.), vol. 4691, pp. 1-24, 2002.
Tsuruta T. "Applied Optics II," Baifukan Co., Ltd., pp. 166-167. Jul. 1990.
English-language translation of Korean Office Action issued May 31, 2010 in Korean Patent Application No. 10-2008-7019081.
English-language translation of Korean Office Action issued May 31, 2010 in Korean Patent Application No. 10-2008-7019082.
European Search Report issued Sep. 29, 2010 in Application No. 10174843.2.
Chinese Office Action issued Aug. 23, 2010 in Application No. 200810211496.1 (with English translation).
European Search Report issued Oct. 4, 2010 in Application No. 05703646.9.
Korean Office Action issued Jul. 20, 2010 in Korean Application No. 10-2010-7008438 (with English translation).
Korean Office Action issued Jul. 20, 2010 in Korean Application No. 10-2010-7008441 (with English translation).
Korean Office Action issued Jul. 20, 2010 in Korean Application No. 10-2010-7008444 (with English translation).
Jul. 20, 2010 Notice of Allowance issued in U.S. Appl. No. 12/289,515.
Notice of Allowance issued in Japanese Patent Application No. 2006-553907; mailed Aug. 3, 2010.
Notice of Reasons for Rejection issued in Japanese Patent Application No. 2005-517637; mailed Oct. 26, 2010; with English-language translation.
Notice of Reasons for Rejection issued in Japanese Patent Application No. 2006-262588; mailed Oct. 26, 2010; with English-language translation.
Notice of Reasons for Rejection issued in Japanese Patent Application No. 2006-262590; mailed Oct. 26, 2010; with English-language translation.
Office Action issued in Chinese Patent Application No. 200810126659.6; mailed Oct. 8, 2010; with English-language translation.
European Search Report issued Nov. 3, 2010 in related Application No. EP 09 01 5058.2.
Office Action issued in Chinese Patent Application No. 200710110948.2 on Nov. 12, 2010 (w/English Translation).
Search Report issued in European Patent Application No. 10012876.8 on Dec. 7, 2010.
Office Action issued Oct. 18, 2010 in U.S. Appl. No. 12/382,277.
Nov. 30, 2010 Notice of Allowance issued in Korean Application No. 10-2008-7019082.
Jan. 14, 2011 Office Action issued in U.S. Appl. No. 12/320,480.
Jan. 14, 2011 Office Action issued in U.S. Appl. No. 12/320,468.
Feb. 1, 2011 Office Action issued in Japanese Application No. P2006-262588 with English translation.
Feb. 1, 2011 Office Action issued in Japanese Application No. P2006-262590 with English translation.
Feb. 8, 2011 Office Action in U.S. Appl. No. 12/320,465.
Feb. 1, 2011 Office Action in Japanese Application No. 2005-517637, with translation.
Jan. 24, 2011 Office Action in Korean Application No. 2005-7018973, with translation.
Jan. 24, 2011 Office Action in Korean Application No. 2009-7010158, with translation.
Jan. 25, 2011 Office Action in Korean Application No. 2009-7010159, with translation.
Feb. 1, 2011 Office Action in Chinese Application No. 200810126659.6, with translation.
Feb. 26, 2009 Office Action in U.S. Appl. No. 11/347,421.
Jan. 7, 2010 Office Action in U.S. Appl. No. 12/289,518.
Oct. 29, 2009 Office Action in U.S. Appl. No. 12/289,515.
Dec. 1, 2009 Office Action issued in U.S. Appl. No. 11/902,277.
Jun. 25, 2008 Office Action issued in U.S. Appl. No. 11/902,277.
Apr. 15, 2009 Office Action issued in U.S. Appl. No. 11/902,277.

(56) References Cited

OTHER PUBLICATIONS

Jun. 25, 2008 Office Action issued in U.S. Appl. No. 11/902,282.
Feb. 9, 2009 Office Action issued in U.S. Appl. No. 11/902,282.
Dec. 14, 2009 Office Action issued in U.S. Appl. No. 11/902,282.
Jan. 25, 2010 Search Report issued in European Application No. 09015058.2.
Nov. 6, 2009 Office Action issued in Chinese Application No. 2008102114957 (with translation).
Sep. 11, 2009 Office Action issued in Chinese Application No. 2008102114976 (with translation).
Mar. 21, 2008 Office Action issued in Chinese Application No. 2004800341246 (with translation).
Apr. 21, 2010 Office Action issued in U.S. Appl. No. 12/289,518.
Apr. 24, 2009 Office Action issued in Chinese Application No. 2006800006868 (with translation).
Jan. 28, 2010 Search Report issued in European Application No. 06711853.9.
Apr. 22, 2010 Office Action issued in Japanese Application No. 2006-553907 (with translation).
Mar. 26, 2010 Office Action issued in U.S. Appl. No. 11/902,277.
Mar. 26, 2010 Office Action issued in U.S. Appl. No. 11/902,282.
Jan. 6, 2011 Office Action issued in U.S. Appl. No. 11/902,282.
Aug. 3, 2010 Office Action issued in Japanese Application No. 2005-515570 (with translation).
Feb. 15, 2011 Office Action issued in U.S. Appl. No. 11/902,277.
Jul. 3, 2008 Office Action issued in U.S. Appl. No. 11/319,057.
Feb. 26, 2009 Office Action issued in U.S. Appl. No. 11/319,057.
Jan. 14, 2011 Office Action issued in U.S. Appl. No. 12/461,852.
Oct. 4, 2010 International Search Report issued in International Application No. PCT/JP2010/061300.
Oct. 4, 2010 Written Opinion of the International Searching Authority issued in International Application No. PCT/JP2010/061300.
Jan. 11, 2011 Office Action issued in U.S. Appl. No. 12/461,801.
Aug. 3, 2010 Office Action issued in Japanese Application No. 2006-262589 (with translation).
Jul. 12, 2010 Office Action issued in U.S. Appl. No. 12/461,801.
Sep. 15, 2008 Office Action issued in U.S. Appl. No. 11/644,966.
Jun. 25, 2009 Office Action issued in U.S. Appl. No. 11/644,966.
Levinson, Harry J., "Principles of Lithography," Bellingham, WA: SPIE Press, 2001, pp. 205-206.
Jan. 26, 2011 Office Action issued in Chinese Application No. 200910173715.6 (with translation).
Feb. 23, 2010 Office Action issued in Japanese Application No. 2006-262589 (with translation).
Feb. 23, 2010 Office Action issued in Japanese Application No. 2005-515570 (with translation).
May 14, 2008 International Preliminary Report on Patentability issued in International Application No. PCT/JP2006/321607.
May 14, 2008 Written Opinion issued in International Application No. PCT/JP2006/321607 (with translation).
Nov. 12, 2010 Office Action issued in Chinese Application No. 200910126047.1 (with translation).
Feb. 25, 2010 Extended Search Report issued in European Application No. 06822564.8.
U.S. Appl. No. 12/835,860, filed Jul. 14, 2010 by Kanayamaya et al.
Feb. 15, 2011 Office Action issued in European Patent Application No. 05 703 646.9.
Feb. 24, 2011 Office Action issued in Chinese Patent Application No. 200910173717.5 (with English Translation).
Feb. 24, 2011 Office Action issued in Chinese Patent Application No. 201010128876.6 (with English Translation).
Feb. 28, 2011 Office Action issued in Korean Patent Application No. 10-2010-7008441 (with English Translation).
Mar. 8, 2011 Office Action issued in Chinese Patent Application No. 200910173716.0 (with English Translation).
Mar. 23, 2011 Office Action issued in Chinese Patent Application No. 200910173718.X (with English Translation).
Mar. 29, 2011 Office Action issued in Japanese Patent Application No. P2007-251263 (with English Translation).
Mar. 29, 2011 Notice of Allowance issued in Japanese Patent Application No. 2005-505207 (with English Translation).
Apr. 5, 2011 Office Action issued in Japanese Patent Application No. P2009-149426 (with English Translation).
Apr. 6, 2011 Office Action issued in Taiwanese Patent Application No. 093131323 (with English Translation).
Apr. 8, 2011 Office Action issued in Chinese Patent Application No. 200810211496.01 (with English Translation).
Apr. 15, 2011 Office Action issued in European Patent Application No. 04 817 303.3.
Apr. 26, 2011 Office Action issued in Chinese Patent Application No. 200710110951.4 (with English Translation).
Apr. 26, 2011 Office Action issued in U.S. Appl. No. 11/902,282.
May 24, 2011 Office Action issued in U.S. Appl. No. 12/382,277.
May 3, 2011 International Search Report Issued in PCT/JP2011/053595.
Apr. 20, 2011 Office Action issued in Chinese Patent Application No. 200710110949.7 (with English Translation).
Apr. 25, 2011 Office Action issued in Korean Patent Application No. 10-2011-7001502 (with English Translation).
Jun. 9, 2011 Office Action issued in U.S. Appl. No. 11/902,277.
Jun. 10, 2011 Office Action issued in U.S. Appl. No. 12/289,515.
Apr. 25, 2011 Office Action issued in Korean Patent Application No. 10-2010-7008438 (with English Translation).
Apr. 26, 2011 Office Action issued in Chinese Patent Application No. 200710110950.X (with English Translation).
Apr. 28, 2011 Office Action issued in Korean Patent Application No. 10-2010-7001898 (with English Translation).
Apr. 28, 2011 Office Action issued in Korean Patent Application No. 10-2006-7012265 (with English Translation).
Apr. 28, 2011 Office Action issued in Korean Patent Application No. 10-2010-7001907 (with English Translation).
May 11, 2011 Office Action issued in European Patent Application No. 04724369.6.
May 18, 2011 International Search Report issued in PCT/JP2011/053588.
Apr. 28, 2011 Office Action issued in Korean Patent Application No. 10-2009-7023904 (with English Translation).
Jun. 14, 2011 Office Action issued in Korean Patent Application No. 2011-7006842 (with English Translation).
Jun. 15, 2011 Notice of Allowance issued in U.S. Appl. No. 12/289,518.
Jul. 1, 2013 Preparatory Document (1), Patent Invalidation Action 2013HEO3937 submitted in Korean Patent Application No. 10-2006-7008368 (with translation).
Definition of Technical Terms (with translation).
Doosan Encyclopedia, "Optic Axis" (with translation).
Bass, "Handbook of Optics", 1995, pp. 1-9, McGraw-Hill.
Buhrer, "Four Waveplate Dual Tuner for Birefringent Filters and Multiplexers," Applied Optics, Sep. 1, 1987, pp. 3628-3632, vol. 26, No. 17, Optical Society of America.
Niziev et al., "Influence of Beam Polarization on Laser Cutting Efficiency," Journal of Physics D Applied Physics 32, 1999, pp. 1455-1461.
Bagini et al., "The Simon-Mukunda Polarization Gadget," European Journal of Physics, 1996, pp. 279-284, vol. 17, IOP Publishing Ltd and The European Physical Society.
McGuire, Jr. et al., "Analysis of Spatial Pseudodepolarizers in Imaging Systems," Optical Engineering, 1990, pp. 1478-1484, vol. 29, No. 12, Society of Photo-Optical Instrumentation Engineers.
Jul. 1, 2013 Preparatory Document (1), Patent Invalidation Action 2013HEO3920 submitted in Korean Patent Application No. 10-2007-7022489 (with translation).
Jul. 1, 2013 Preparatory Document (1), Patent Invalidation Action 2013HEO3944 submitted in Korean Patent Application No. 10-2008-7019081 (with translation).
Jul. 1, 2013 Preparatory Document (1), Patent Invalidation Action 2013HEO3951 submitted in Korean Patent Application No. 10-2008-7019082 (with translation).
Oct. 10, 2013 Office Action issued in U.S. Appl. No. 13/890,547.
Oct. 15, 2013 Office Action issued in U.S. Appl. No. 13/889,965.
Oct. 15, 2013 Office Action issued in U.S. Appl. No. 13/137,342.
Oct. 16, 2013 Office Action issued in U.S. Appl. No. 13/137,003.

(56) References Cited

OTHER PUBLICATIONS

Oct. 17, 2013 Notice of Allowance issued in Korean Patent Application No. 2012-7008342 (with English translation).
Oct. 21, 2013 Office Action issued in U.S. Appl. No. 13/137,002.
Oct. 29, 2013 Office Action issued in U.S. Appl. No. 13/890,142.
Oct. 17, 2013Notice of Allowance issued in U.S. Appl. No. 11/902,277.
Oct. 18, 2013 Office Action issued in U.S. Appl. No. 11/902,282.
Oct. 29, 2013 Office Action issued in U.S. Appl. No. 13/890,547.
Nov. 5, 2013 Office Action issued in Japanese Patent Application No. P2012-080675 (with English translation).
Nov. 5, 2013 Office Action issued in Japanese Patent Application No. P2012-080678 (with English translation).
Nov. 7, 2013 Office Action issued in U.S. Appl. No. 12/289,518.
Nov. 8, 2013 Office Action issued in U.S. Appl. No. 13/912,832.
Nov. 12, 2013 Office Action issued in U.S. Appl. No. 13/889,860.
Nov. 13, 2013 Office Action issued in U.S. Appl. No. 13/889,965.
Nov. 20, 2013 Office Action issued in U.S. Appl. No. 12/289,515.
Oh, "Notarial Certificate of affiant Professor H.G. Oh," Oct. 22, 2013 (with English translation).
Totzeck, "Declaration of Dr. Michael Totzeck," Oct. 8, 2013 (with English translation).
"Korean Patent Office Guidelines for Examination" 2010 (with English translation).
Oct. 25, 2013 Preparatory Document (2-1), Invalidation Action 2013HEO03937 submitted in Korean Patent Application No. 10-2006-7008368 (with English translation).
Oct. 25, 2013 Preparatory Document (2-2), Invalidation Action 2013HEO03937 submitted in Korean Patent Application No. 10-2006-7008368 (with English translation).
Mar. 14, 2014 Office Action issued in U.S. Appl. No. 13/889,798.
Dec. 4, 2013 Office Action issued in Chinese Patent Application No. 200710110950.X (with English translation).
Dec. 17, 2013 Office Action issued in Korean Patent Application No. 10-2013-7026632 (with English translation).
Dec. 18, 2013 Office Action issued in Korean Patent Application No. 10-2012-7034127 (with English translation).
Jul. 22, 2013 Notice of Allowance issued in U.S. Appl. No. 12/289,515.
Aug. 1, 2013 Office Action issued in U.S. Appl. No. 12/318,216.
Aug. 6, 2013 Office Action issued in U.S. Appl. No. 13/889,798.
Jun. 4, 2013 Chinese Office Action issued in Chinese Application No. 200710110950.X (with English translation).
Jul. 15, 2013 Chinese Office Action issued in Chinese Application No. 200910173718.X (with English translation).
Jul. 15, 2013 Notice of Allowance issued in U.S. Appl. No. 13/067,958.
Jul. 23, 2013 Office Action issued in U.S. Appl. No. 12/458,635.
Jul. 23, 2013 Office Action issued in U.S. Appl. No. 11/410,952.
Jan. 23, 2014 "Submission Document for Korean Patent Invalidation Action No. 2013HEO3920" issued in Korean Patent Application No. 10-2007-7022489 (with English translation).
Jan. 23, 2014 "Submission Document for Korean Patent Invalidation Action No. 2013HEO3937" issued in Korean Patent Application No. 10-2006-7008368 (with English translation).
Jan. 23, 2014 "Submission Document for Korean Patent Invalidation Action No. 2013HEO3944" issued in Korean Patent Application No. 10-2008-7019081 (with English translation).
Jan. 23, 2014 "Submission Document for Korean Patent Invalidation Action No. 2013HEO3951" issued in Korean Patent Application No. 10-2008-7019082 (with English translation).
Jan. 23, 2014 "Submission Document for Korean Patent Invalidation Action No. 2013HEO3975" issued in Korean Patent Application No. 10-2007-7022489 (with English translation).
Jan. 23, 2014 "Submission Document for Korean Patent Invalidation Action No. 2013HEO3982" issued in Korean Patent Application No. 10-2008-7019081 (with English translation).
The Second Division of Korean Patent Court, "Preparatory Document (3), Re: Patent Invalidation Action 2013HEO3920, Plaintiff: Carl Zeiss SMT GmbH, Defendant: Nikon Corporation", Dec. 13, 2013.
The Second Division of Korean Patent Court, "Preparatory Document (2), Re: Patent Invalidation Action 2013HEO3920, Plaintiff: Carl Zeiss SMT GmbH, Defendant: Nikon Corporation", Oct. 30, 2013.
The Second Division of Korean Patent Court, "Preparatory Document (3), Re: Patent Invalidation Action 2013HEO3937, Plaintiff: Carl Zeiss SMT GmbH, Defendant: Nikon Corporation", Dec. 13, 2013.
The Second Division of Korean Patent Court, "Preparatory Document (3), Re: Patent Invalidation Action 2013HEO3944, Plaintiff: Carl Zeiss SMT GmbH, Defendant: Nikon Corporation", Dec. 13, 2013.
The Second Division of Korean Patent Court, "Preparatory Document (2), Re: Patent Invalidation Action 2013HEO3944, Plaintiff: Carl Zeiss SMT GmbH, Defendant: Nikon Corporation", Oct. 30, 2013.
The Second Division of Korean Patent Court, "Preparatory Document (3), Re: Patent Invalidation Action 2013HEO3951, Plaintiff: Carl Zeiss SMT GmbH, Defendant: Nikon Corporation", Dec. 13, 2013.
The Second Division of Korean Patent Court, "Preparatory Document (2), Re: Patent Invalidation Action 2013HEO3951, Plaintiff: Carl Zeiss SMT GmbH, Defendant: Nikon Corporation", Oct. 30, 2013.
The Second Division of Korean Patent Court, "Reference Document, Re: Patent Invalidation Action 2013HEO3975, Plaintiff: Nikon Corporation, Defendant: Carl Zeiss SMT GmbH", Jan. 14, 2014.
Feb. 2, 2015 Office Action issued in U.S. Appl. No. 13/912,832.
Feb. 5, 2015 Office Action issued in U.S. Appl. No. 12/289,515.
Feb. 10, 2015 Office Action issued in Korean Patent Application No. 10-2014-7003559.
Feb. 11, 2015 Office Action issued in Korean Patent Application No. 10-2010-7008441.
Translation of Apr. 2, 2013 Office Action issued in Japanese Patent Application No. P2010-286303.
Apr. 9, 2013 Office Action issued in Korean Patent Application No. 2012-7008342 (with translation).
Apr. 17, 2013 Office Action issued in Korean Patent Application No. 10-2013-7002721 (with translation).
Apr. 3, 2013 Office Action issued in Chinese Patent Application No. 200910173717.5 (with translation).
May 7, 2013 Office Action issued in European Patent Application No. 04817303.3.
Apr. 3, 2013 Office Action issued in Chinese Patent Application No. 200910173716.0 (with translation).
Apr. 18, 2013 Office Action issued in Korean Patent Application No. 10-2012-7003793 (with translation).
May 2, 2013 Office Action issued in Taiwanese Patent Application No. 101102214 (with translation).
May 14, 2013 Office Action issued in Japanese Patent Application No. P2011-130545 (with translation).
Apr. 23, 2013 Office Action issued in Chinese Patent Application No. 201010128876.6 (with translation).
May 16, 2013 Office Action issued in Taiwanese Patent Application No. 098115513 (with translation).
Jun. 13, 2013 Search Report issued in European Patent Application No. 13156325.6.
May 29, 2013 Office Action issued in European Patent Application No. 04799453.8.
May 15, 2014 Decision Rendered by Division II of Korean Patent Court for Korean Patent invalidation Action No. 2013HEO3920 (with English translation).
May 15, 2014 Decision Rendered by Division II of Korean Patent Court for Korean Patent invalidation Action No. 2013HEO3937 (with English translation).
May 15, 2014 Decision Rendered by Division II of Korean Patent Court for Korean Patent invalidation Action No. 2013HEO3944 (with English translation).

(56) References Cited

OTHER PUBLICATIONS

May 15, 2014 Decision Rendered by Division II of Korean Patent Court for Korean Patent invalidation Action No. 2013HEO3951 (with English translation).
May 15, 2014 Decision Rendered by Division II of Korean Patent Court for Korean Patent invalidation Action No. 2013HEO3975 (with English translation).
May 15, 2014 Decision Rendered by Division II of Korean Patent Court for Korean Patent invalidation Action No. 2013HEO3982 (with English translation).
Jun. 3, 2014 Office Action issued in Japanese Patent Application No. 2013-157042 (with translation).
Jun. 3, 2014 Office Action issued in Japanese Patent Application No. 2013-157044 (with translation).
Feb. 13, 2014 Office Action issued in Chinese Patent Application No. 200910126047.1 (with translation.
Jun. 6, 2014 Office Action issued in Taiwanese Patent Application No. 101103772 (with translation).
Jun. 13, 2014 Office Action issued in Taiwanese Patent Application No. 101133189 (with translation).
Jun. 13, 2014 Office Action issued in Taiwanese Patent Application No. 101141665 (with translation).
Aug. 11, 2014 Office Action issued in Taiwanese Patent Application No. 101102214 (with translation).
Aug. 6, 2014 Office Action issued in U.S. Appl. No. 13/889,965.
Jun. 24, 2014 Office Action issued in European Patent Application No. 04 817 303.3.
Jun. 26, 2014 Search Report issued in European Patent Application No. 13 165 334.7.
Jun. 26, 2014 Search Report issued in European Patent Application No. 13 165 335.4.
Jun. 26, 2014 Search Report issued in European Patent Application No. 13 165 338.8.
Jun. 26, 2014 Search Report issued in European Patent Application No. 13 165 340.4.
Jul. 16, 2014 Office Action issued in U.S. Appl. No. 12/289,515.
Jun. 25, 2014 Office Action issued in U.S. Appl. No. 13/889,860.
Jun. 27, 2014 Office Action issued in U.S. Appl. No. 13/912,832.
Aug. 23, 2013 Reply Brief, Patent Invalidation Action 2013HEO3975 submitted in Korean Patent Application 10-2007-7022489 (with English translation).
Aug. 23, 2013 Reply Brief, Patent Invalidation Action 2013HEO3982 submitted in Korean Patent Application No. 10-2008-7019081 (with English translation).
Aug. 28, 2014 Office Action issued in Korean Patent Application No. 10-2012-7034128 (with translation).
Aug. 6, 2014 Office Action issued in U.S. Appl. No. 13/137,342.
Aug. 6, 2014 Office Action issued in U.S. Appl. No. 13/137,003.
Aug. 6, 2014 Office Action issued in U.S. Appl. No. 13/137,002.
Sep. 10, 2014 Office Action issued in U.S. Appl. No. 13/890,547.
Sep. 11, 2014 Office Action issued in U.S. Appl. No. 12/382,277.
Sep. 12, 2014 Office Action issued in U.S. Appl. No. 13/890,142.
Oct. 21, 2014 Office Action issued in Japanese Patent Application No. P2013-272100, with translation.
Nov. 5, 2014 Office Action issued in Chinese Patent Application No. 200910126047.1, with translation.
Dec. 2, 2014 Office Action issued in Japanese Patent Application No. 2013-272068, with translation.
Jan. 6, 2014 Office Action issued in Chinese Application No. 200910173717.5.
Jan. 29, 2015 Office Action issued in U.S. Appl. No. 13/889,860.
Apr. 4, 2014 Office Action issued in Chinese Patent Application No. 200910173718.X (with translation).
Apr. 29, 2014 Office Action issued in European Patent Application No. 13156325.6.
Apr. 29, 2014 Office Action issued in European Patent Application No. 13156324.9.
Apr. 29, 2014 Office Action issued in European Patent Application No. 13156322.3.
Apr. 23, 2014 Submission Document for Korean Patent Invalidation Action No. 2013HEO3920 (with English translation).
Apr. 23, 2014 Submission Document for Korean Patent Invalidation Action No. 2013HEO3937 (with English translation).
Apr. 23, 2014 Submission Document for Korean Patent Invalidation Action No. 2013HEO3944 (with English translation).
Apr. 23, 2014 Submission Document for Korean Patent Invalidation Action No. 2013HEO3951 (with English translation).
Apr. 23, 2014 Submission Document for Korean Patent Invalidation Action No. 2013HEO3975 (with English translation).
Apr. 23, 2014 Submission Document for Korean Patent Invalidation Action No. 2013HEO3982 (with English translation).
Apr. 16, 2014 Office Action issued in U.S. Appl. No. 12/458,635.
Feb. 5, 2014 Office Action issued in U.S. Appl. No. 12/382,277.
Feb. 6, 2014 Office Action issued in U.S. Appl. No. 13/890,142.
Feb. 6, 2014 Office Action issued in U.S. Appl. No. 13/890,547.
Dec. 10, 2014 Office Action issued in U.S. Appl. No. 12/289,518.
Dec. 13, 2013 Office Action issued in European Patent Application No. 09015058.2.
Mar. 24, 2015 Office Action issued in Japanese Patent Application No. P2014-087750.
Apr. 6, 2015 Office Action issued in U.S. Appl. No. 14/048,563.
Apr. 21, 2015 Office Action issued in U.S. Appl. No. 13/890,547.
Apr. 24, 2015 Office Action issued in U.S. Appl. No. 13/890,142.
Apr. 27, 2015 Office Action issued in Korean Patent Application No. 10-2014-7009172.
Jun. 23, 2015 Office Action issued in Japanese Application No. 2014-158994.
Jul. 20, 2015 Corrected Notice of Allowability issued in U.S. Appl. No. 13/067, 958.
Jul. 15, 2015 Office Action issued in U.S. Appl. No. 12/289,515.
Jul. 16, 2015 Office Action issued in U.S. Appl. No. 13/912,832.
Jul. 16, 2015 Office Action issued in U.S. Appl. No. 13/889,860.
Aug. 4, 2015 Office Action issued in Japanese Application No. 2014-197119.
Aug. 4, 2015 Office Action issued in Japanese Application No. 2014-216961.
Aug. 4, 2015 Office Action issued in Japanese Application No. 2014-216964.

* cited by examiner

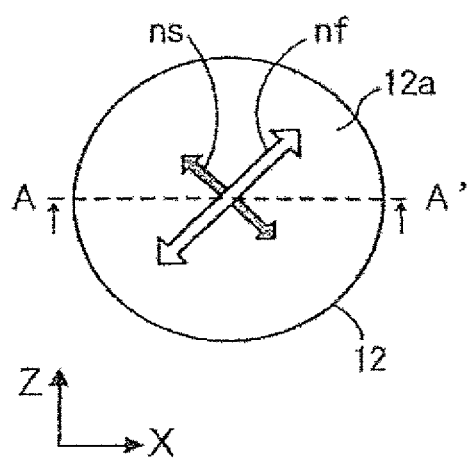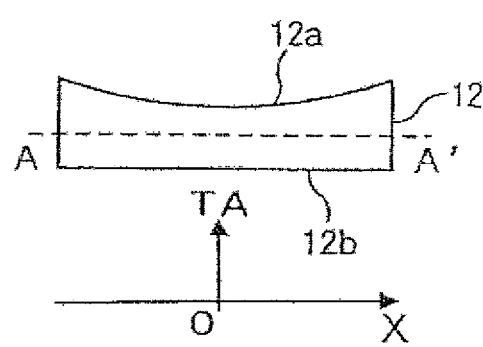

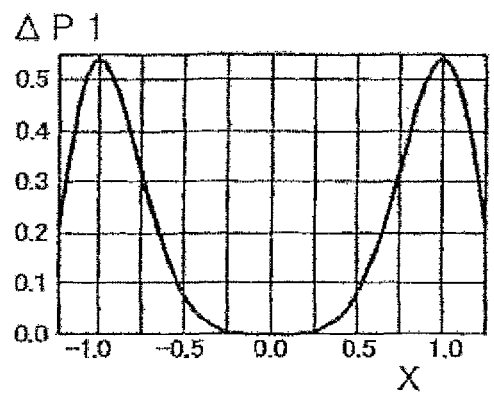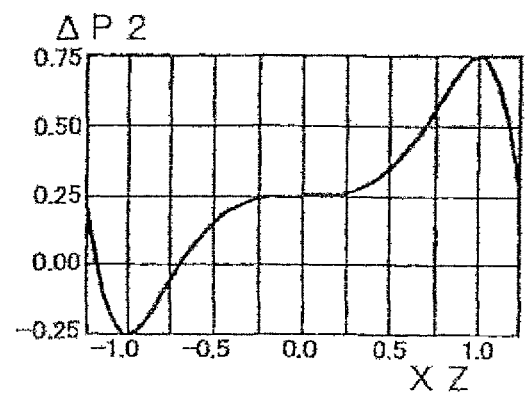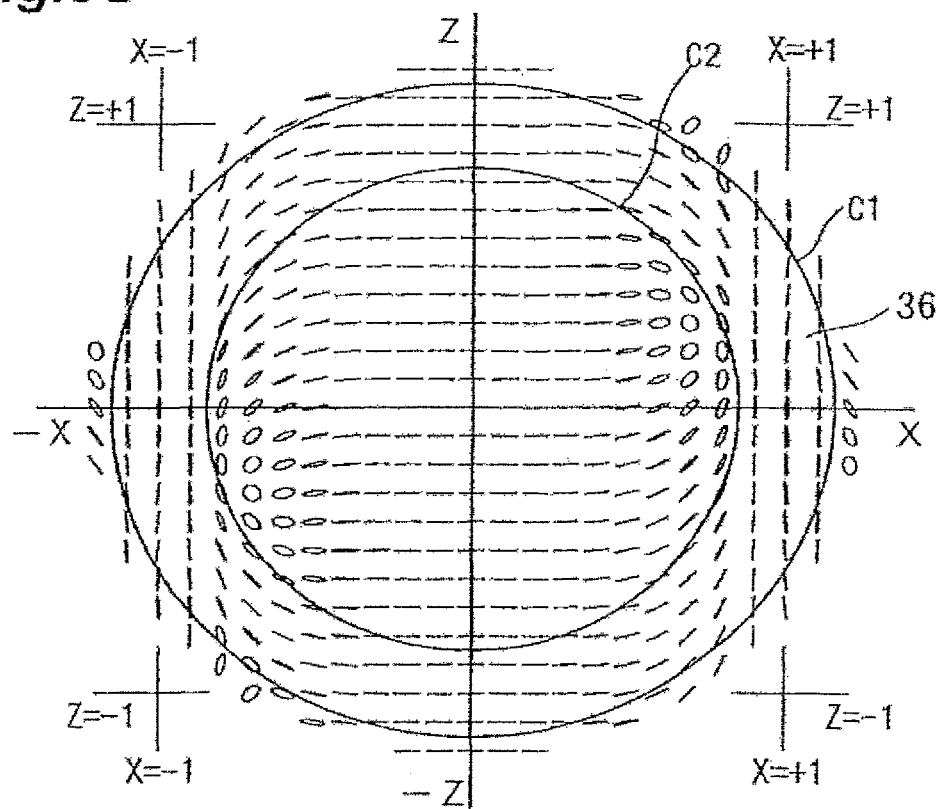

ILLUMINATION OPTICAL APPARATUS AND PROJECTION EXPOSURE APPARATUS

CROSS-REFERENCE TO RELATED APPLICATIONS

This is a continuation application of U.S. application Ser. No. 11/410,952, filed Apr. 26, 2006, which is a Continuation-in-part of PCT/JP2004/015853 filed Oct. 26, 2004. This application claims the benefit of Japanese Patent Application No. 2003-367963, filed Oct. 28, 2003. The entire disclosures of the prior applications are hereby incorporated by reference herein in their entirety.

BACKGROUND OF THE INVENTION

1. Field of the Invention

The present invention relates to illumination technology and exposure technology used in the lithography step for fabricating various devices, e.g., semiconductor integrated circuits (LSI and the like), image pickup devices, or liquid crystal displays and, more particularly, to illumination technology and exposure technology for illuminating a mask pattern with light in a predetermined polarization state. Furthermore, the present invention relates to device fabrication technology using the exposure technology.

2. Related Background Art

For foaming microscopic patterns of electronic devices such as semiconductor integrated circuits or liquid crystal displays, a method adopted is to project a demagnified image of a pattern on a reticle (or a photomask or the like) as a mask on which the pattern to be formed is drawn at a proportional magnification of about 4-5 times, through a projection optical system onto a wafer (or glass plate or the like) as a substrate to be exposed (photosensitive body) to effect exposure and transfer of the image. Projection exposure apparatus used for the exposure and transfer include those of a stationary exposure type such as steppers, and those of a scanning exposure type such as scanning steppers. The resolution of the projection optical system is proportional to a value obtained by dividing an exposure wavelength by a numerical aperture (NA) of the projection optical system. The numerical aperture (NA) of the projection optical system is given by multiplying a sine (sin) of a maximum angle of incidence of illumination light for exposure onto the wafer, by a refractive index of a medium through which the light passes.

Therefore, in order to meet the demand for miniaturization of the semiconductor integrated circuits and others, the exposure wavelength of the projection exposure apparatus has been decreased toward shorter wavelengths. The mainstream exposure wavelength at present is 248 nm of KrF excimer laser, and the shorter wavelength of 193 nm of ArF excimer laser is also close to practical use. There are also proposals on the projection exposure apparatus using exposure light sources in the so-called vacuum ultraviolet region such as the $F_2$ laser with the much shorter wavelength of 157 nm and the $Ar_2$ laser with the wavelength of 126 nm. Since it is also possible to achieve a higher resolution by a larger numerical aperture (larger NA) of the projection optical system instead of the use of shorter wavelength, there are also attempts to develop the projection optical system with a much larger NA, and the leading NA of the projection optical system at present is approximately 0.8.

On the other hand, there are also practically available techniques to enhance the resolution of the pattern to be transferred, even with use of the same exposure wavelength and the projection optical system with the same NA, so called super resolution techniques, such as a method using a so-called phase shift reticle, and annular illumination, dipole illumination, and quadrupole illumination to control angles of incidence of the illumination light onto the reticle in a predetermined distribution.

Among those, the annular illumination is to limit the incidence angle range of illumination light onto the reticle to predetermined angles, i.e., to limit the distribution of illumination light on the pupil plane of the illumination optical system to within a predetermined annular region centered on the optical axis of the illumination optical system, thereby offering the effect of improvement in the resolution and depth of focus (e.g., reference is made to Japanese Patent Application Laid-Open No. 61-91662). On the other hand, the dipole illumination and quadrupole illumination are applied to cases where the pattern on the reticle is one with specific directionality, and are arranged to limit, as well as the incidence angle range, the direction of incidence of the illumination light to a direction suitable for the directionality of the pattern, thereby achieving great improvement in the resolution and depth of focus (e.g., reference is made to Japanese Patent Application Laid-Open No. 4-101148 or U.S. Pat. No. 6,233,041 equivalent thereto and to Japanese Patent Application Laid-Open No. 4-225357 or U.S. Pat. No. 6,211,944 equivalent thereto).

There are other proposals of attempts to optimize the polarization state of the illumination light relative to the direction of the pattern on the reticle, thereby achieving improvement in the resolution and depth of focus. This method is to convert the illumination light into linearly polarized light with the polarization direction (direction of the electric field) along a direction orthogonal to the periodic direction of the pattern, i.e., along a direction parallel to the longitudinal direction of the pattern, thereby achieving improvement in contrast and others of the transferred image (e.g., Japanese Patent Application Laid-Open No. 5-109601 and Thimothy A. Brunner, et al.: "High NA Lithographic imaging at Brewster's angle," SPIE (USA) Vol. 4691, pp. 1-24 (2002).

Concerning the annular illumination, there are also proposals of attempts to match the polarization direction of the illumination light in an annular region in which the illumination light is distributed on the pupil plane of the illumination optical system, with the circumferential direction of the annular region, thereby achieving improvement in the resolution, contrast, etc. of the projected image.

In effecting the annular illumination by the conventional technology as described above, there was the problem of large loss in quantity of the illumination light to lower illumination efficiency if the polarization state of the illumination light was made to be linear polarization substantially matched with the circumferential direction of the annular region on the pupil plane of the illumination optical system.

Specifically, the illumination light emitted from the recently mainstream narrow-band KrF excimer laser source is uniform, linearly polarized light. If the light is kept in that polarization state and guided to the reticle, the reticle will be illuminated with the uniform, linearly polarized light, and it is thus needless to mention that it is infeasible to obtain the linearly polarized light with the polarization direction matched with the circumferential direction of the annular region on the pupil plane of the illumination optical system as described above.

Therefore, in order to realize the aforementioned polarization state, it was necessary to adopt, for example, a method of converting the linearly polarized light emitted from the light source, once into randomly polarized light and thereafter, in each part of the annular region, selecting a desired polarization component from the illumination light of random polarization, using a polarization selecting element such as a polarization filter or a polarization beam splitter. This method used only energy in the predetermined linear polarization component out of the energy of the illumination light of random polarization, i.e., only approximately half energy as the illumination light onto the reticle, and thus posed the problem of large loss in quantity of the illumination light and large loss in exposure power on the wafer in turn, resulting in reduction in processing performance (throughput) of the exposure apparatus.

Similarly, in application of multipole illumination such as the dipole illumination or quadrupole illumination, there was also the problem of reduction in illumination efficiency if the polarization of the illumination light in each dipole or quadrupole region was attempted to be set in a predetermined state on the pupil plane of the illumination optical system.

SUMMARY OF THE INVENTION

Reference symbols in parentheses attached to respective elements of the present invention below correspond to configurations of embodiments of the present invention described later. It is, however, noted that each reference symbol is only an example of an element corresponding thereto and is by no means intended to limit each element to the configurations of the embodiments.

A first aspect of the present embodiment is to provide a projection exposure apparatus for projecting a pattern image on a first object on a second object, the projection exposure apparatus comprising: a projection optical system for projecting the image of pattern on the first object on the second object; and an illumination optical system for illuminating a first object with illumination light from a light source, and comprising at least two birefringent members arranged along a traveling direction of the illumination light, wherein a direction of a fast axis of at least one birefringent member out of the birefringent members is different from a direction of a fast axis of the other birefringent member, and wherein a specific illumination beam incident in a specific incidence angle range to the first object among the illumination light generated in a substantially single polarization state from the light source is light in a polarization state consisting primarily of S-polarization.

A second aspect of the present embodiment is to provide a projection exposure apparatus for projecting an image of a pattern on a first object onto a second object, comprising: a projection optical system for projecting the image of the pattern on the first object onto the second object; and an illumination optical system for illuminating the first object with light supplied from an outside light source, the illumination optical system comprising a diffractive optical element and a birefringent member arranged in order along a traveling direction of the light.

A third aspect of the present embodiment is to provide an illumination optical apparatus for illuminating a first object with illumination light from a light source, comprising: at least two birefringent members arranged along a traveling direction of the illumination light, wherein a direction of a fast axis of at least one birefringent member out of the birefringent members is different from a direction of a fast axis of the other birefringent member, and wherein a specific illumination beam incident in a specific incidence angle range onto the first object among the illumination light in a substantially single polarization state supplied from the light source is light in a polarization state consisting primarily of S-polarization.

A fourth aspect of the present invention is to provide an illumination optical apparatus for illuminating a first object with illumination light from a light source, comprising: a diffractive optical element and a birefringent member arranged in order along a traveling direction of the illumination light.

A fifth aspect of the embodiments is to provide an exposure method using the above projection exposure apparatus according to the above embodiments.

A sixth aspect of the embodiments is to provide a method of making a device using the exposure method according to the above embodiments.

According to the present embodiments, for example, thicknesses of the birefringent members are set in their respective predetermined distributions, whereby the polarization after passage of the illumination light emitted from the light source, through the plurality of birefringent members, can be, for example, in a state consisting primarily of polarization in the circumferential direction around the optical axis in an annular region centered around the optical axis. An exit surface of the birefringent members is located, for example, at a position near the pupil plane of the illumination optical system, whereby the first object is illuminated with the illumination light (specific illumination beam) having passed through the annular region and kept in the predetermined polarization state consisting primarily of S-polarization, with little loss in quantity of light.

In this case, the apparatus may comprise a beam limiting member (9a, 9b) for limiting the illumination light incident to the first object, to the specific illumination beam. This makes the first object illuminated under the condition of almost annular illumination. When in this annular illumination the illumination light is almost S-polarization on the first object, a projected image of a line-and-space pattern arranged at a fine pitch in an arbitrary direction on the first object is formed mainly by the illumination light with the polarization direction parallel to the longitudinal direction of the line pattern and, therefore, improvement is made in imaging characteristics such as the contrast, resolution, and depth of focus.

The beam limiting member may be configured to further limit the direction of incidence of the illumination light incident to the first object, to a plurality of specific, substantially discrete directions. Since this implements illumination such as the dipole illumination or quadrupole illumination, improvement is made in imaging characteristics of a line-and-space pattern arranged at a fine pitch in a predetermined direction.

The present invention will be more fully understood from the detailed description given hereinbelow and the accompanying drawings, which are given by way of illustration only and are not to be considered as limiting the embodiment.

Further scope of applicability of the embodiment will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 2A is a view of birefringent member 12 in FIG. 1, viewed to +Y direction,

FIG. 2B a sectional view along line AA' in FIG. 2A.

FIG. 6A is a diagram showing another example of relationship between polarization phase difference ΔP1 and position X in the first birefringent member 12.

FIG. 6B a diagram showing another example of relationship between polarization phase difference ΔP2 and position XZ in the second birefringent member 13.

FIG. 6C a drawing showing another example of polarization states of illumination light emerging from the second birefringent member 13.

DETAILED DESCRIPTION OF THE PREFERRED EMBODIMENTS

An example of preferred embodiment of the present invention will be described below with reference to the drawings. The present example is an application of the present invention to a case where exposure is performed by a projection exposure apparatus of the scanning exposure type (scanning stepper) according to the step-and-scan method.

Figure 1:
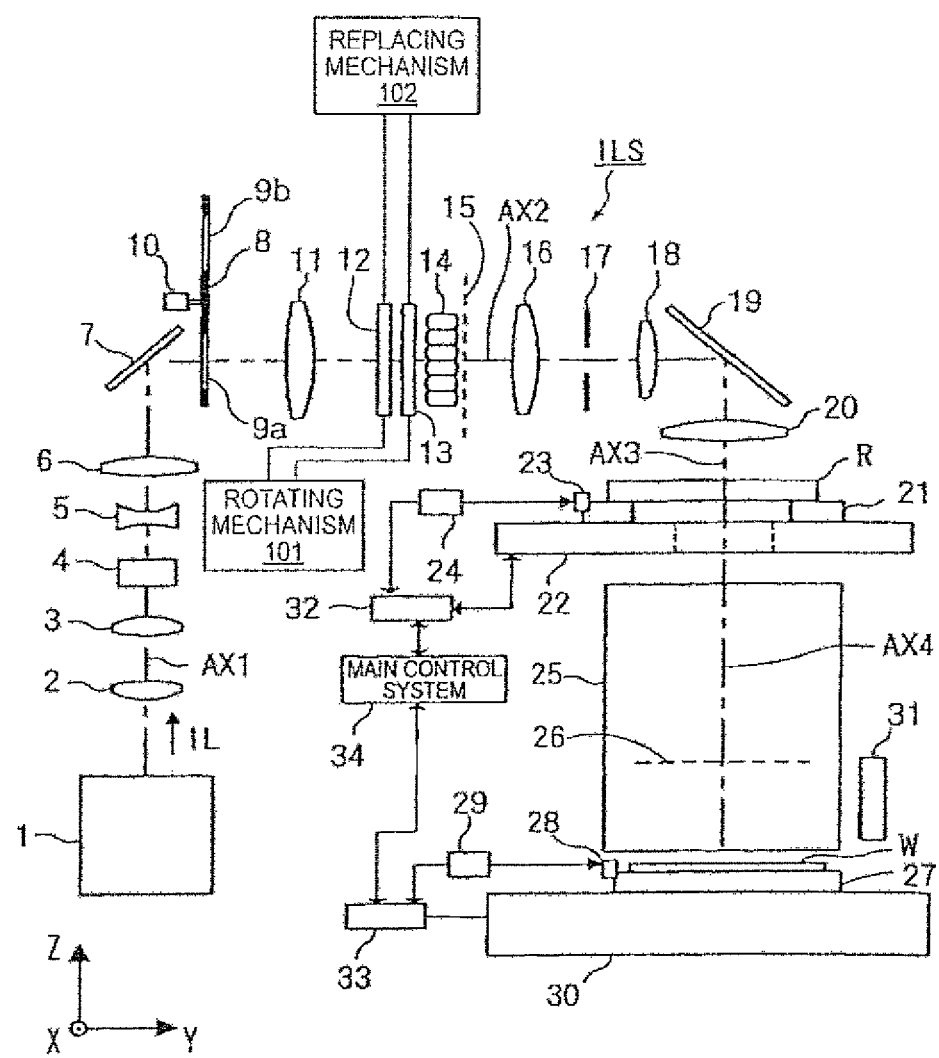
FIG. 1 is a drawing showing a schematic configuration of a projection exposure apparatus, partly cut, as an example of an embodied form of the present invention.

FIG. 1 is a drawing showing a schematic configuration of the projection exposure apparatus of the present example partly cut, and in this FIG. 1 the projection exposure apparatus of the present example is provided with an illumination optical system ILS and a projection optical system 25. The former illumination optical system ILS is provided with a plurality of optical members arranged along the optical axis (optical axis of illumination system) AX1, AX2, AX3 from an exposure light source 1 (light source) to a condenser lens 20 (the details of which will be described later), and illuminates an illumination field on a pattern surface (reticle surface) of reticle R as a mask under a uniform illuminance distribution with illumination light for exposure (exposure light) IL as an exposure beam from the exposure light source 1. The latter projection optical system 25 projects a demagnified image at a projection magnification M (where M is a demagnification rate, e.g., 1/4 or 1/5) of a pattern in the illumination field on the reticle R, under the illumination light into an exposure region on one shot area on a wafer W coated with a photoresist, as a substrate to be exposed (substrate) or as a photosensitive body. The reticle R and wafer W can also be regarded as a first object and as a second object, respectively. The wafer W is, for example, a substrate of disk shape with the radius of about 200-300 mm of a semiconductor (silicon or the like) or SOI (silicon on insulator) or the like. The projection optical system 25 of the present example is, for example, a dioptric system, but can also be a catadioptric system or the like.

In the description hereinafter, a coordinate system as to the projection optical system 25, reticle R, and wafer W is defined as follows in FIG. 1: the Z-axis is taken in parallel with the optical axis AX4 of the projection optical system 25, the Y-axis along the scanning direction of reticle R and wafer W (direction parallel to the plane of FIG. 1) during scanning exposure in the plane (XY plane) perpendicular to the Z-axis, and the X-axis along the non-scanning direction (direction normal to the plane of FIG. 1). In this case, the illumination field on the reticle R is a region elongated in the X-direction being the non-scanning direction, and an exposure region on the wafer W is an elongated region conjugate with the illumination field. The optical axis AX4 of the projection optical system 25 agrees with the optical axis of illumination system AX3 on the reticle R.

First, the reticle R on which a pattern to be transferred by exposure is formed, is stuck and held on a reticle stage 21, and the reticle stage 21 moves at a constant speed in the Y-direction on a reticle base 22 and finely moves in the X-direction, in the Y-direction, and in the rotational direction about the Z-axis so as to compensate for a synchronization error, to effect scanning of reticle R. The X-directional and Y-directional positions and the angle of rotation of the reticle stage 21 are measured by means of moving mirror 23 provided thereon, and laser interferometer 24. Based on measurements of the laser interferometer and control information from main control system 34, a reticle stage driving system 32 controls the position and speed of reticle stage 21 through a driving mechanism (not shown) such as a linear motor. A reticle alignment microscope (not shown) for reticle alignment is disposed above the marginal region of the reticle R.

On the other hand, the wafer W is stuck and held through a wafer holder (not shown) on a wafer stage 27, and the wafer stage 27 is mounted on a wafer base 30 so that it can move at a constant speed in the Y-direction and achieve step movement in the X-direction and in the Y-direction. The wafer stage 27 is also provided with a Z-leveling mechanism for aligning the surface of wafer W with the image plane of the projection optical system 25, based on measurements of an unrepresented autofocus sensor. The X-directional and Y-directional positions and the angle of rotation of the wafer stage 27 are measured by means of moving mirror 28 provided thereon, and laser interferometer 29. Based on measurements of the laser interferometer and control information from main control system 34, a wafer stage driving system 33 controls the position and speed of the wafer stage 27 through a driving mechanism (not shown) such as a linear motor. For wafer alignment, an alignment sensor 31 of the off-axis method and, for example, the FIA (Field Image Alignment) method for detecting positions of marks for alignment on the wafer W is disposed in the vicinity of the projection optical system 25.

Prior to exposure by the projection exposure apparatus of the present example, alignment of the reticle R is carried out with the aforementioned reticle alignment microscope, and alignment of the wafer W is carried out by detecting the positions of the positioning marks formed along with a circuit pattern in a previous exposure step on the wafer W, by means of the alignment sensor 31. After that, the apparatus repeatedly carries out the operation of driving the reticle stage 21 and wafer stage 27 in a state in which the illumination light IL illuminates the illumination field on the reticle R, to synchronously scan the reticle R and one shot area on the wafer W in the Y-direction, and the operation of terminating emission of the illumination light IL and driving the wafer stage 27 to effect step movement of the wafer W in the X-direction and in the Y-direction. A ratio of scanning speeds of the reticle stage 21 and the wafer stage 27 during the synchronous scanning is equal to a projection magnification M of the projection optical system 25, in order to keep the imaging relation between the reticle R and the wafer W through the projection optical system 25. These operations result in effecting exposure to transfer the pattern image of the reticle R into all the shot areas on the wafer W by the step-and-scan method.

Next, a configuration of the illumination optical system ILS of the present example will be described in detail. In FIG. 1, an ArF (argon fluorine) excimer laser (wavelength 193 nm) is used as the exposure light source 1 of the present example. The exposure light source 1 can also be another laser light source, e.g., a KrF (krypton fluorine) excimer laser (wavelength 248 nm), an $F_2$ (fluorine molecule) laser (wavelength 157 nm), or a $Kr_2$ (krypton molecule) laser (wavelength 146 nm). These laser light sources (including the exposure light source 1) are narrow-band lasers or wavelength-selected lasers, and the illumination light IL emitted from the exposure light source 1 is in a polarization state consisting primarily of linear polarization because of the narrowing of band or wavelength selection. In the description hereinafter, it is assumed that in FIG. 1 the illumination light IL immediately after emitted from the exposure light source 1 consists primarily of linearly polarized light whose polarization direction (direction of the electric field) coincides with the X-direction in FIG. 1.

The illumination light IL emitted from the exposure light source 1 travels along the optical axis of illumination system AX1 and through relay lenses 2, 3 to enter a polarization controlling member 4 (detailed later) as a polarization controlling mechanism. The illumination light IL emerging from the polarization controlling member 4 travels through a zoom optical system (5, 6) consisting of a combination of a concave lens 5 and a convex lens 6, and is then reflected by a mirror 7 for bending of optical path to enter a Diffractive Optical Element (DOE) 9a along the optical axis of illumination system AX2. The diffractive optical element 9a is comprised of a phase type diffraction grating, and the illumination light IL incident thereto travels as diffracted into predetermined directions.

As described later, a diffraction angle and direction of each diffracted light from the diffractive optical element 9a as a beam limiting member correspond to a position of the illumination light IL on the pupil plane 15 of the illumination optical system ILS and to an angle and direction of incidence of the illumination light IL to the reticle R. A plurality of diffractive optical elements, including the diffractive optical element 9a and another diffractive optical element 9b with different diffraction action, are arranged on a member 8 of turret shape. The apparatus is constructed for example as follows: the member 8 is driven by a replacing mechanism 10 under control of the main control system 34 to load the diffractive optical element 9a or the like at an arbitrary position on the member 8 to the position on the optical axis of illumination system AX2, whereby the incidence angle range and direction of the illumination light to the reticle R (or the position of the illumination light on the pupil plane 15) can be set to a desired range in accordance with the pattern of the reticle R. The incidence angle range can also be finely adjusted supplementarily by moving each of the concave lens 5 and the convex lens 6 constituting the aforementioned zoom optical system (5, 6) in the direction of the optical axis of illumination system AX1.

The illumination light (diffracted light) IL emerging from the diffractive optical element 9a travels along the optical axis of illumination system AX2 and through relay lens 11 to successively enter the first birefringent member 12 and second birefringent member 13 being the plurality of birefringent members in the present invention. The details of these birefringent members will be described later. In the present embodiment, a fly's eye lens 14 being an optical integrator (illuminance uniforming member) is disposed behind the birefringent member 13. The illumination light IL emerging from the fly's eye lens 14 travels via relay lens 16, field stop 17, and condenser lens 18 to a mirror 19 for bending of optical path, and the illumination light IL reflected thereon then travels along the optical axis of illumination system AX3 and through condenser lens 20 to illuminate the reticle R. The pattern on the reticle R illuminated in this manner is projected and transferred onto the wafer W by the projection optical system 25 as described above.

It is also possible to construct the field stop 17 as a scanning type, if necessary, and to effect scanning thereof in synchronization with the scanning of the reticle stage 21 and wafer stage 27. In this case, the field stop may be constructed of separate components of a fixed field stop and a movable field stop.

In this configuration, the exit-side surface of the fly's eye lens 14 is located near the pupil plane 15 of the illumination optical system ILS. The pupil plane 15 acts as an optical Fourier transform plane with respect to the pattern surface (reticle surface) of the reticle R through the optical members (relay lens 16, field stop 17, condenser lenses 18, 20, and mirror 19) in the illumination optical system ILS from the pupil plane 15 to the reticle R. Namely, the illumination light emerging from a point on the pupil plane 15 is converted into an approximately parallel beam to illuminate the reticle R while being incident at a predetermined incidence angle and incidence direction. The incidence angle and incidence direction are determined according to the position of the beam on the pupil plane 15.

The path bending mirrors 7, 19 are not always indispensable in terms of optical performance, but if the illumination optical system ILS is arranged on a line the total height of the exposure apparatus (the height in the Z-direction) will increase; therefore, they are arranged at appropriate positions in the illumination optical system ILS for the purpose of space saving. The optical axis of illumination system AX1 coincides with the optical axis of illumination system AX2 through reflection on the mirror 7, and the optical axis of illumination system AX2 further coincides with the optical axis of illumination system AX3 through reflection on the mirror 19.

A first example of the first and second birefringent members 12, 13 in FIG. 1 will be described below with reference to FIGS. 2 to 5.

The first birefringent member 12 is a member of disk shape made of a birefringent material such as a uniaxial crystal, and the optical axis thereof is in its in-plane direction (direction parallel to the plane normal to the optical axis of illumination system AX2). The size (diameter) in the in-plane direction of the first birefringent member 12 is larger than the beam size of the illumination light IL at the position where the birefringent member 12 is located.

FIG. 2A is a view of the birefringent member 12 in FIG. 1 viewed to the +Y direction and along the optical axis of illumination system AX2 and in the birefringent member 12, as shown in FIG. 2A, the fast axis nf, which is an axial direction to minimize the refractive index for linearly polarized light with the polarization direction parallel thereto, is directed in a direction rotated by 45° from each coordinate axis (X-axis and Z-axis) in the XZ coordinate system with the same coordinate axes as in FIG. 1. Furthermore, the slow axis ns, which is an axial direction to maximize the refractive index for linearly polarized light with the polarization direction parallel thereto, is naturally orthogonal to the fast axis nf and is also directed in a direction rotated by 45° from both of the X-axis and Z-axis.

The thickness of the first birefringent member 12 is not uniform in a plane parallel to the plane of FIG. 2A, and varies according to X-coordinates (positions in the X-direction). FIG. 2B is a sectional view of the birefringent member 12 along line AA in FIG. 2A and, as shown in FIG. 2B, the birefringent member 12 has such a shape that it is thin at the center (the optical axis of illumination system) and thick in the marginal region in the X-direction. On the other hand, the thickness of the first birefringent member 12 is uniform in the Z-direction in FIG. 2A and thus the birefringent member 12 is of a shape like a negative cylinder lens as a whole.

A beam passing through such a birefringent member generally has a path difference (polarization phase difference) between a linear polarization component with the polarization direction (i.e., "vibrating direction of the electric field of light," which will also apply to the description hereinafter) coinciding with the direction of the fast axis nf, and a linear polarization component with the polarization direction coinciding with the direction of the slow axis ns. The refractive index of the birefringent member is low for linearly polarized light parallel to the fast axis nf, so that the traveling speed of the same polarized light is high. On the other hand, the refractive index of the birefringent member is high for linearly polarized light parallel to the slow axis ns, so that the traveling speed of the same polarized light is low. Therefore, there appears a path difference (polarization phase difference) between the two polarized beams. Therefore, the first birefringent member 12 functions as a first nonuniform wavelength plate in which the polarization phase difference given to transmitted light differs according to locations.

Incidentally, if the thickness of the first birefringent member 12 is optimized to make the path difference due to the birefringent member 12 equal to an integer multiple of a wavelength, the phases of the two beams cannot be substantially discriminated from each other, and a state substantially having no optical path difference can be realized. In the present example, the thickness T1 of the center part of the birefringent member 12 is set to such thickness. In the description hereinafter, as shown in FIG. 2B, the origin of the X-axis (X=0) is defined at the center of the birefringent member 12 (optical axis of illumination system).

On the other hand, the shape of the birefringent member 12 is so set that the polarization phase difference becomes 0.5 (in the unit of the wavelength of the illumination light) at positions of ±1 apart in the X-direction from the center of the first birefringent member 12 (where 1 represents a reference length and is located inside the outer diameter of the first birefringent member 12). For realizing such shape, the present example defines the thickness TA of the birefringent member 12 as the thickness represented by the following function, for the position X in the X-direction.

$$TA = T1 + \alpha(1.7X^4 - 0.7X^2) \quad (1)$$

In the above equation, $\alpha$ is a proportionality coefficient, and the value of a varies depending upon the aforementioned index difference between the fast axis and the slow axis of the birefringent material used, or the like as the thickness T1 of the center part does.

When crystalline quartz being a uniaxial crystal is used as the birefringent material making the first birefringent member 12, the refractive indices of crystalline quartz are as follows: the refractive index of 1.6638 for an ordinary ray and the refractive index of 1.6774 for an extraordinary ray in the ArF excimer laser light with the wavelength of 193 nm. Therefore, the fast axis is the polarization direction of the ordinary ray and the slow axis the polarization direction of the extraordinary ray.

The wavelengths of the ordinary ray and extraordinary ray in crystalline quartz are obtained by diving the wavelength (193 nm) in vacuum by the respective refractive indices, and are thus 116.001 nm and 115.056 nm, respectively. Therefore, a path difference of 0.945 nm is made between the two rays with every travel through one wavelength in crystalline quartz. Accordingly, after travel through 122.7 (=116.001/0.945) wavelengths, the path difference of about one wavelength is created between the two rays. However, the path difference of just one wavelength or an integral multiple of the wavelength is equivalent to substantially no path difference between the two rays. The thickness of crystalline quartz corresponding to the 122.7 wavelengths is obtained by calculation of 122.7 193/1.6638, and is equivalent to 14239 nm, i.e., 14.239 µm. Similarly, for making a path difference of a half wavelength between the ordinary ray and the extraordinary ray, the thickness of crystalline quartz can be set to a half of the above thickness, i.e., 7.12 µm.

This confirms that when the first birefringent member 12 being the first nonuniform wavelength plate is made of crystalline quartz, the thickness T1 of the center part in Eq (1) above is set to an integer multiple of 14.239 µm and the thickness at the reference position (X=1) near the marginal region is set to a thickness 7.12 µm larger than it, i.e., the aforementioned proportionality coefficient $\alpha$ can be set to 7.12

At this time, the polarization phase difference ΔP1 made by the first birefringent member 12 is represented as follows as a function of position X in the X-direction.

$$\Delta P1 = 0.5(1.7X^4 - 0.7X^2) \quad (2)$$

The thickness of the first birefringent member 12 is a spacing between its entrance surface 12a and exit surface 12b, and each of shapes of the entrance surface 12a and exit surface 12b may be arbitrary as long as they satisfy the aforementioned relation between thickness and X-directional position for formation of the phase difference. From the viewpoint of processing of surface shape, however, processing becomes easier if either surface is a plane, and it is thus desirable to make, for example, the exit surface 12b as a plane in practice, as shown in FIG. 2B. In this case, where the value of the thickness TA on the exit surface 12b is 0, values of thickness TA of the entrance surface 12a are equal to those of TA determined by Eq (1). It is a matter of course that the entrance surface 12a is constructed as a plane.

Figure 4A:
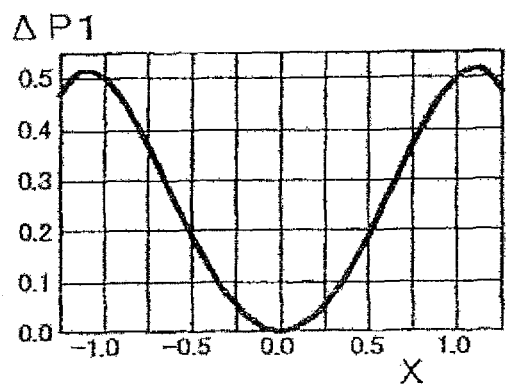
FIG. 4A is a diagram showing an example of relationship between polarization phase difference ΔP1 and position X in the first birefringent member 12.
Figure 5:
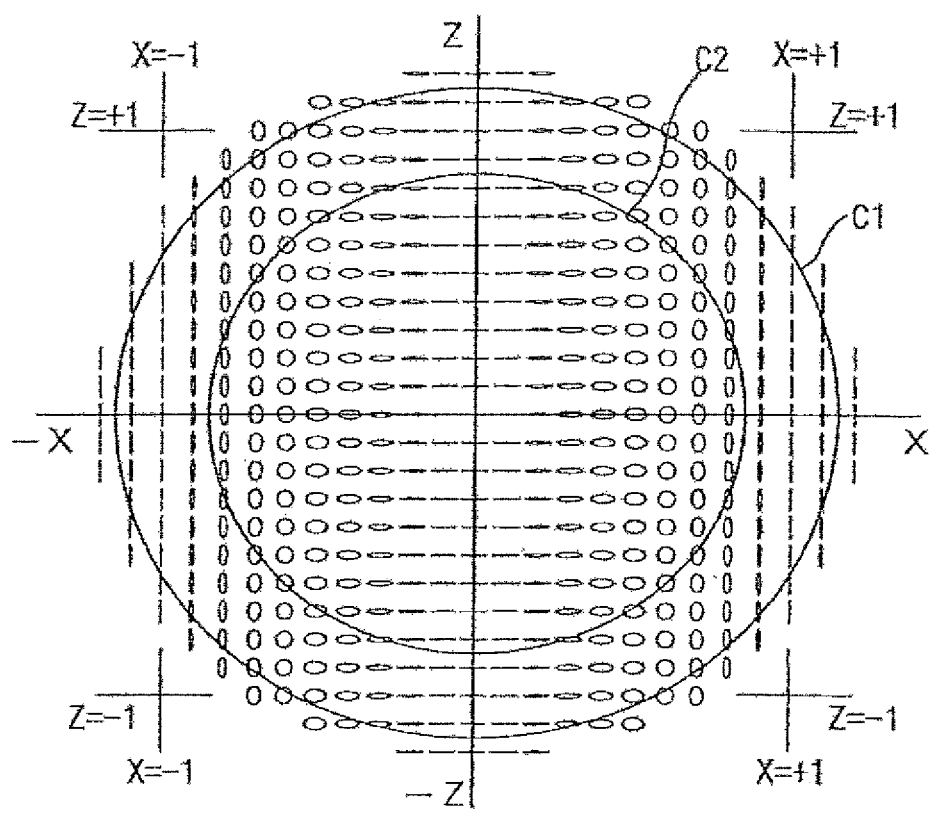
FIG. 5 is a drawing showing an example of polarization states of illumination light emerging from the first birefringent member 12.

FIG. 4A is a diagram showing the relation between polarization phase difference ΔP1 (in the unit of the wavelength of illumination light) and position X represented by Eq (2). FIG. 5 is a drawing showing polarization states of the illumination light emerging from the first birefringent member 12 and in FIG. 5 a polarization state of illumination light distributed at each position on the XZ coordinates is indicated by a line segment, a circle, or an ellipse with the center at each position. The origins of the X-axis and Z-axis (X=0 and Z=0) in FIG. 5 are set at the center of the birefringent member 12, and the scales in the X-direction and in the Z-direction are so set that the positions of X=±1 and Z=±1 (both of which are positions the reference length apart from the origin X=0, Z=0) are located at the four corners in FIG. 5.

At a position represented by each line segment among the positions identified by the respective XZ coordinates in FIG. 5, the illumination light is in a polarization state consisting primarily of linear polarization and a direction of the line segment indicates a polarization direction thereof. At a position represented by each ellipse, the illumination light is in a polarization state consisting primarily of elliptic polarization and a direction of the major axis of the ellipse indicates a direction in which the linear polarization component in the elliptic polarization is maximum. At a position represented by each circle, the illumination light is in a polarization state consisting primarily of circular polarization.

At the positions ±1 apart in the X-direction from the center, as shown in FIG. 4(A), the first birefringent member 12 acts as a so-called half wavelength plate. Here the illumination light IL emitted from the exposure light source 1 in FIG. 1 consists primarily of the linearly polarized light polarized in the X-direction as described previously, and the half wavelength plate has the fast axis nf and slow axis ns rotated 45° relative to the X-direction being the polarization direction of the incident light (or of the illumination light). Therefore, as shown in FIG. 5, the polarization state of the illumination light passing near the positions ±1 (reference length) apart in the X-direction from the center in the first birefringent member 12 is converted into the polarization state consisting primarily of linear polarization in the Z-direction by the action of the half wavelength plate.

For the illumination light passing near the positions ±0.6 apart in the X-direction from the center in the first birefringent member 12, as shown in FIG. 4A, the polarization phase difference ΔP1 is 0.25 and the first birefringent member 12 acts as a so-called quarter wavelength plate. For this reason, the illumination light passing this part is converted into a polarization state consisting primarily of circular polarization.

On the other hand, there is no path difference between the linear polarization in the direction of the fast axis nf and the linear polarization in the direction of the slow axis ns in a beam passing the center in the X-direction, and thus no conversion occurs for the polarization state of transmitted light. Therefore, a beam incident at the center in the X-direction into the birefringent member 12 emerges from the birefringent member 12 while maintaining the state consisting primarily of the linear polarization state in the X-direction. Then beams passing at positions except for the above positions of X=0, ±0.6, and ±1 pass through the first birefringent member 12, in polarization states consisting primarily of elliptic polarization in different shapes according to the positions. The polarization states are as shown in FIG. 5.

In FIG. 1, the illumination light IL in the different polarization states according to the passing locations through the first birefringent member 12 is incident to the second birefringent member 13. The second birefringent member 13 is also a member of disk shape made of a birefringent material.

Figure 3A:
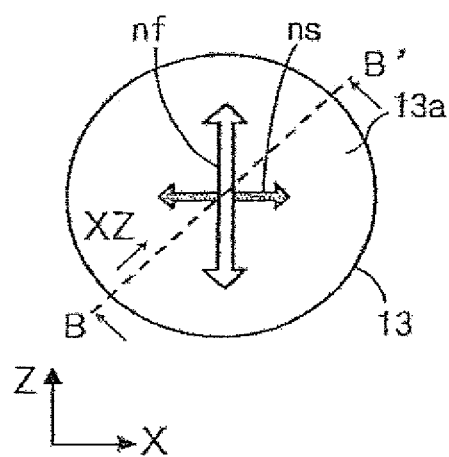
FIG. 3A is a view of birefringent member 13 in FIG. 1, viewed to +Y direction.

FIG. 3A is a view of the second birefringent member 13 in FIG. 1, viewed to the +Y direction and along the optical axis of illumination system AX2, and, as shown in FIG. 3(A), the fast axis of the second birefringent member 13 is set in parallel with the Z-axis of the XZ coordinate system with the same coordinate axes as those in FIG. 1 and the slow axis ns is set in parallel with the X-axis, different from the aforementioned first birefringent member 12. Concerning the second birefringent member 13, the size (diameter) in the in-plane direction thereof is larger than the beam size of the illumination light IL at the position where the second birefringent member 13 is located.

Figure 3B:
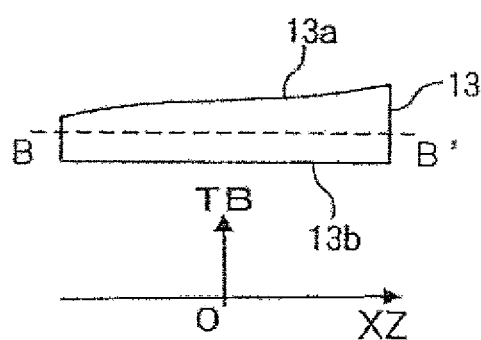
FIG. 3B a sectional view along line BB' in FIG. 3A.

The thickness of the second birefringent member 13 is not uniform, either, and the thickness also varies according to positions in the direction of the function Z=X in the XZ coordinate system in FIG. 3(A), i.e., in the direction of line BB' in FIG. 3A (which will be referred to hereinafter as "XZ direction"). FIG. 3(B) is a sectional view of the second birefringent member 13 along line BB' in FIG. 3A, and, as shown in FIG. 3B, the birefringent member 13 has such a shape that it is thin at the left end (near B) and thick at the right end (near B'). On the other hand, the thickness of the second birefringent member 13 is uniform in the direction orthogonal to the XZ direction. Therefore, the second birefringent member 13 also functions as a second nonuniform wavelength plate in which the polarization phase difference given to the transmitted light differs according to locations.

In the present example the thickness TB of the second birefringent member 13 is represented by the following function, for the position XZ in the XZ direction. As shown in FIG. 3(B), the origin in the XZ direction (XZ=0) is defined at the center of the birefringent member 13 (the optical axis of illumination system) and the thickness at the center is defined by T2.

$$TB=T2+\beta(2.5XZ^5-1.5XZ^3) \tag{3}$$

In this equation, β is a proportionality coefficient and the value of β differs depending upon the aforementioned index difference between the fast axis and the slow axis of the birefringent material used, or the like as the thickness T2 of the center part does. Here the thickness T2 of the center part is so set that the polarization phase difference ΔP2 of the second birefringent member 13 is 0.25 (in the unit of the wavelength of the illumination light), i.e., that the center part functions as a quarter wavelength plate.

The birefringent member 13 is also so set that the polarization phase differences ΔP2 at the positions +1 (reference length) and −1 apart in the XZ direction are +0.75 and −0.25, respectively. This means that differences of +0.5 and −0.5, respectively, are made between the polarization phase differences at the positions of interest and at the center.

Namely, in the second birefringent member 13 of the present example the thickness thereof is so set that the polarization phase difference ΔP2 is represented by the following equation.

$$\Delta P2=0.25+0.5(2.5XZ^5-1.5XZ^3) \tag{4}$$

Figure 4B:
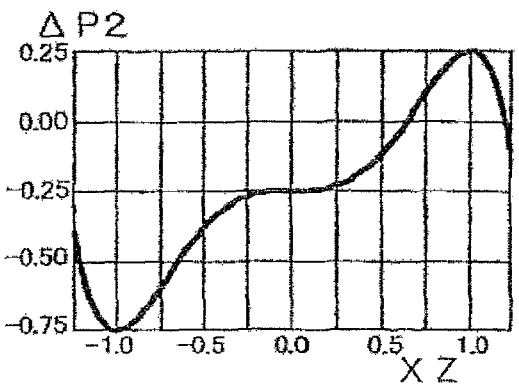
FIG. 4B is a diagram showing an example of relationship between polarization phase difference ΔP2 and position XZ in the second birefringent member 13.

In a case where the second birefringent member 13 is also made of crystalline quartz as in the case of the aforementioned example, the thickness T2 of the center part can be set to an (integer +1/4) multiple of 14.239 μm and the proportionality coefficient β to 7.12 μm. FIG. 4(B) is a drawing showing the relation between polarization phase difference ΔP2 and position XZ of Eq (4).

Figure 4C:
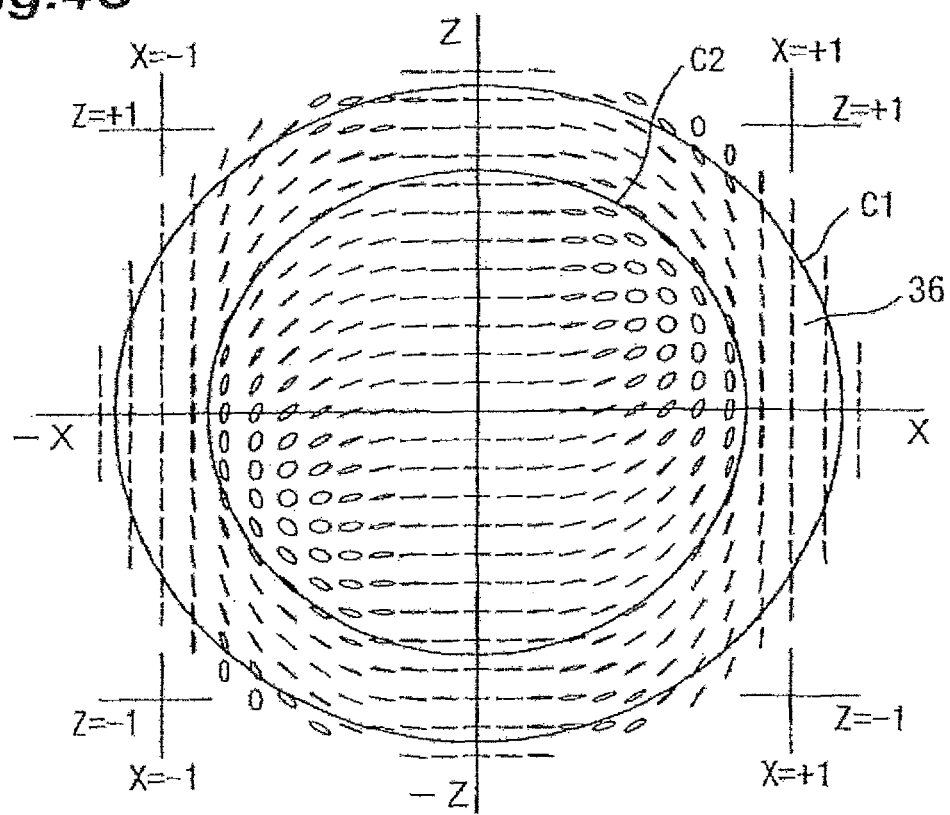
FIG. 4C a drawing showing an example of polarization states of illumination light emerging from the second birefringent member 13.

In FIG. 1, the second birefringent member 13 again converts the illumination light in the different polarization states according to the passing locations through the first birefringent member 12, into polarization states according to locations. FIG. 4C shows the polarization states of the illumination light IL emerging from the second birefringent member 13.

FIG. 4C is illustrated in the same manner as the aforementioned illustration method in FIG. 5, and, in FIG. 4C, a polarization state of illumination light distributed at each position on XZ coordinates is indicated by a line segment (linear polarization) or an ellipse (elliptic polarization) with the center at each position. The origins of the X-axis and Z-axis in FIG. 4C (X=0 and Z=0) are also set at the center of the birefringent member 13.

In the present embodiment, as shown in FIG. 1, the first birefringent member 12 and the second birefringent member 13 are located immediately before the fly's eye lens 14 and the exit-side surface of the fly's eye lens 14 is located near the pupil plane 15 in the illumination optical system ILS. For this reason, the first birefringent member 12 and the second birefringent member 13 are located at positions substantially equivalent to the pupil plane 15 in the illumination optical system ILS.

Therefore, the illumination light IL passing through the first birefringent member 12 and the second birefringent member 13 is incident at incidence angles and incidence directions determined according to the locations, into the reticle R. Namely, a beam distributed on the origin (the position of X=0 and Z=0) in FIG. 4C is incident normally to the reticle R, and a beam distributed at a position a predetermined distance apart from the origin is incident at an incidence angle proportional approximately to this distance, to the reticle R. The incidence direction of the beam is a direction equal to an azimuth of that point from the origin.

Exterior circle C1 and interior circle C2 shown in FIG. 4C and FIG. 5 are boundaries of a distribution of the illumination light for forming predetermined annular illumination on the reticle R. The radii of the respective circles C1, C2 are determined as follows: the radius of the exterior circle C1 is 1.15 and the radius of the interior circle C2 0.85, where the unit is the reference length used in determining the thickness shapes (thickness profiles) of the first birefringent member 12 and the second birefringent member 13. Namely, an annular ratio of the annular illumination (radius of interior circle/radius of exterior circle) is assumed to be 0.74. This is based on the assumption of so-called "3/4 annular illumination (interior radius:exterior radius=3:4)" used in general, but it is a matter of course that the condition for the annular illumination to which the present invention is to be applied is not limited to this.

As apparent from FIG. 4C, the illumination light emerging from the second birefringent member 13 is in polarization states consisting primarily of linear polarization with the polarization direction along the circumferential direction of a specific annular region 36, in the specific annular region 36 which is an annular region between the exterior circle C1 and the interior circle C2.

When comparing FIG. 4C with FIG. 5, the polarization states of the illumination light on the X-axis and on the Z-axis are almost equal. However, the polarization states at positions approximately 45° apart from each axis about the origin (at the upper right, upper left, lower left, and lower right positions in FIG. 4C and FIG. 5) are almost circular polarization in FIG. 5, but are linear polarization along the circumferential direction of the specific annular region in FIG. 4C. This arises from the action of the second birefringent member 13; the second birefringent member 13 functions as a quarter wavelength plate in the upper left and lower right regions in FIG. 4C and functions as a −¼ wavelength plate and as a ¾ wavelength plate equivalent thereto in the lower left and the upper right regions, respectively.

In the practical exposure apparatus, the actual radius of the exterior circle C1 of the specific annular region 36 is determined by the numerical aperture (NA) on the reticle R side of the projection optical system 25 in FIG. 1, the focal length of the optical system consisting of the relay lens 16 and condenser lenses 18, 20 in the illumination optical system ILS, and the value of coherence factor (illumination a) to be set, and the radius of the interior circle C2 is a value determined further by the annular ratio to be set. It is needless to mention that for this condition for annular illumination, the thickness shapes of the first birefringent member 12 and second birefringent member 13 are determined so that the polarization directions of the illumination light distributed in the specific annular region 36 are coincident with the circumferential direction of the annular region at the respective positions.

To determine the thickness shapes of the first birefringent member 12 and the second birefringent member 13 means that the shapes are proportionally enlarged or reduced in the XZ plane and unevenness amounts thereof are kept unchanged in the Y-direction (traveling direction of light).

In the first example of the first and second birefringent members 12, 13, as described above, the polarization directions of the illumination light distributed in the specific annular region can be made coincident with the circumferential direction of the annular region at each position, with no light quantity loss of the illumination beam, by the first and second nonuniform wavelength plates. In this case, the illumination light incident through the specific annular region 36 onto the reticle R among the illumination light, i.e., the specific illumination beam incident in the specific incidence angle range to the reticle R is light in the polarization state consisting primarily of S-polarization whose polarization direction lies along the direction normal to the entrance plane. This improves the contrast, resolution, depth of focus, etc. of the transferred image, depending upon the periodicity of the pattern to be transferred, in some cases (the details of which will be described later).

Next, the second example of the first and second birefringent members 12, 13 in the illumination optical system ILS in FIG. 1 will be described with reference to FIG. 6.

In the present example the configurations of the first birefringent member 12 and the second birefringent member 13 are basically the same as those in the aforementioned first example. Namely, the first birefringent member 12 has the direction of the fast axis and the thickness shape as shown in FIG. 2A and FIG. 2B and the second birefringent member 13 has the direction of the fast axis and the thickness shape as shown in FIG. 3A and FIG. 3B. In the present example, however, the function forms for the thicknesses of the two birefringent members 12, 13 are different.

FIG. 6A, corresponding to FIG. 4A, shows a characteristic of polarization phase difference ΔP1 by the first birefringent member 12 versus X-directional position in the second example. The polarization phase difference ΔP1 in FIG. 6A is represented by the following function including a trigonometric function about position X.

$$\Delta P1 = 0.265 \{1 - \cos(\pi X^2)\} \quad (5)$$

This polarization phase difference ΔP1 can be realized by expressing the thickness TA of the first birefringent member 12 by the following function for the X-directional position X.

$$TA = T1 + \gamma \{1 - \cos(\pi X^2)\} \quad (6)$$

In this equation, γ represents a proportionality coefficient. In a case where the first birefringent member 12 is made of crystalline quartz, as in the first embodiment, the thickness T1 at the center can be set to an integer multiple of 14.239 μm and the proportionality coefficient γ to 3.77 μm. The value of 3.77 μm is obtained by multiplying the thickness of crystalline quartz for giving the polarization phase difference of one wavelength, 14.239 μm, by the coefficient of 0.265 in Eq (5) above.

FIG. 6B shows a characteristic of polarization phase difference ΔP2 by the second birefringent member 13 versus XZ-directional position in the second example. The polarization phase difference ΔP2 in FIG. 6(B) can be represented by the following function including a trigonometric function about position XZ.

$$\Delta P2 = 0.25 + 0.5 \sin(0.5\pi XZ^3) \quad (7)$$

The polarization phase difference ΔP2 can be realized by expressing the thickness TB of the second birefringent member 13 by the following function for the position XZ in the XZ direction.

$$TB = T2 + \delta \sin(0.5\pi XZ^3) \quad (8)$$

In this equation δ is a proportionality coefficient. When the second birefringent member 13 is made of crystalline quartz, the thickness T2 at the center can be set to an (integer +1/4) multiple of 14.239 μm, and the proportionality coefficient 6 to 7.12 μm.

In the present example the first birefringent member 12 and the second birefringent member 13 also function as first and second nonuniform wavelength plates, respectively, in which the polarization phase difference given to the transmitted light differs according to locations. Then the linearly polarized light incident in a polarized state in the X-direction into the first birefringent member 12 is converted into the polarization distribution shown in FIG. 6C to emerge from the second birefringent member 13.

As seen from comparison between FIG. 6C and FIG. 4C, the first birefringent member 12 and second birefringent member 13 of the present second example can make the polarization states of illumination light distributed in the specific annular region 36 between the exterior circle C1 and the interior circle C2, closer to linear polarization parallel to the circumferential direction of the annular region 36 than those in the first example. The reason for it is that the first birefringent member 12 and second birefringent member 13 of the present second example adopt the thickness shapes (i.e., surface shapes) determined by the high-order functions of trigonometric functions and thus they enable higher-accuracy polarization control.

However, since the first birefringent member 12 and second birefringent member 13 in the first example are represented by the functions of at most order 5, they offer the advantage that processing is easy and production cost is low, though they are slightly inferior in the polarization control performance.

In order to further reduce the production cost of the first and second birefringent members 12, 13, it is also possible, for example, to adopt a configuration wherein the surface shape of the first birefringent member 12 is a cylindrical surface (surface of a circular cross section in the X-direction) and wherein the surface shape of the second birefringent member 13 is a tapered surface (inclined plane). The polarization control performance in this case is worse than in the first embodiment, but satisfactory effect can be achieved thereby depending upon use of the projection exposure apparatus.

Therefore, it can realize a high-performance exposure apparatus while achieving the reduction of production cost.

The configuration wherein the surface shape of the second birefringent member 13 is the tapered surface means that the polarization phase difference of a beam passing through the second birefringent member 13 is defined in a linear form (linear function) according to locations in the plane of the second birefringent member 13.

Incidentally, the shapes of the first birefringent member 12 and the second birefringent member 13 in FIG. 1 are not limited to the shapes shown in the above first and second examples, but may be any shapes that can make the polarization state of transmitted light in the specific annular region coincide with the circumferential direction in each part.

For example, the shapes of the first birefringent member 12 and second birefringent member 13 may be stepwise shapes with stepped shape changes at predetermined positions, instead of the shapes represented by the aforementioned continuous and differentiable continuous functions. Such stepwise shapes can be formed suitably by etching, instead of mechanical or mechanochemical polishing.

In order to implement the polarization states as described above, in the case where the illumination light is such that the polarization state of the beam incident to the first birefringent member 12 is the single polarization state consisting primarily of linear polarization, the first birefringent member 12 is preferably one that gives the polarization phase difference with 2-fold rotation symmetry around the optical axis of illumination system AX2. It is a matter of course that this embraces the nonuniform wavelength plate having the thickness of an even function in the X-direction and the constant thickness in the Y-direction, as shown in the above-described first and second examples.

The second birefringent member 13 is desirably the nonuniform wavelength plate that gives the polarization phase difference with 1-fold rotation symmetry about the optical axis of the illumination system AX2. The 1-fold rotation symmetry refers to a state in which the distribution of polarization phase differences is approximately symmetric with respect to one axis out of two axes orthogonal to the optical axis of illumination system AX2 and approximately antisymmetric with respect to the other axis. The antisymmetry generally refers to a function that provides equal absolute values but opposite signs with inversion of a coordinate axis, but the antisymmetry herein also embraces functions obtained by adding an offset of a constant to general antisymmetric functions. It is needless to mention that this encompasses the nonuniform wavelength plate having the thickness determined by an odd function with an offset in the XZ-direction and the constant thickness in the direction orthogonal thereto, as shown in the above-described first and second examples.

In the present embodiment, particularly, it is important to set the illumination light distributed in the aforementioned specific annular region to the predetermined polarization state; therefore, it is obvious as to the shapes of the first birefringent member 12 and the second birefringent member 13 that no particular problem will arise even if the shapes in the portions not corresponding to the foregoing specific annular region do not satisfy the above conditions.

The number of first birefringent member 12 and second birefringent member 13, and the directions of the fast axes thereof are not limited to those described in the above first and second examples, either. Specifically, three or more birefringent members may be arranged in series along the traveling direction of the illumination light (along the optical axis of illumination system AX2), and the rotational relation around the optical axis AX2 between the directions of the fast axes is not limited to 45°, either. In the case where three or more birefringent members are arranged in series along the traveling direction of the illumination light, a potential configuration is such that the direction of the fast axis of at least one birefringent member out of the plurality of birefringent members is different from the directions of the fast axes of the other birefringent members, in order to convert the polarization state of the illumination light into linear polarization nearly parallel to the circumferential direction in at least a partial region of the aforementioned specific annular region and, desirably, in the almost entire circumferential region.

Similarly, the materials of the birefringent members 12, 13 and others are not limited to crystalline quartz described above, either, but other birefringent materials are also applicable. It is also possible to use the intrinsic birefringence of fluorite to form the birefringent members. A material originally having no birefringence, e.g., synthetic quartz, comes to have the birefringent property when subjected to stress or the like. It can also be used for the birefringent members 12, 13 and others.

Furthermore, the birefringent members 12, 13 can also be made using a composite material obtained by bonding a material with birefringence onto a transparent substrate without birefringence. In this case, the aforementioned thicknesses are, of course, thicknesses of the material with birefringence. The bonding herein may be implemented not only by mechanical joining such as adhesion or press, but also by a method of forming a thin film with birefringence on the transparent substrate by means such as vapor deposition or the like. The thickness shapes and others of the first birefringent member 12 and second birefringent member 13 described in the above first and second examples vary depending upon the magnitude of birefringence of the material used, but, even in cases where materials except for crystalline quartz are used, the aforementioned shape determining method can also be applied and the shapes are determined thereby, of course.

The advantage of the illumination light in the annular illumination as described above, in which the polarization state of the illumination light distributed in the annular region is coincident with the circumferential direction of the annular region, will be described briefly with reference to FIGS. 7 and 8.

Figure 7A:
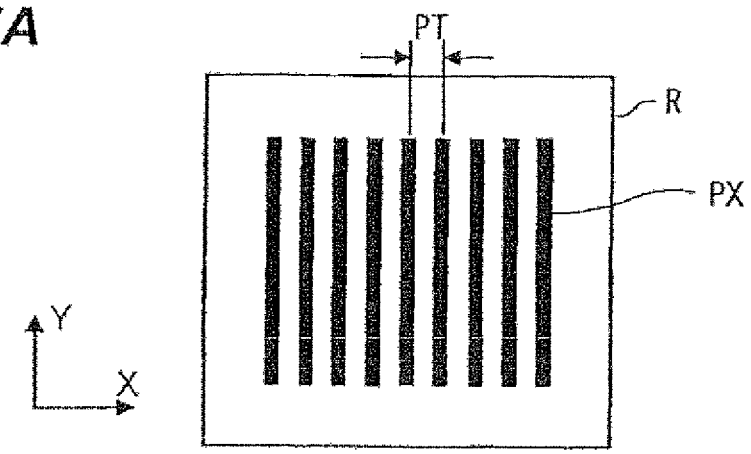
FIG. 7A is a plan view showing an example of microscopic periodic pattern PX formed on reticle R of FIG. 1.
Figure 7B:
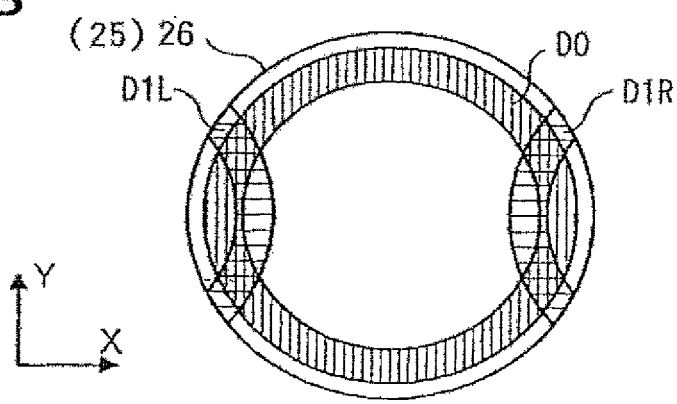
FIG. 7B a drawing showing a distribution of diffracted light formed in pupil plane 26 of the projection optical system when the pattern of FIG. 7A is illuminated under a predetermined condition.

FIG. 7A shows an example of fine periodic pattern PX formed on the reticle R in FIG. 1. The periodic pattern PX is a pattern with periodicity in the X-direction in the same XYZ coordinate system as in FIG. 1, and the pitch PT thereof is 140 nm as a converted value in terms of the scale on the wafer W in consideration of the projection magnification of the projection optical system 25 in FIG. 1. FIG. 7B shows a distribution of diffracted light formed in the pupil plane 26 (cf. FIG. 1) of the projection optical system 25 with the wafer-side numerical aperture (NA) of 0.90 when this pattern is illuminated by annular illumination with the coherence factor (illumination σ) of 0.9 and the annular ratio of 0.74, using the illumination light having the wavelength of 193 nm.

Figure 7C:
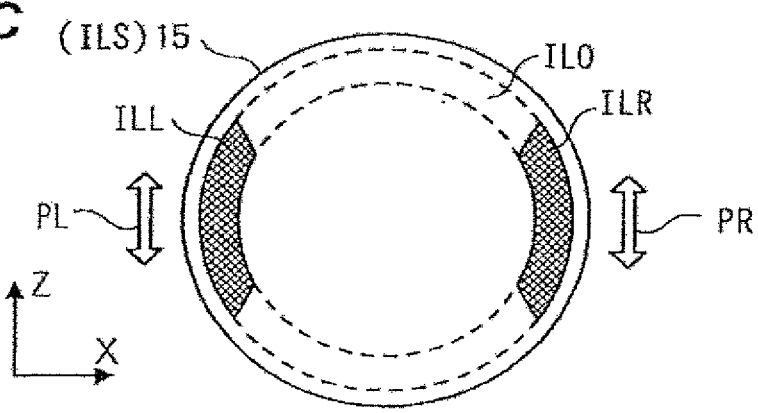
FIG. 7C a drawing showing a condition for annular illumination for illuminating the pattern PX of FIG. 7A.

FIG. 7C is a drawing showing the condition for annular illumination for illuminating the pattern PX, and the pattern PX is illuminated with the illumination light from the annular region IL0 satisfying the above condition for annular illumination, in the pupil plane 15 of the illumination optical system ILS in FIG. 1. The whole of 0-order diffracted light D0 in FIG. 7B from the periodic pattern PX is distributed in the pupil plane 26 and passes through the projection optical system 25 to reach the wafer W, but the 1-order diffracted light D1R and D1L can be transmitted only in part through the pupil plane 26 and the projection optical system 25. An image of the pattern PX on the reticle R is formed as an interference fringe pattern between the 0-order diffracted light D0 and the 1-order diffracted light D1R, D1L on the wafer W, but an interference fringe pattern is formed only by a pair of 0-order diffracted light and 1-order diffracted light generated from the illumination light emitted from the same position on the pupil plane 15 of the illumination optical system ILS.

The 1-order diffracted light D1L located at the left end of the pupil plane 26 in FIG. 7B is to be paired with the part of the 0-order diffracted light D0 located at the right end, and those diffracted light beams originate in the illumination light from the right-end partial region ILR in the annular region IL0 in FIG. 7C. On the other hand, the 1-order diffracted light D1R located at the right end of the pupil plane 26 in FIG. 7B is to be paired with the part of the 0-order diffracted light D0 located at the left end, and those diffracted light beams originate in the illumination light from the left-end partial region ILL in the annular region IL0 in FIG. 7C.

Namely, on the occasion of exposure of the pattern PX with the fine pitch in the X-direction, beams contributing to imaging of the pattern PX among the illumination light emitted from the annular region IL0 on the pupil plane 15 of the illumination optical system ILS are limited to those in the partial region ILR and partial region ILL, and the illumination light emitted from the other regions in the annular region IL0 is illumination light not contributing to imaging of the pattern PX.

Incidentally, aforementioned Non-patent Document 1 (Thimothy A. Brunner, et al.: "High NA Lithographic imaging at Brewster's angle," SPIE Vol. 4691, pp. 1-24 (2002) and others report that on the occasion of exposure of a pattern with periodicity in the X-direction and with the longitudinal direction along the Y-direction like the pattern PX, the contrast of its projected image is improved by illumination with linear polarization having the polarization direction along the Y-direction on the reticle R.

Therefore, it is effective in improvement in the contrast of the projected image of the pattern PX and in improvement in the resolution and depth of focus in turn, to convert the illumination light distributed in the partial region ILR and in the partial region ILL in FIG. 7(C), into linearly polarized light polarized in the PR direction and the PL direction (corresponding to the Y-direction on the reticle R in consideration of the action of minor 19 in FIG. 1) parallel to the Z-direction in FIG. 7C.

When the reticle pattern is a periodic pattern with a fine pitch in the Y-direction resulting from 90° rotation of the pattern PX of FIG. 7A, the diffracted light distribution is also one rotated 90° from that shown in FIG. 7B. As a result, the partial regions through which the illumination light contributing to image formation of the periodic pattern passes are also located at the positions resulting from 90° rotation of the partial region ILR and partial region ILL shown in FIG. 7C (i.e., at the upper end and at the lower end in FIG. 7C) and the preferred polarization state is linear polarization with the polarization direction coincident with the X-direction. From the above, it is effective to use the illumination light in the polarization state as shown in FIG. 8, on the occasion of exposure of the reticle R including a pattern PX with fine periodicity in the X-direction and a pattern PY with fine periodicity in the Y-direction.

Figure 8A:
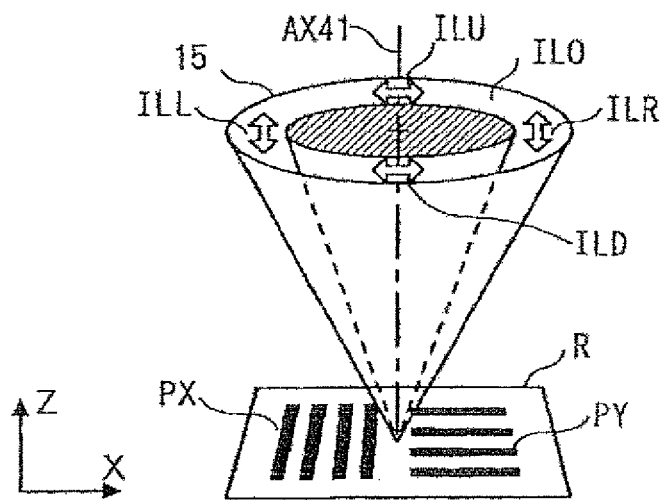
FIG. 8A is a perspective view showing a simplified relation between pupil plane 15 of illumination optical system ILS and reticle R in FIG. 1.

FIG. 8A is a perspective view showing the simplified relation between the pupil plane 15 of the illumination optical system ILS and the reticle R in FIG. 1, without illustration of the relay lens 16, condenser lenses 18, 20, and others in FIG. 1. As described above, the illumination light distributed in the annular region IL0 in FIG. 8A is desirably linear polarization in the Y-direction (the depth direction in the plane of FIG. 8A) at the ends ILL, ILR in the X-direction, in order to improve the imaging performance of the pattern PX with periodicity in the X-direction, and it is desirably linear polarization in the X-direction at the ends ILU, ILD in the Y-direction, in order to improve the imaging performance of the pattern PY with periodicity in the Y-direction. Namely, it is desirable to use linear polarization with the polarization direction approximately coincident with the circumferential direction of the annular region IL0.

Furthermore, in a case where the reticle R includes not only the patterns in the X-direction and in the Y-direction but also patterns in intermediate directions (45° and 135° directions), it is desirable to use linear polarization with the polarization direction perfectly coincident with the circumferential direction of the annular region, taking orientations of these patterns into consideration as well.

In passing, the above-described polarization states do not always realize effective polarization states for the patterns perpendicular to the patterns with orientations suitable for the polarization states of the respective portions in the annular region IL0. For example, the illumination light polarized in the X-direction from the partial region ILU is not in a preferred polarization state for imaging of the pattern PX with the periodicity in the X-direction and with the longitudinal direction along the Y-direction. As apparent from FIG. 7C showing the light sources contributing to the imaging of the pattern with the fine pitch in the X-direction, however, the partial region ILU corresponding to the upper end of the annular region IL0 in FIG. 7C is primarily the light source not contributing to the imaging of the pattern with the fine pitch in the X-direction at all and, therefore, no matter which polarization state is taken by the partial region ILU, the polarization state thereof will never cause degradation of the imaging characteristics.

Figure 8B:
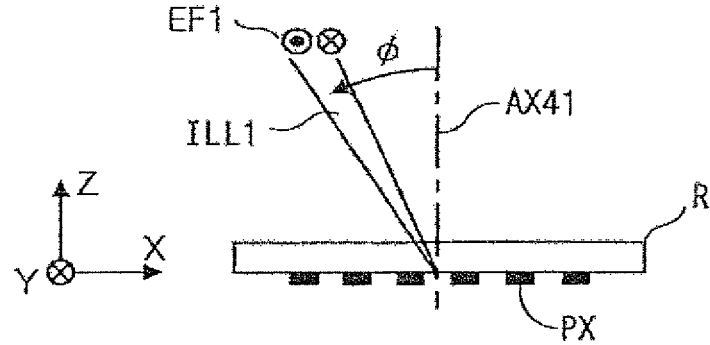
FIG. 8B a view of a part of FIG. 8A viewed to +Y direction.
Figure 8C:
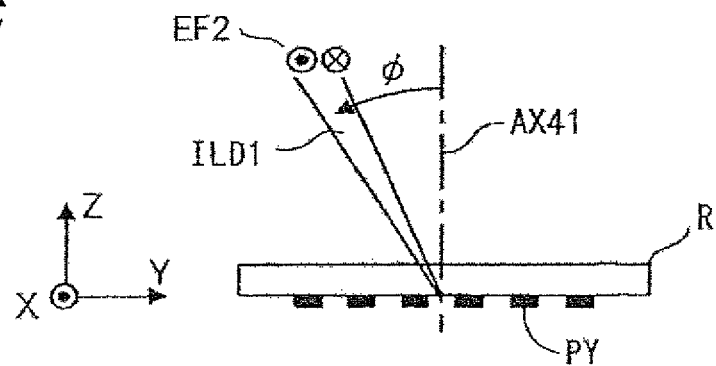
FIG. 8C a view of part of FIG. 8A viewed to −X direction.

As shown in FIG. 8A, the linear polarization almost coincident with the circumferential direction of the annular region IL0 on the pupil plane 15 of the illumination optical system ILS is incident as so-called S-polarization to the reticle R. The S-polarization refers to linear polarization with the polarization direction perpendicular to a plane of incidence in which a beam is incident to an object (which is a plane including a normal to the object, and the beam). Namely, the illumination light ILL1 from the partial region ILL consisting of linearly polarized light in the direction coincident with the circumferential direction of the annular region IL0 is incident as S-polarization with the polarization direction EF1 normal to the plane of incidence (the plane of FIG. 8B), as shown in FIG. 8B, to the reticle R. The illumination light ILD1 on the similar partial region ILD is also incident as S-polarization with the polarization direction EF2 normal to the plane of incidence (the plane of FIG. 8C), as shown in FIG. 8C, to the reticle R.

Naturally, the illumination light from the partial regions ILR, ILU at the positions symmetric with the foregoing partial regions ILL, ILD with respect to the optical axis AX41 of the illumination optical system is also incident as S-polarization to the reticle R by virtue of symmetry, because each illumination light on the partial region ILR, ILU has the polarization direction coincident with the circumferential direction of the annular region IL0. It is the general property of the annular illumination that angles of incidence of the illumination light distributed on the annular region IL0, to the reticle R are in a predetermined angular region with the center at an angle φ from the optical axis AX41 of the illumination optical system (i.e., a normal to the reticle R). A beam incident at the angles of incidence to the reticle R will be referred to hereinafter as "specific illumination beam." The angle φ and angular range can be determined based on the wavelength of the illumination light, the pitch of the pattern to be transferred, on the reticle R, and so on.

Incidentally, the foregoing first and second birefringent members 12, 13 convert the polarization state of the illumination light distributed in the specific annular region between the predetermined outside radius (exterior circle C1) and inside radius (interior circle C2) determined from the shapes peculiar to the members, into the polarization state consisting primarily of linear polarization parallel to the circumferential direction of the specific annular region, and it is not easy to change the radii (C2, C1).

Figure 9:
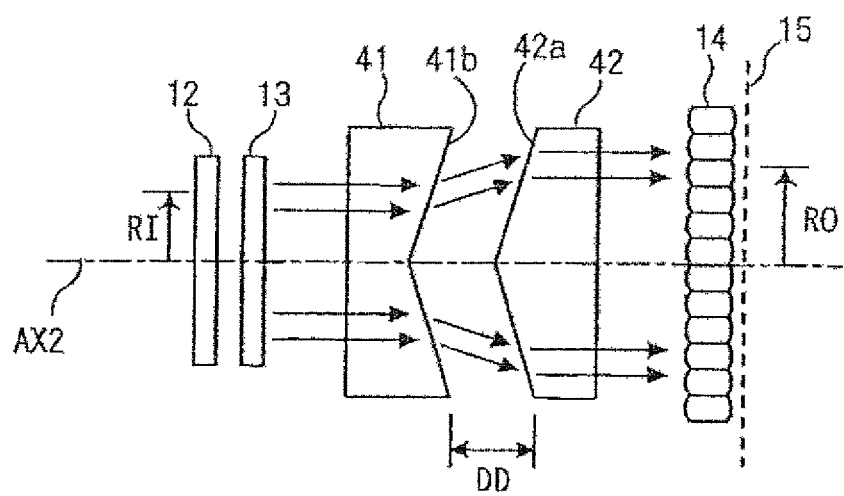
FIG. 9 is a drawing showing a plurality of conical prisms that can be disposed between birefringent members 12, 13 and fly's eye lens 14 in FIG. 1, for making the radius of the specific annular region variable, in an example of the embodied form of the present invention.

In the case where there arises a need for changing the desired annular region, for example, on the basis of the pitch of the pattern to be transferred, on the reticle R, as described above, a desirable configuration is such that a plurality of conical prisms 41, 42 of a zoom type are disposed between the first and second birefringent members 12, 13 and the optical integrator such as the fly's eye lens 14 in FIG. 1, as shown in FIG. 9, to make the radii of the foregoing specific annular region variable. In FIG. 9, the plurality of conical prisms of the zoom type are a concave conical prism 41 with a concave conical surface 41b and a convex conical prism 42 with a convex conical surface 42a, which are arranged with a spacing DD variable between them and along the optical axis of illumination system AX2.

In this case, the illumination light distributed in the specific annular region with the center at an average radius RI after passage through the first and second birefringent members 12, 13 is enlarged to a radius RO on the entrance plane of the fly's eye lens 14 and on the pupil plane 15 of the illumination optical system being the exit plane of the fly's eye lens 14, by the zoom type conical prisms 41, 42. This radius RO can be enlarged by increasing the spacing DD between the two conical prisms 41, 42 and can be reduced by decreasing the spacing DD.

This makes it feasible to form the specific annular region as a distribution of the illumination light consisting of linear polarization parallel to the circumferential direction, with arbitrary radii on the pupil plane 15 of the illumination optical system, and to change the illumination condition for annular illumination in accordance with the pattern on the reticle R to be transferred.

It is a matter of course that a zoom optical system can be used instead of the foregoing zoom type conical prisms 41, 42.

Incidentally, the above embodiment was described on the premise that the illumination light quantity distribution formed on the pupil plane 15 of the illumination optical system ILS in FIG. 1 is the annular region, i.e., that it is applied to the annular illumination, but the illumination condition that can be realized by the projection exposure apparatus of FIG. 1 is not always limited to the annular illumination. Namely, since the birefringent members 12, 13 of FIG. 1 and the zoom type conical prisms 41, 42 of FIG. 9 are configured to set the polarization state of the illumination light distributed in the specific annular region in the pupil plane 15 of the illumination optical system to the desired polarization state, it is needless to mention that even in the case where the distribution of the illumination light is further limited to within a specific partial region in the specific annular region, i.e., where the distribution of the illumination light is limited, for example, to the partial regions ILL, ILR in FIG. 7C, they can convert the illumination light distributed in the partial regions, into illumination light consisting primarily of linear polarization with the polarization direction parallel to the circumferential direction of the specific annular region.

In order to condense the illumination light only into the further specific regions in the specific annular region in this manner, the diffractive optical element 9a in FIG. 1 is replaced with such a diffractive optical member that the diffracted light (illumination light) generated from the other diffractive optical element is concentrated in the further specific discrete regions in the specific annular region on the first birefringent member 12 and on the second birefringent member 13.

The locations where the illumination light is condensed are, for example, two locations of the partial regions ILL, ILR in FIG. 7C, but are not limited to this example. The illumination light may be condensed at arbitrary locations in the specific annular region, and the number of locations may be four. The locations may be selected according to the shape of the pattern as an exposed object on the reticle R.

In the case where the illumination light is condensed in the further specific regions in the specific annular region as described above, it is also possible to use, instead of the zoom type conical prisms 41, 42, an optical member group as a combination of a convex polyhedron prism and a concave polyhedron prism of pyramid shape or the like with a variable spacing similarly.

Since the illumination light distributed in the regions except for these specific regions is not suitable for exposure of the pattern as the exposed object, the light quantity distribution thereof is preferably substantially 0 in certain cases. On the other hand, manufacturing error or the like of the diffractive optical element 9a and others could produce diffracted light (hereinafter referred to as "error light") in directions except for the desired directions from the diffractive optical element 9a and others and cause the illumination light to be distributed in the regions except for the above partial regions. It is thus also possible, for example, to adopt a configuration wherein a stop is disposed on the entrance surface side or on the exit surface side of the fly's eye lens 14 in FIG. 1 to block the error light. This makes the illumination light quantity distributions in the plurality of specific regions perfectly discrete. However, there are cases where another pattern exists except for the pattern as the exposed object on the reticle R and where the error light is effective to imaging of the pattern except for the object. Therefore, the illumination light quantity distribution in the region except for the specific regions does not always have to be 0 in such cases.

Incidentally, with attention to incidence of the illumination light to the reticle R, the limitation of the distribution of the illumination light quantity on the pupil plane 15 to within the further specific regions in the specific annular region results in further limiting the incidence directions thereof to only the aforementioned plurality of substantially discrete directions, in addition to the restriction on the range of incidence angles by the annular illumination. Naturally, in the case where the present invention is applied to the annular illumination, it is also possible to adopt the configuration wherein a stop is disposed on the entrance surface side or on the exit surface side of the fly's eye lens 14 to block the error light distributed in the regions except for the specific annular region.

The above embodiment was arranged to use the fly's eye lens 14 as an optical integrator, but it is also possible to use an internal reflection type integrator (e.g., glass rod) as an optical integrator. In this case, the exit plane of the glass rod is not located on the pupil plane 14 of the illumination optical system, but is located on a plane conjugate with the reticle R.

In the above embodiment the laser light source as the exposure light source 1 was arranged to emit the linearly polarized light polarized in the X-direction, but the laser light source, depending upon its type, can emit linearly polarized light polarized in the Z-direction in FIG. 1, or a beam in another polarization state. In the case where the exposure light source 1 in FIG. 1 emits light linearly polarized in the Y-direction, i.e., light linearly polarized in the Z-direction at the positions of the birefringent members 12, 13, the birefringent members 12, 13 described in the above first and second examples are rotated 90° about the optical axis of illumination system AX2, whereby the illumination light can be obtained in much the same polarization state as the polarization state shown in FIG. 4C and FIG. 6C (precisely, illumination light in a state resulting from 90° rotation of the state shown in the two figures).

Alternatively, the polarization controlling member 4 (polarization controlling mechanism) in FIG. 1 may be used to convert the Y-directional linear polarization emitted from the exposure light source 1, into X-directional linear polarization. This polarization controlling member 4 can be readily substantialized by a so-called half wavelength plate. In cases where the exposure light source 1 emits light of circular polarization or elliptic polarization, it can also be converted into the desired Z-directional linear polarization, similarly using a half wavelength plate or a quarter wavelength plate as the polarization controlling member 4.

It is, however, noted that the polarization controlling member 4 is not necessarily able to convert a beam in an arbitrary polarization state emitted from the exposure light source 1, into the Z-directional polarization without loss in light quantity. Therefore, the exposure light source 1 needs to generate a beam in a single polarization state (beam that can be converted into linear polarization without loss in light quantity by a wavelength plate or the like), such as linear polarization, circular polarization, or elliptic polarization. However, where the intensity of the beam except for the aforementioned single polarization state is not so high relative to the total intensity of the illumination light, the adverse effect of the beam except for the single polarization state is not so significant on the imaging characteristics, and thus the beam emitted from the exposure light source 1 may contain the beam except for the single polarization state to some extent (e.g., approximately 20% or less of the total light quantity).

When consideration is given to operating circumstances of the projection exposure apparatus of the above embodiment, it is not always the best to set the polarization state of the illumination light so that the illumination light distributed in the specific annular region is linear polarization approximately parallel to the circumferential direction of the annular region or so that the specific illumination light is incident as S-polarization to the reticle R. Namely, there is a case where it is preferable to adopt normal illumination (illumination with a circular illumination light quantity distribution on the pupil plane 15 of the illumination optical system) instead of the annular region, depending upon the pattern on the reticle R to be exposed. In this case, it is sometimes preferable not to use the illumination light in the polarization state in the above embodiment.

For making the apparatus compatible with such operating conditions as well, the polarization controlling member 4 in FIG. 1 may be implemented by adopting an element or optical system capable of converting the polarization state of the beam emitted from the light source such as a laser, into random polarization or the like according to need. This can be realized, for example, by two polarization beam splitters 4b, 4c or the like as shown in FIG. 10.

Figure 10:
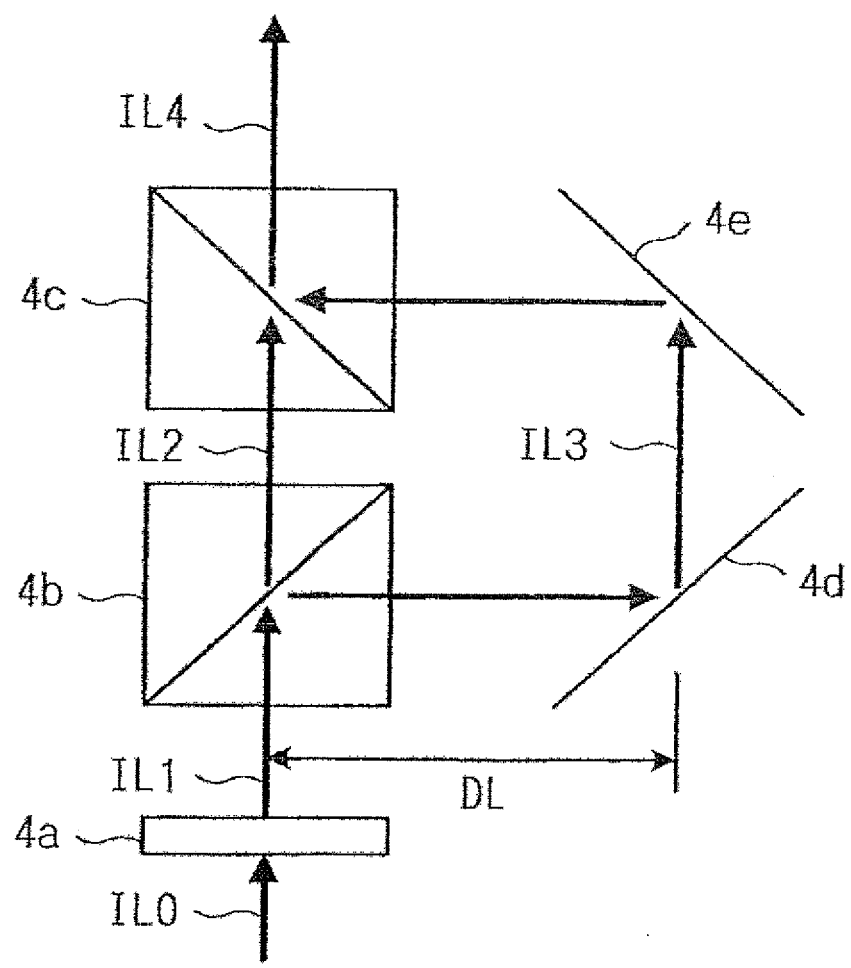
FIG. 10 is a drawing showing an example of a polarization control optical system that can be disposed at the position of polarization controlling member 4 in FIG. 1.

FIG. 10 shows a polarization control optical system which can be placed at the position of the polarization controlling member 4 in FIG. 1. In this FIG. 10, for example, an illumination beam IL0 (corresponding to the illumination light IL in FIG. 1) consisting of linearly polarized light is incident to a rotatable wavelength plate 4a consisting of a half wavelength plate or quarter wavelength plate. This converts the illumination beam IL0 into an illumination beam IL1 of linear polarization inclined at 45° from the plane of FIG. 10, or of circular polarization, and the first polarization beam splitter 4b divides the illumination beam IL1 into a beam IL2 of P-polarization component and a beam 1L3 of S-polarization component with respect to its dividing surface. One beam 1L2 travels straight upward through the prism 4b in FIG. 10, and the other beam IL3 is reflected to the right in FIG. 10.

The beam IL2 traveling straight is then incident to the polarization beam splitter 4c and, because of the polarization characteristics thereof, the beam IL2 travels straight in the polarization beam splitter 4c and then travels as a beam IL4 upward in FIG. 10. On the other hand, the reflected beam 1L3 is reflected by mirrors 4d, 4e and then enters the polarization beam splitter 4c to be reflected again therein. The reflected beam IL3 merges with the beam IL4 traveling straight. At this time, where DL represents each of the spacings between the polarization beam splitters 4b, 4c and the mirrors 4d, 4e, there is the path length difference of 2 DL between the two merging beams 1L3, IL4. When this path length difference of 2 DL is set longer than the coherent length of the illumination beam, there is no coherence between the two beams, so that the merged light can be substantially of random polarization.

When this polarization control optical system is loaded in the illumination optical system ILS in FIG. 1, the illumination light IL transmitted thereby is always of random polarization and could be a hindrance to implementation of the polarization state in the above embodiment. However, this hindrance will not be caused in principle in the optical system shown in FIG. 10 because the rotatable wavelength plate 4a can be rotated to convert the polarization state of the illumination light IL1 transmitted by the rotatable wavelength plate 4a, into linear polarization the whole of which passes through the first beam splitter 4b. However, some loss of light quantity is essentially inevitable due to absorption in the polarization beam splitters 4b, 4c, reflection loss on the mirrors 4d, 4e, and so on, and it is thus optional to provide a mechanism for retracting the beam splitters 4b, 4c and rotatable wavelength plate 4a to outside the optical path of the illumination optical system when there is no need for converting the illumination light into random polarization.

Incidentally, without use of such polarization beam splitters, the following simple method can also offer an effect similar to that by the random polarization illumination. This can be implemented as follows: the polarization state of the illumination light IL incident to the first birefringent member 12 in FIG. 1 is set to polarization in the direction 45° apart from the X-direction and Z-direction in FIG. 1, whereby the illumination light distributed in the specific annular region is converted into approximately circular polarization. Therefore, in cases where the projection exposure apparatus of the present embodiment is used in applications in which the circular polarization can be deemed approximately as random polarization, i.e., in applications in which the imaging performance required is relatively not so high, it is also feasible to achieve the effect similar to that by the random polarization illumination, by a configuration wherein the polarization controlling member 4 in FIG. 1 is constructed, for example, of a half wavelength plate whereby the polarization state of the illumination light incident to the first birefringent member 12 is set to polarization in the direction inclined at 45° from the X-axis and Z-axis as described above. It is also feasible to achieve the effect similar to that by the random polarization illumination, by a similar configuration wherein the polarization controlling member 4 is constructed, for example, of a quarter wavelength plate whereby the polarization state of the illumination light incident to the first birefringent member 12 is set to circular polarization.

Alternatively, it is also feasible to achieve the effect similar to that by the random polarization illumination, by a configuration wherein the relation between the two birefringent members 12, 13 and the direction of linear polarization of the illumination light is rotated, for example, by 45° by a rotating mechanism 101 capable of wholly rotating the first birefringent member 12 and the second birefringent member 13 in FIG. 1 about the optical axis of illumination system AX2 being the optical axis of the illumination optical system ILS.

Incidentally, in the case of the normal illumination, there are also cases wherein the polarization state thereof is preferably set to linear polarization in a predetermined direction. For making the projection exposure apparatus of the above embodiment compatible with this illumination condition, the apparatus is provided with a rotating mechanism 101 capable of wholly rotating each of the birefringent members, such as the first birefringent member 12 and the second birefringent member 13 in FIG. 1, independently about the optical axis of illumination system AX2, and the direction of rotation of each birefringent member is set so that the fast axis (or slow axis) of each birefringent member is in parallel with the direction of linear polarization of the illumination light. In this case, the illumination light travels through each birefringent member, without being affected by the converting action of the polarization state at all, and emerges as keeping the linear polarization at the time of incidence.

For setting the polarization in the linear polarization state in the one predetermined direction, it can also be implemented by wholly retracting the first birefringent member 12 and the second birefringent member 13 and others to outside the optical path of the illumination optical system. Namely, the setting of the linear polarization state in the one predetermined direction may be implemented by providing a replacing mechanism 102 and replacing the birefringent members and others all together thereby. When the apparatus is provided with the replacing mechanism 102, it is also possible to adopt a configuration wherein the replacing mechanism 102 is arranged to set plural sets of birefringent member groups therein and wherein they can be replaceably arranged on the position on the optical axis of illumination system AX2. In this case, it is a matter of course that each birefringent member group is preferably provided with the characteristics of converting the illumination light into linear polarization along the circumferential direction of the specific annular region, in the specific annular region with the outside radius and inside radius different among the groups.

Incidentally, a preferred case to use the illumination light of linear polarization in the one predetermined direction as described above is, for example, exposure of a phase shift reticle of a spatial frequency modulation type with a pattern aligned along a direction. In this case, in order to further improve the resolution and depth of focus of the pattern to be transferred by exposure, the coherence factor (o value) of the illumination light is preferably not more than about 0.4.

When consideration is given again to the action of the birefringent members according to the present invention (first birefringent member 12 and second birefringent member 13) with reference to FIG. 4C and FIG. 6C, it is apparent from the two figures that the first example (FIG. 4C) and the second example (FIG. 6C) of the first birefringent member 12 and the second birefringent member 13 cause little influence on the polarization state of the illumination light distributed inside a circle (not shown) with the center on the optical axis of the illumination optical system (X=0, Z=0) and with the radius approximately equal to half of the radius of the exterior circle C1 of the specific annular region.

Figure 1A:
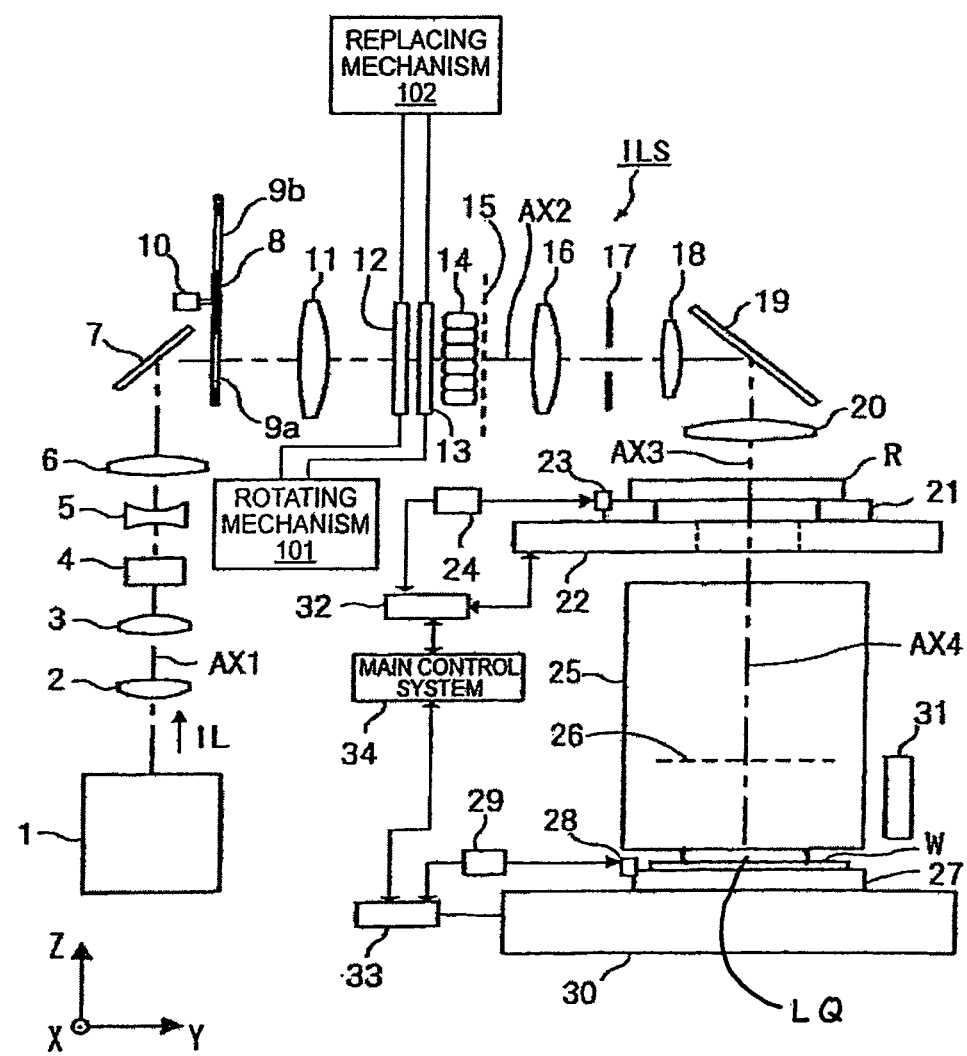
FIG. 1A shows a liquid immersion type exposure apparatus.

The present invention is applicable not only to the projection exposure apparatus of the scanning exposure type, but also to the projection exposure apparatus of the full exposure type such as steppers. The magnification of the projection optical system used may be a demagnification rate, a 1:1 magnification, or an enlargement magnification. Furthermore, the present invention is also applicable, for example, to the liquid immersion type exposure apparatus as disclosed in International Publication (WO) 99/49504 or the like. As shown in FIG. 1A, a liquid LQ is provided between the projection optic system 25 and the wafer W in the liquid immersion type exposure apparatus.

Therefore, when the birefringent members as in the first and second examples (the first birefringent member 12 and second birefringent member 13) are used, the aforementioned polarization controlling member 4 or the like is used to switch the polarization direction of the incident light to the birefringent members, without retracting them to outside the optical path of the illumination optical system, whereby it becomes feasible to realize the illumination light being the illumination beam with the illumination σ of not more than about 0.4 and being light polarized in the X-direction or in the Z-direction (polarization in the X-direction or in the Y-direction, respectively, on the reticle R in FIG. 1), hift reticle.

In this case, it is also a matter of course suitable for illumination onto the spatial frequency modulation type phase s that, in order to limit the illumination σ to about 0.4, it is preferable to use such a diffractive optical element 9a that the direction characteristic of the generated diffracted light is an angular distribution corresponding thereto. This permits the apparatus to form illumination beams in a variety of practical polarization states without provision of the whole replacing mechanism, which is also the advantage of the present invention.

Next, an example of production steps of semiconductor devices using the projection exposure apparatus of the above embodiment will be described with reference to FIG. 11.

Figure 11:
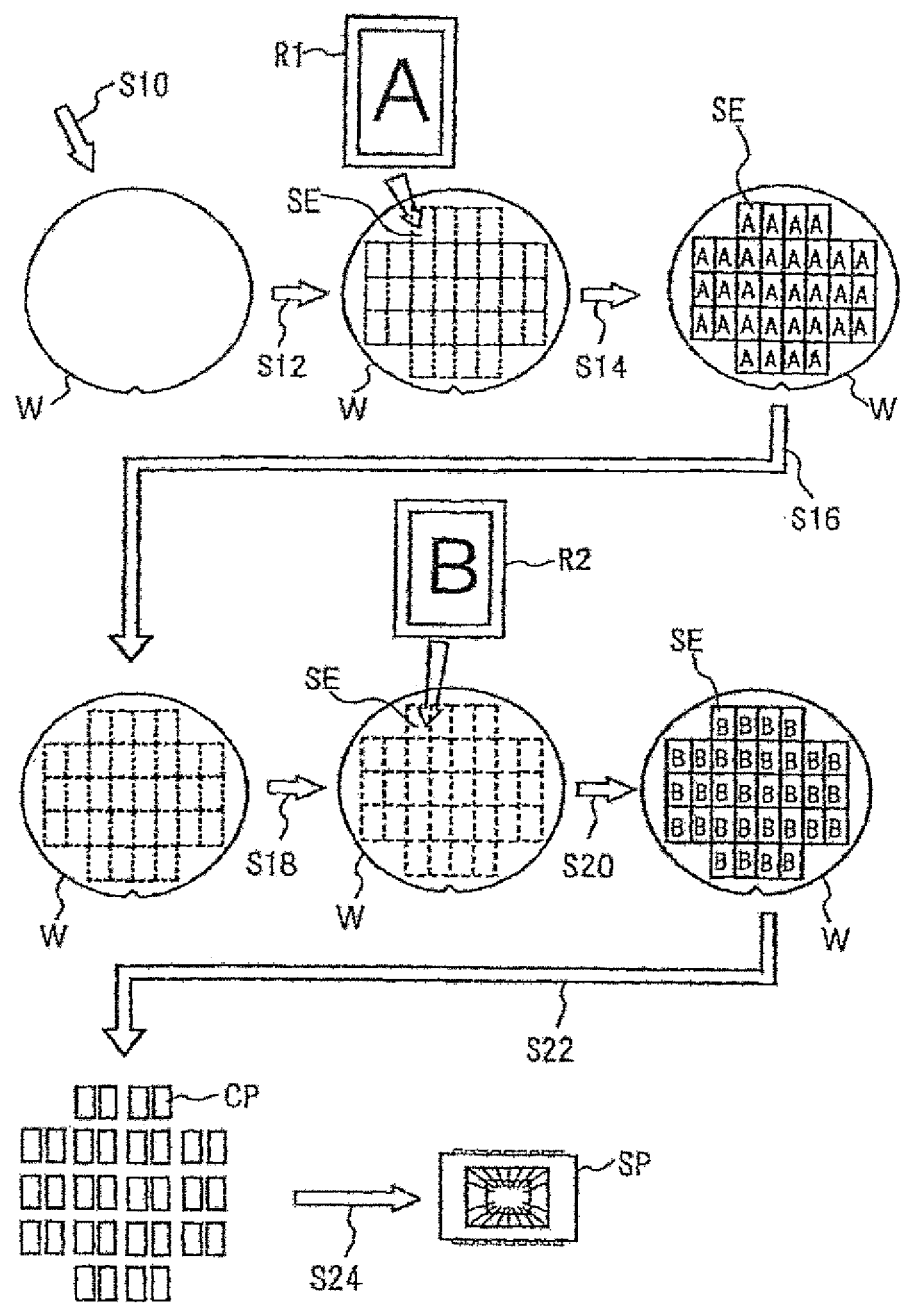
FIG. 11 is a drawing showing an example of a lithography step for fabricating semiconductor devices by use of the projection exposure apparatus according to the embodiment of the present invention.

FIG. 11 shows an example of production steps of semiconductor devices and in this FIG. 11, a wafer W is first made of a silicon semiconductor or the like. Thereafter, a photoresist is applied onto the wafer W (step S10) and in the next step S12, a reticle (assumed to be R1) is loaded on the reticle stage of the projection exposure apparatus of the above embodiment (FIG. 1), the wafer W is loaded on the wafer stage, and a pattern on the reticle R1 (indicated by symbol A) is transferred (to effect exposure) into all shot areas SE on the wafer W by the scanning exposure method. On this occasion double exposure is carried out according to need. The wafer W is, for example, a wafer with the diameter of 300 mm (12-inch wafer), and the size of each shot area SE is, for example, a rectangular region with the width of 25 mm in the non-scanning direction and the width of 33 mm in the scanning direction. In the next step S14, development, etching, ion implantation, and so on are carried out to form a predetermined pattern in each shot area SE on the wafer W.

In the next step S16, a photoresist is applied onto the wafer W and in step S18 thereafter, a reticle (assumed to be R2) is loaded on the reticle stage of the projection exposure apparatus of the above embodiment (FIG. 1), the wafer W is loaded on the wafer stage, and a pattern on the reticle R2 (indicated by symbol B) is transferred (to effect exposure) into each shot area SE on the wafer W by the scanning exposure method. In next step S20, development, etching, ion implantation, and so on of the wafer W are carried out to form a predetermined pattern in each shot area on the wafer W.

The above exposure step to pattern forming step (step S16 to step S20) are repeated the number of times necessary for production of desired semiconductor devices. Then semiconductor devices SP as products are fabricated through a dicing step (step S22) of separating chips CP on the wafer W from each other, a bonding step, and a packaging step and others (step S24).

Since the device fabrication method of the present example involves carrying out the exposure by the projection exposure apparatus of the above embodiment, the exposure step enables the reticle to be illuminated with the illumination light (exposure beam) in the predetermined polarization state with increased efficiency of utilization thereof. Therefore, the resolution and others are improved for periodic patterns with a fine pitch or the like, so that higher-integration and higher-performance semiconductor integrated circuits can be fabricated at low cost and at high throughput.

The projection exposure apparatus of the above embodiment can be produced as follows: the illumination optical system and projection optical system composed of a plurality of lenses are incorporated in the main body of the exposure apparatus, optical adjustment is carried out for the optics, the reticle stage and wafer stage comprised of a number of mechanical parts are attached to the main body of the exposure apparatus, wires and tubes are connected thereto, and overall conditioning processes (electric adjustment, confirmation of operation, etc.) are further carried out. The production of the projection exposure apparatus is preferably carried out in a clean room in which the temperature, cleanliness, etc. are controlled.

The present invention is applicable not only to the projection exposure apparatus of the scanning exposure type, but also to the projection exposure apparatus of the full exposure type such as steppers. The magnification of the projection optical system used may be a demagnification rate, a 1:1 magnification, or an enlargement magnification. Furthermore, the present invention is also applicable, for example, to the liquid immersion type exposure apparatus as disclosed in International Publication (WO) 99/49504 or the like. As shown in FIG. 1A, a liquid LQ is provided between the projection optic system 25 and the wafer W in the liquid immersion type exposure apparatus.

The usage of the projection exposure apparatus of the present invention is not limited to the exposure apparatus for fabrication of semiconductor devices, but it is also commonly applicable, for example, to exposure apparatus for display devices such as liquid crystal display devices formed on rectangular glass plates, or plasma displays, and to exposure apparatus for fabricating various devices such as image pickup devices (CCDs or the like), micromachines, thin film magnetic heads, and DNA chips. Furthermore, the present invention is also applicable to the exposure step (exposure apparatus) in production of masks (photomasks including X-ray masks, reticles, etc.) with mask patterns for various devices by the photolithography step.

It is needless to mention that the illumination optical system (2-20) in the projection exposure apparatus in the aforementioned embodiment is also applicable to the illumination optical apparatus for illuminating the first object such as the reticle R.

It is a matter of course that the present invention is not limited to the above embodiment and can be modified in a variety of configurations without departing from the spirit and scope of the present invention. The entire disclosure of Japanese Patent Application No. 2003-367963 filed Oct. 28, 2003, including the specification, scope of claims, drawings, and abstract is incorporated by reference herein in its entirety.

The device fabrication method of the present invention enables enhancement of utilization efficiency of the exposure beam (illumination light) and permits a predetermined pattern to be formed with high accuracy. Therefore, it permits various devices such as semiconductor integrated circuits to be fabricated with high accuracy and high processing performance (throughput).

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An illumination optical apparatus which illuminates a pattern on a mask with illumination light through a pupil plane of the illumination optical apparatus, the illumination optical apparatus comprising:
    an optical integrator arranged in an optical path of the illumination light on an incidence side of the pupil plane;
    a plurality of birefringent members made of a birefringent material, which are arranged in the optical path on an incidence side of the optical integrator and arranged in order in a direction along an optical axis of the illumination optical apparatus so as to change a polarization state of the illumination light; and
    a distribution changing member arranged in the optical path between the plurality of birefringent members and the optical integrator so as to change a light quantity distribution of the illumination light on the pupil plane, the light quantity distribution including a light quantity in a first region larger than a light quantity in a second region, the first region being away from the optical axis, the second region including the optical axis, wherein
    the plurality of birefringent members change the polarization state of the illumination light entering into the plurality of birefringent members in a substantially single polarization state so that a polarization state of the illumination light in the first region consists primarily of linear polarization of which a polarization direction is substantially coincident with a circumferential direction about the optical axis.

2. The illumination optical apparatus according to claim 1, wherein the illumination light from the optical integrator is irradiated onto the pattern through the pupil plane in a polarization state in which a principal component is S-polarized light.

3. The illumination optical apparatus according to claim 1, wherein the plurality of birefringent members include a first birefringent member and a second birefringent member, the second birefringent member being arranged in the optical path between the first birefringent member and the distribution changing member.

4. The illumination optical apparatus according to claim 3, wherein the illumination light from the first birefringent member enters the second birefringent member via no optical element.

5. The illumination optical apparatus according to claim 3, wherein a direction of a fast axis of the first birefringent member is different from a direction of a fast axis of the second birefringent member.

6. The illumination optical apparatus according to claim 3, wherein at least one of the first and second birefringent members is removable relative to the optical path.

7. The illumination optical apparatus according to claim 3, wherein at least one of the first and second birefringent members is replaceable.

8. The illumination optical apparatus according to claim 3, wherein at least one of the first and second birefringent members is rotatable about the optical axis.

9. The illumination optical apparatus according to claim 1, wherein the first region on the pupil plane is an annular region about the optical axis.

10. The illumination optical apparatus according to claim 1, wherein the first region on the pupil plane comprises a plurality of substantially discrete regions within an annular region about the optical axis.

11. The illumination optical apparatus according to claim 1, wherein the first region on the pupil plane comprises a plurality of substantially discrete regions which are aligned along a circumference about the optical axis.

12. The illumination optical apparatus according to claim 11, wherein the plurality of substantially discrete regions on the pupil plane comprise a pair of regions arranged symmetrically with respect to the optical axis.

13. The illumination optical apparatus according to claim 1, wherein the distribution changing member is configured to change a position of the first region on the pupil plane relative to the optical axis.

14. The illumination optical apparatus according to claim 1, further comprising a polarization changing member arranged in the optical path on an incidence side of the plurality of birefringent members, wherein
    the polarization changing member changes a polarization state of the illumination light from a first polarization state, in which a principal component is a substantially single polarization light, into a second polarization state different from the first polarization state.

15. The illumination optical apparatus according to claim 14, wherein a principal component of the second polarization state is linearly polarized light polarized in the substantially single direction.

16. The illumination optical apparatus according to claim 14, wherein a principal component of the second polarization state is circularly polarized light.

17. The illumination optical apparatus according to claim 14, wherein the principal component of the first polarization state is linearly polarized light, circularly polarized light or elliptically polarized light.

18. The illumination optical apparatus according to claim 14, wherein the polarization changing member comprises at least one of a half wavelength plate and a quarter wavelength plate.

19. The illumination optical apparatus according to claim 1, wherein the optical integrator comprises a fly's eye lens, and a surface of an exit side of the fly's eye lens is arranged at a position substantially equivalent to the pupil plane.

20. The illumination optical apparatus according to claim 1, wherein the optical integrator comprises a fly's eye lens, and a surface of an exit side of the fly's eye lens is substantially coincident with an optical Fourier transform plane with respect to a plane on which the pattern is arranged.

21. An exposure apparatus which exposes a substrate with light from a pattern on a mask, the exposure apparatus comprising:
    a stage which holds the substrate;
    the illumination optical apparatus as defined in claim 2 which illuminates the pattern with the light; and
    a projection optical system which projects an image of the pattern illuminated with the light onto the substrate held by the stage.

22. The exposure apparatus according to claim 21, wherein the image is projected onto the substrate by the projection optical system through liquid.

23. The exposure apparatus according to claim 21, wherein the illumination light from the optical integrator is irradiated onto the pattern through the pupil plane in a polarization state in which a principal component is S-polarized light.

24. The exposure apparatus according to claim 21, wherein the plurality of birefringent members include a first birefringent member and a second birefringent member, the second birefringent member being arranged in the optical path between the first birefringent member and the distribution changing member.

25. The exposure apparatus according to claim 24, wherein the illumination light from the first birefringent member enters the second birefringent member via no optical element.

26. The exposure apparatus according to claim 24, wherein a direction of a fast axis of the first birefringent member is different from a direction of a fast axis of the second birefringent member.

27. The exposure apparatus according to claim 24, wherein at least one of the first and second birefringent members is removable relative to the optical path.

28. The exposure apparatus according to claim 24, wherein at least one of the first and second birefringent members is replaceable.

29. The exposure apparatus according to claim 24, wherein at least one of the first and second birefringent members is rotatable about the optical axis.

30. The exposure apparatus according to claim 21, wherein the first region on the pupil plane is an annular region about the optical axis.

31. The exposure apparatus according to claim 21, wherein the first region on the pupil plane comprises a plurality of substantially discrete regions within an annular region about the optical axis.

32. The exposure apparatus according to claim 21, wherein the first region on the pupil plane comprises a plurality of substantially discrete regions which are aligned along a circumference about the optical axis.

33. The exposure apparatus according to claim 32, wherein the plurality of substantially discrete regions on the pupil plane comprise a pair of regions arranged symmetrically with respect to the optical axis.

34. The exposure apparatus according to claim 21, wherein the distribution changing member is configured to change a position of the first region on the pupil plane relative to the optical axis.

35. The exposure apparatus according to claim 21, further comprising a polarization changing member arranged in the optical path on an incidence side of the plurality of birefringent members, wherein
the polarization changing member changes a polarization state of the illumination light from a first polarization state, in which a principal component is a substantially single polarization light, into a second polarization state different from the first polarization state.

36. The exposure apparatus according to claim 35, wherein a principal component of the second polarization state is linearly polarized light polarized in the substantially single direction.

37. The exposure apparatus according to claim 35, wherein a principal component of the second polarization state is circularly polarized light.

38. The exposure apparatus according to claim 35, wherein the principal component of the first polarization state is linearly polarized light, circularly polarized light or elliptically polarized light.

39. The exposure apparatus according to claim 35, wherein the polarization changing member comprises at least one of a half wavelength plate and a quarter wavelength plate.

40. A device manufacturing method comprising:
transferring a pattern to a substrate by using the exposure apparatus as defined in claim 21; and
developing the substrate to which the pattern has been transferred.

41. The device manufacturing method according to claim 40, wherein the pattern is transferred to the substrate through liquid.

42. An exposure method for exposing a substrate with light from a pattern on a mask, the exposure method comprising:
holding the substrate by a stage;
illuminating the pattern with the light by using the illumination optical apparatus as defined in claim 1; and
projecting an image of the pattern illuminated with the light onto the substrate held by the stage.

43. The exposure method according to claim 42, wherein the image is projected onto the substrate through liquid.

44. A device manufacturing method comprising:
transferring a pattern to a substrate by using the exposure method as defined in claim 42; and
developing the substrate to which the pattern has been transferred.

45. The device manufacturing method according to claim 44, wherein the pattern is transferred to the substrate through liquid.

* * * * *